United States Patent
Park et al.

(10) Patent No.: US 9,685,318 B2
(45) Date of Patent: Jun. 20, 2017

(54) METHOD OF FORMING SEMICONDUCTOR DEVICE

(71) Applicant: Samsung Electronics Co., Ltd., Suwon-Si, Gyeonggi-do (KR)

(72) Inventors: Young-Lim Park, Anyang-si (KR); Wonseok Yoo, Hwaseong-si (KR); Hyokyoung Kim, Hwaseong-si (KR); Changyup Park, Hwaseong-si (KR); Kongsoo Lee, Hwaseong-si (KR); Wook-Yeol Yi, Hwaseong-si (KR); Hanjin Lim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/920,922

(22) Filed: Oct. 23, 2015

(65) Prior Publication Data

US 2016/0118247 A1    Apr. 28, 2016

(30) Foreign Application Priority Data

Oct. 24, 2014   (KR) .................. 10-2014-0145459

(51) Int. Cl.
*H01L 21/02*  (2006.01)
*H01L 21/311*  (2006.01)
*H01L 27/108*  (2006.01)

(52) U.S. Cl.
CPC .... *H01L 21/0217* (2013.01); *H01L 21/02247* (2013.01); *H01L 27/10885* (2013.01)

(58) Field of Classification Search
CPC ........... H01L 21/02329; H01L 21/0217; H01L 21/31111; H01L 21/02247; H01L 27/10885; H01L 21/02126; H01L 21/02274; H01L 21/02167
USPC ......................................... 438/762
See application file for complete search history.

(56) References Cited

U.S. PATENT DOCUMENTS

| | | | |
|---|---|---|---|
| 7,524,774 B2 | 4/2009 | Sasaki et al. | |
| 7,651,961 B2 | 1/2010 | Clark | |
| 8,524,589 B2 | 9/2013 | Rogers | |
| 2005/0184397 A1* | 8/2005 | Gates | H01L 21/76801 257/774 |
| 2005/0196973 A1 | 9/2005 | Suzuki et al. | |
| 2006/0269693 A1* | 11/2006 | Balseanu | C23C 16/345 427/569 |

(Continued)

FOREIGN PATENT DOCUMENTS

| | | |
|---|---|---|
| JP | 2000-332005 A | 11/2000 |
| JP | 2005-252031 A | 9/2005 |
| JP | 2007-005696 A | 1/2007 |

*Primary Examiner* — Caridad Everhart
(74) *Attorney, Agent, or Firm* — Ward and Smith, P.A.

(57) ABSTRACT

Provided is a method of forming a semiconductor device. The method can include loading a semiconductor substrate into semiconductor equipment. A base layer can be formed on the loaded semiconductor substrate by performing a base deposition process using a base source material. A first silicon layer can be formed on the base layer to a greater thickness than the base layer by performing a first silicon deposition process using a silicon source material different from the base source material. A first nitrided silicon layer can be formed by nitriding the first silicon layer using a first nitridation process. The semiconductor substrate having the first nitrided silicon layer can be unloaded from the semiconductor equipment.

17 Claims, 76 Drawing Sheets

(56) References Cited

U.S. PATENT DOCUMENTS

2011/0263105 A1* 10/2011 Hasebe ............... C23C 16/0272
                                                        438/482
2012/0164842 A1*  6/2012 Watanabe ......... H01L 21/76227
                                                        438/763
2014/0308794 A1* 10/2014 Lee ................... H01L 21/76855
                                                        438/381
2015/0145004 A1*  5/2015 Inoue ................. H01L 29/4236
                                                        257/192
2016/0163594 A1*  6/2016 Kim .................. H01L 27/10888
                                                        438/586

* cited by examiner

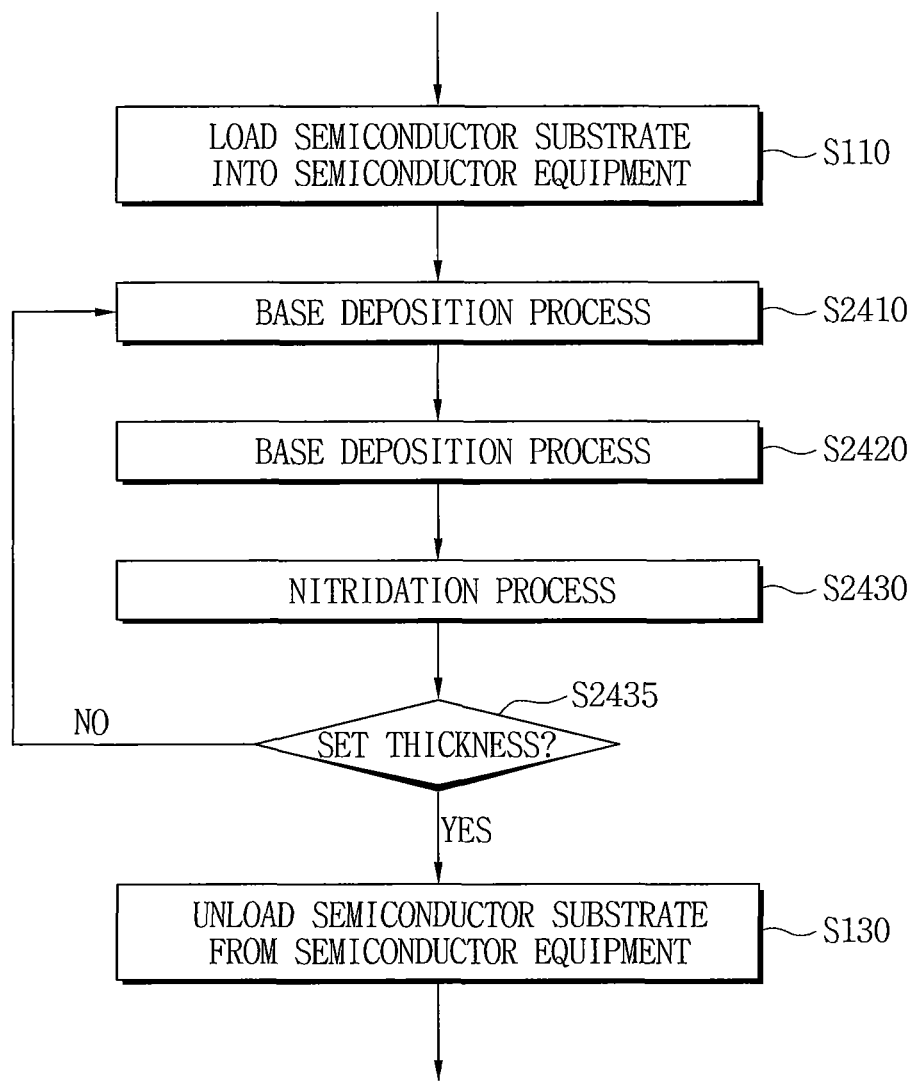

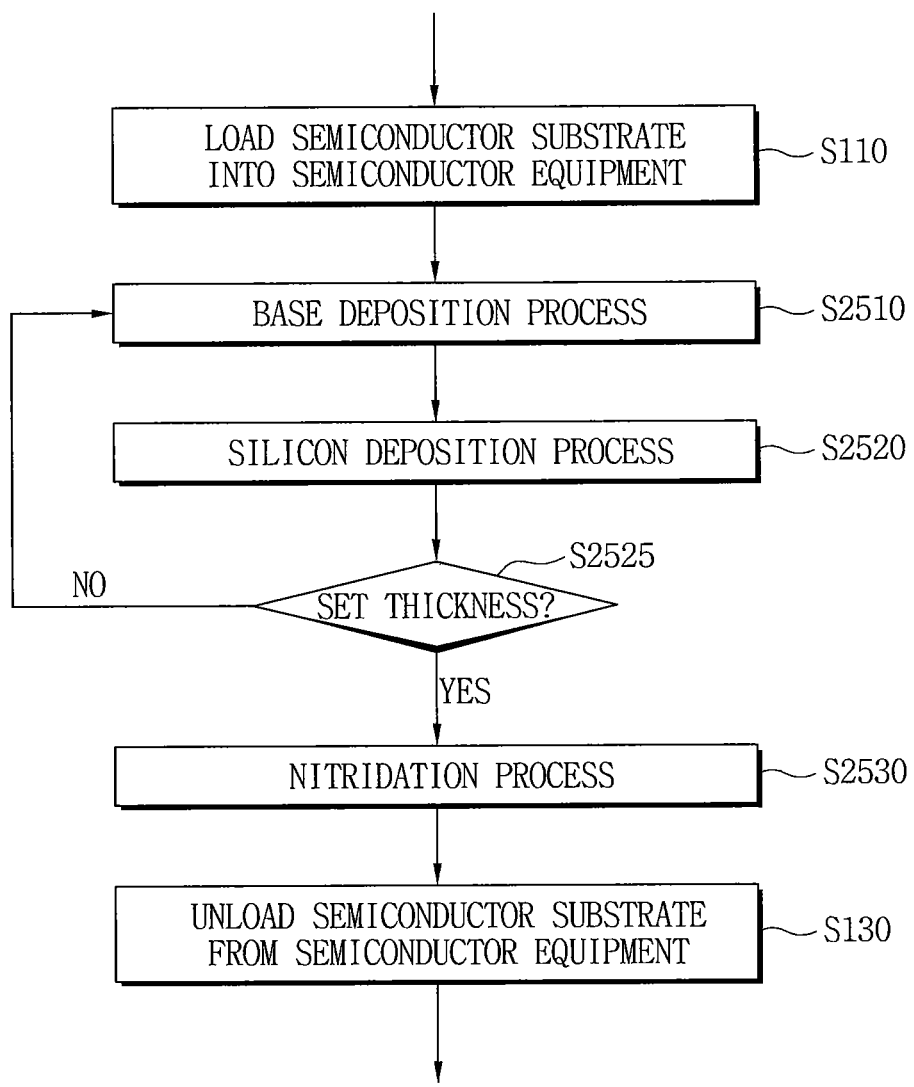

METHOD OF FORMING SEMICONDUCTOR DEVICE

CROSS-REFERENCE TO RELATED APPLICATION

This application claims priority under 35 U.S.C. §119 to Korean Patent Application No. 10-2014-0145459 filed on Oct. 24, 2014, the disclosure of which is hereby incorporated by reference in its entirety.

FIELD

Embodiments of the inventive concept provide a semiconductor device, a method of forming a semiconductor device, and an electronic system adopting the same.

BACKGROUND

As semiconductor devices have become more highly integrated, an interval between conductive patterns has become smaller, and crosstalk between the conductive patterns may occur. Also, a parasitic capacitance between adjacent conductive patterns intended to be electrically isolated from one another by an insulating layer, may increase. For example, when the conductive patterns are bit lines of a memory device, the parasitic capacitance between the bit lines may interrupt the flow of an electric signal transmitted to a circuit, and reduce the bit line sensing margin. Accordingly, a technique of forming spacer structures (having a lower dielectric constant than the conductive patterns) between the conductive patterns has been used to reduce the parasitic capacitance between the conductive patterns.

SUMMARY

In accordance with an embodiment of the inventive concept, a method of forming a semiconductor device is provided. The method can include loading a semiconductor substrate into semiconductor equipment. A base layer can be formed on the loaded semiconductor substrate by performing a base deposition process using a base source material. A first silicon layer can be formed on the base layer to a greater thickness than the base layer by performing a first silicon deposition process using a silicon source material different from the base source material. A first nitrided silicon layer can be formed by nitriding the first silicon layer using a first nitridation process. The semiconductor substrate having the first nitrided silicon layer can be unloaded from the semiconductor equipment.

BRIEF DESCRIPTION OF THE DRAWINGS

FIG. 22 is a flowchart of a method of forming a semiconductor device according to an embodiment of the inventive concept;

FIG. 24 is a flowchart of a method of forming a semiconductor device according to an embodiment of the inventive concept;

DETAILED DESCRIPTION OF THE EMBODIMENTS

Figure 1A:
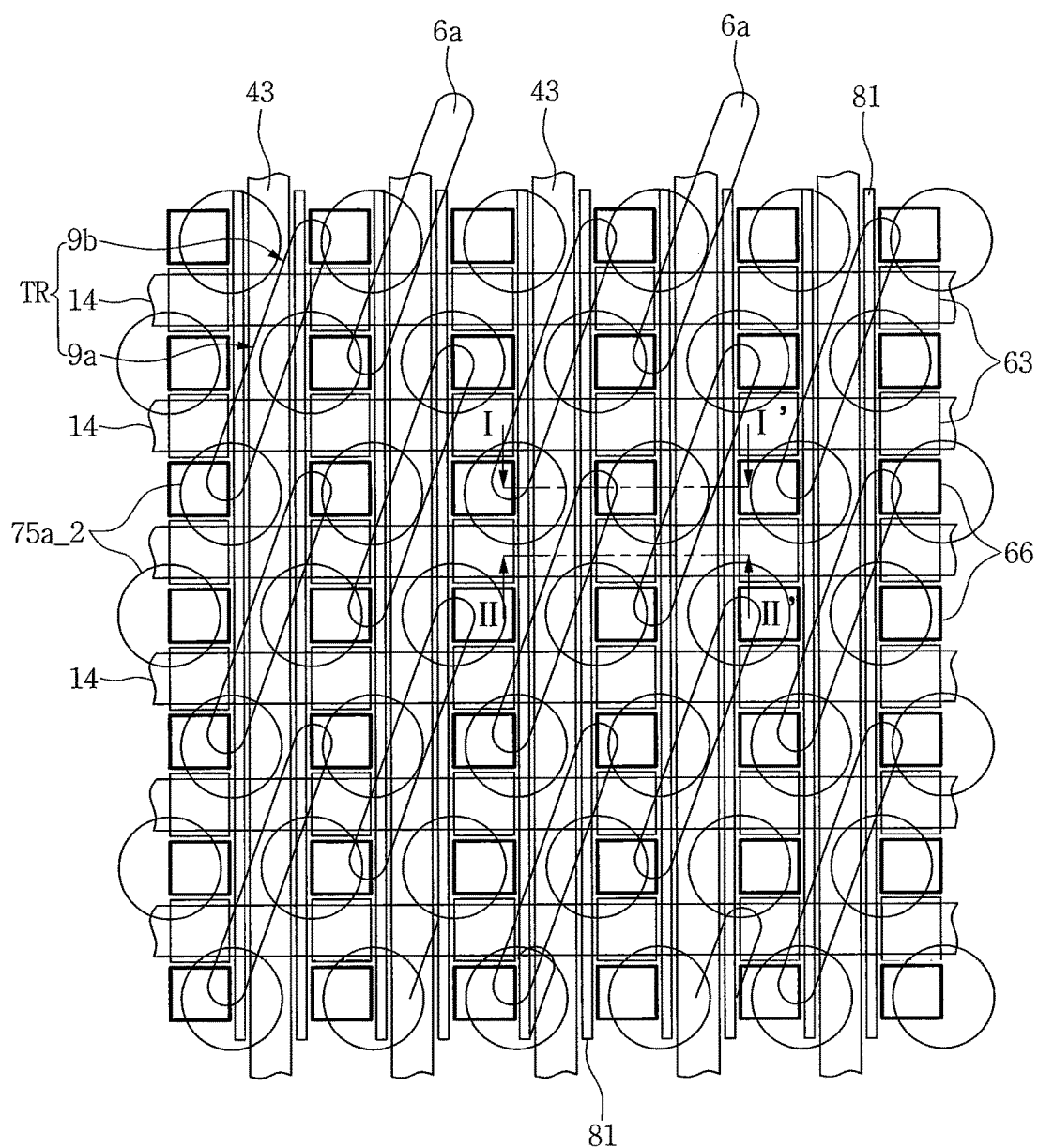
FIG. 1A is a plan view of a semiconductor device according to an embodiment of the inventive concept.

The inventive concept will now be described more fully hereinafter with reference to the accompanying drawings, in which embodiments of the inventive concept are shown. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art. In the drawings, the sizes and relative sizes of layers and regions may be exaggerated for clarity. Like reference numerals refer to like elements throughout.

Embodiments of the inventive concept are described herein with reference to plan, cross-section, and block illustrations that are schematic illustrations of idealized embodiments of the inventive concept. As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the inventive concept.

In the drawings, the thicknesses of layers and regions may be exaggerated for clarity. It will also be understood that when a layer is referred to as being "on" another layer or substrate, it can be directly on the other layer or substrate or intervening layers may also be present.

As used herein, the term "air spacer" may refer to a vacant spacer that is void of solid material.

Spatially relative terms, such as "upper end," "lower end," "upper surface," "lower surface," "upper part," "lower part," and the like, may be used herein for ease of description to distinguish relative locations of elements. For example, when an upper part is used as a top in the drawing and a lower part is used as a bottom in the drawing for convenience, the upper part could be termed the lower part and the lower part could be termed the upper part without departing from the scope of the present invention.

Further, although terms, such as "upper", "middle", "lower", and the like, may be used herein for ease of description to describe one element or feature's relationship to another element(s) or feature(s) as illustrated in the figures. Accordingly, other terms, such as "first", "second", "third", and the like, may be used to describe embodiments of the inventive concept instead of the terms, such as "upper", "middle", "lower", and the like.

It will be understood that, although the terms "first", "second", etc. may be used herein to describe various components, these components should not be limited by these terms. These terms are only used to distinguish one component from another component. Thus, a first component discussed below could be termed a second component and the second component discussed below could be termed the first component without departing from the teachings of the present inventive concept.

The terminology used herein is for the purpose of describing particular embodiments only and is not intended to be limiting of the inventive concept.

As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Figure 1B:
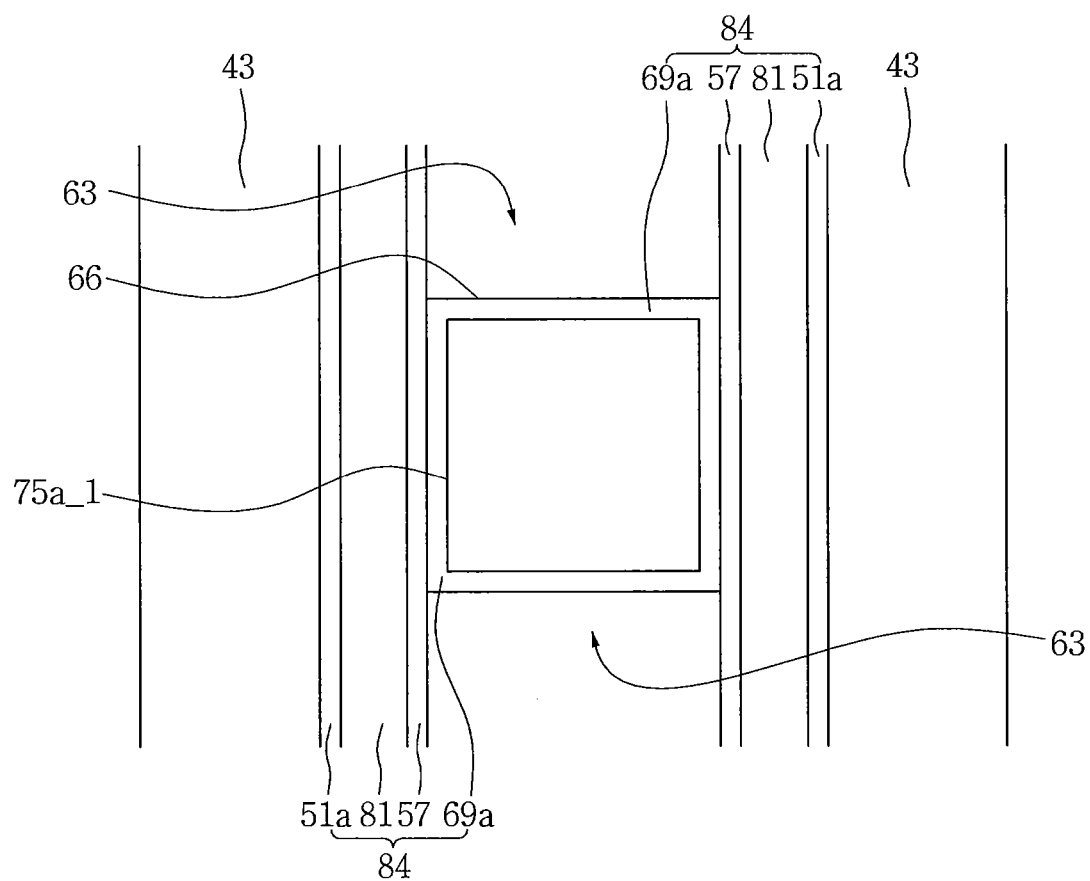
FIG. 1B is a partially enlarged plan view of some components of FIG. 1A.
Figure 2A:
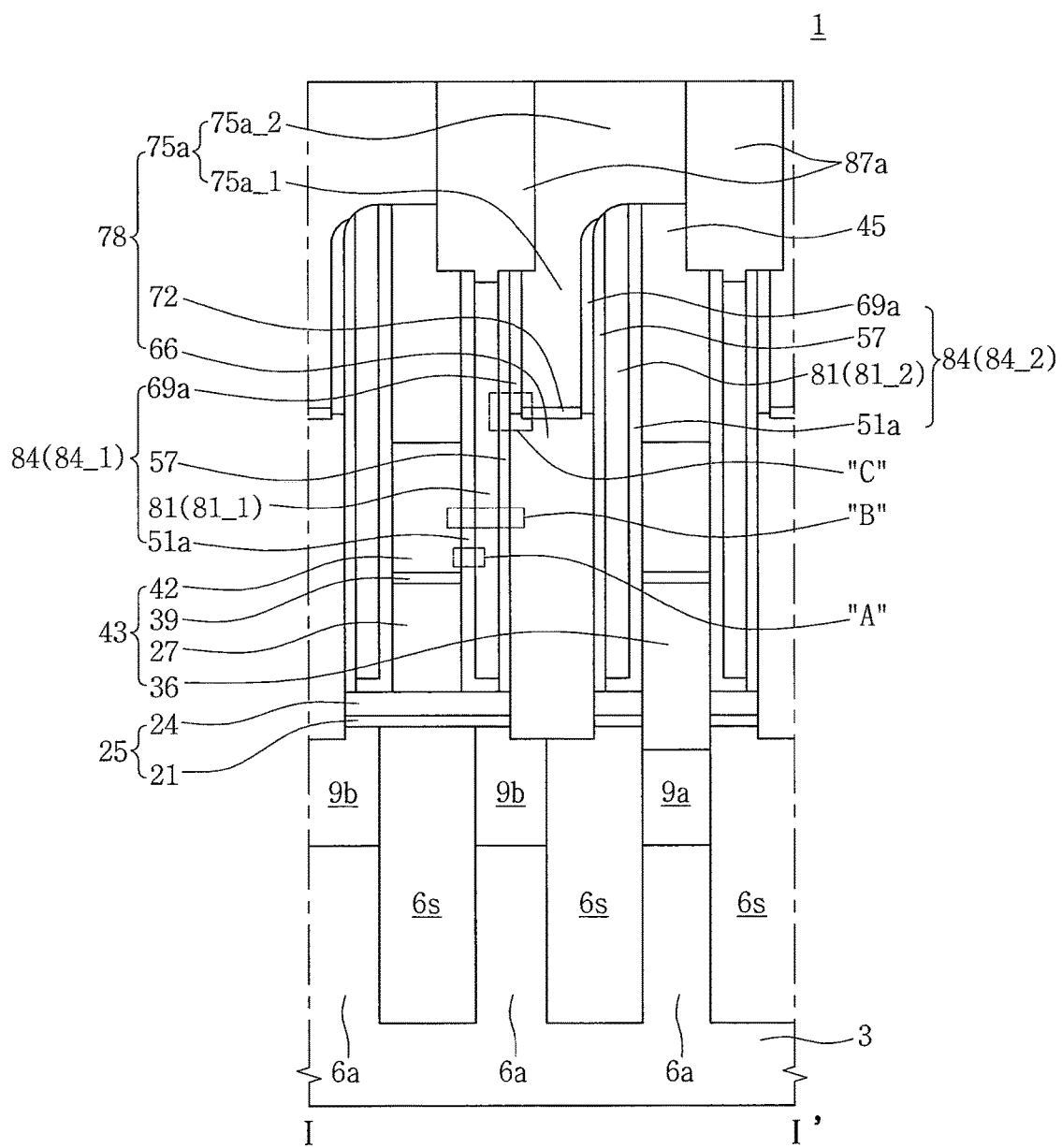
FIG. 2A is a cross-sectional view of a region taken along line I-I' of FIG. 1.
Figure 2B:
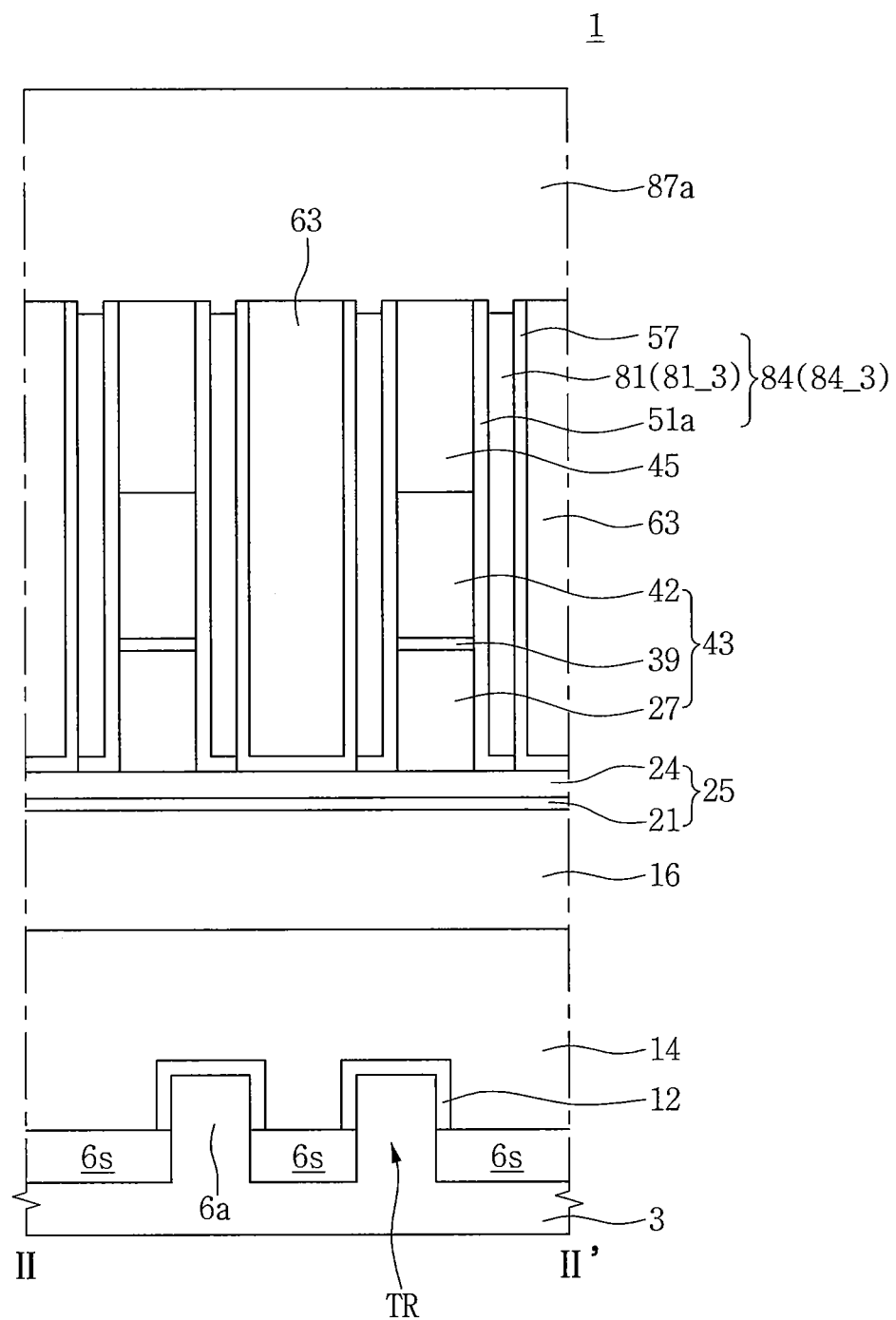
FIG. 2B is a cross-sectional view of a region taken along line II-II' of FIG. 1.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless explicitly so defined herein FIG. 1A is a plan view of a semiconductor device according to an embodiment of the inventive concept, and FIG. 1B is a partially enlarged plan view of some components of FIG. 1A. FIG. 2A is a cross-sectional view of a region taken along line I-I' of FIG. 1, and FIG. 2B is a cross-sectional view of a region taken along line II-II' of FIG. 1.

To begin with, a semiconductor device 1 according to an embodiment of the inventive concept will be described with reference to FIGS. 1A, 1B, 2A, and 2B.

Referring to FIGS. 1A, 1B, 2A, and 2B, a substrate 3 may be provided. The substrate 3 may be a semiconductor substrate formed of a semiconductor material such as silicon.

Isolation regions 6s may be disposed in the substrate 3 to define active regions 6a. The isolation regions 6s may be shallow trench isolation (STI) layers formed in the substrate 3.

A plurality of transistors TR may be disposed on the substrate 3. Each of the transistors TR may include a gate dielectric material 12, a gate electrode 14, first source/drain regions 9a, and second source/drain regions 9b.

The gate electrode 14 may be buried in a gate trench that crosses the active region 6a and extends into the isolation region 6s. The gate electrode 14 may be a word line of a memory device. The gate dielectric material 12 may be interposed between the gate electrode 14 and the active region 6a. The first and second source/drain regions 9a and 9b may be disposed in the active regions 6a on both sides of the gate electrode 14.

A gate capping pattern 16 may be disposed on the gate electrode 14. A bottom surface of the gate capping pattern 16 may be disposed at a lower level than a top surface of the active region 6a. The gate capping pattern 16 may be formed of an insulating material. For example, the gate capping pattern 16 may be formed of silicon nitride that is formed by performing a deposition process using a silicon precursor and a nitrogen precursor.

An interlayer insulating layer 25 may be disposed on the substrate having the transistor TR, the active region 6a, and the isolation region 6s. The interlayer insulating layer 25 may cover the transistors TR and the isolation region 6s. The interlayer insulating layer 25 may include a lower interlayer insulating layer 21 and an upper interlayer insulating layer 24 disposed on the lower interlayer insulating layer 21.

The lower interlayer insulating layer 21 may be formed using a silicon oxide layer. The upper interlayer insulating layer 24 may be formed using a silicon nitride layer. The upper interlayer insulating layer 24 may be formed using a nitride (N)-rich silicon nitride layer. For example, the upper interlayer insulating layer 24 may be formed of silicon nitride that is formed by a reaction of silicon of a silicon precursor with nitrogen of a nitrogen precursor.

First conductive structures 43 may be disposed on the interlayer insulating layer 25. The first conductive structures 43 may be bit lines or interconnection structures. In a plan view, the first conductive structures 43 may have line shapes parallel to one another.

Each of the first conductive structures 43 may include an interconnection contact pattern 36 electrically connected to each first contact region of the substrate 3. The first contact regions of the substrate 3 may be the first source/drain regions 9a of the transistors TR.

Each of the first conductive structures 43 may include the interconnection contact pattern 36, a lower interconnection pattern 27, a middle interconnection pattern 39, and an upper interconnection pattern 42. The middle interconnection pattern 39 and the upper interconnection pattern 42 may be sequentially stacked. The middle interconnection pattern 39 and the upper interconnection pattern 42 may have line shapes. The upper interconnection pattern 42 may be formed of a metal material such as tungsten (W). The middle interconnection pattern 39 may be formed of a metal silicide such as tungsten silicide (WSi), and/or a metal nitride such as titanium nitride (TiN).

The interconnection contact pattern 36 may be interposed between the middle interconnection pattern 39 and the first source/drain regions 9a and pass through the interlayer insulating layer 25. The interconnection contact pattern 36 may be in contact with the first contact region, that is, the first source/drain region 9a. The interconnection contact pattern 36 may be electrically connected to the first source/drain regions 9a. The interconnection contact pattern 36 may be formed of conductive doped silicon. For example, the interconnection contact pattern 36 may be formed of doped polysilicon (poly-Si).

The lower interconnection pattern 27 may be interposed between the middle interconnection pattern 39 and the interlayer insulating layer 25. The lower interconnection pattern 27 may be formed of conductive doped poly-Si.

Insulating mask patterns 45 may be disposed on the first conductive structures 43. Side surfaces of the insulating mask patterns 45 may be vertically aligned with side surfaces of the first conductive structures 43. The insulating mask patterns 45 may be formed using an N-rich silicon nitride layer. For example, the insulating mask patterns 45 may be formed of silicon nitride that is formed by a reaction of silicon of a silicon precursor with nitrogen of a nitrogen precursor.

Insulating isolation patterns 63 may be disposed between the first conductive structures 43. The insulating isolation patterns 63 may be spaced apart from one another. The insulating isolation patterns 63 may be disposed on the interlayer insulating layer 25. Top surfaces of the insulating isolation patterns 63 may be disposed at a higher level than the first conductive structures 43. The insulating isolation patterns 63 may be interposed between the first conductive structures 43 and between the insulating mask patterns 45. The insulating isolation patterns 63 may be formed using an N-rich silicon nitride layer. For example, the insulating mask patterns 45 may be formed of silicon nitride that is formed by a reaction of silicon of a silicon precursor with nitrogen of a nitrogen precursor.

Second conductive structures 78 may be disposed between the first conductive structures 43 and between the insulating isolation patterns 63. The first conductive structures 43 may be interconnection structures electrically connected to the first contact regions (i.e., the first source/drain regions 9*a*), and the second conductive structures 78 may be contact structures electrically connected to second contact regions (i.e., the second source/drain regions 9*b*). Each of the second conductive structures 78 may be disposed between adjacent first conductive structures 43 and between adjacent insulating isolation patterns 63. The second conductive structures 78 may pass through the interlayer insulating layer 25 and be electrically connected to the second source/drain regions 9*b*.

Each of the second conductive structures 78 may include a lower contact pattern 66, a middle contact pattern 72 disposed on the lower contact pattern 66, and an upper contact pattern 75*a* disposed on the middle contact pattern 72.

The lower contact pattern 66 may pass through the interlayer insulating layer 25 and be electrically connected to the second contact region (i.e., the second source/drain region 9*b*) of the substrate 3. The lower contact pattern 66 may be formed of conductive doped poly-Si 66. The middle contact pattern 72 may be formed of a metal silicide such as cobalt silicide, titanium silicide, or tantalum silicide. The upper contact pattern 75*a* may be formed of a metal nitride such as titanium nitride or tantalum nitride, and/or a metal material such as tungsten.

The middle contact pattern 72 may be formed to have a smaller width than the lower contact pattern 66. The upper contact pattern 75*a* may include a lower portion 75*a*_1 disposed between the insulating mask patterns 45 and an upper portion 75*a*_2 disposed at a higher level than the insulating mask patterns 45. The lower portion 75*a*_1 of the upper contact pattern 75*a* may be in contact with the middle contact pattern 72. The upper portion 75*a*_2 of the upper contact pattern 75*a* may be disposed on the lower portion 75*a*_1 and have a greater width than the lower portion 75*a*_1. The upper portion 75*a*_2 of the upper contact pattern 75*a* may overlap one of adjacent first conductive structures 43 and not overlap the other of the adjacent first conductive structures 43. The upper portion 75*a*_2 of the upper contact pattern 75*a* may overlap and contact one of the adjacent insulating mask patterns 45 and not overlap the other of the adjacent insulating capping patterns.

Spacer structures 84 may be disposed on the side surfaces of the first conductive structures 43 and the insulating mask patterns 45. The spacer structures 84 may cover the side surfaces of the first conductive structures 43 and the side surfaces of the insulating mask patterns 45.

The spacer structures 84 may be disposed between the first conductive structures 43 and the second conductive structures 78 and extend between the insulating mask patterns 45 and the second conductive structures 78.

An insulating capping pattern 87*a* may be disposed on the spacer structures 84. The insulating capping pattern 87*a* may have a greater width than each of the spacer structures 84.

Each of the spacer structures 84 may have a first portion 84_1, a second portion 84_2, and a third portion 843. The first portion 84_1 of each of the spacer structures 84 may be a portion that may be interposed between the first conductive structure 43 and the second conductive structure 78 and covered with the insulating capping pattern 87*a*. The second portion 84_2 of each of the spacer structures 84 may be a portion that may be interposed between the first conductive structure 43 and the second conductive structure 78 and covered with the upper portion 75*a*_2 of the upper contact pattern 75*a* of the second conductive structure 78. The third portion 84_3 of each of the spacer structures 84 may be a portion that may be interposed between the first conductive structure 43 and the insulating isolation pattern 63.

Each of the spacer structures 84 may include first spacers 51*a*, second spacers 57, third spacers 81, and upper spacers 69*a*. The third spacers 81 may be disposed between the first and second spacers 51*a* and 57. The third spacers 81 may have a lower dielectric constant than the first and second spacers 51*a* and 57. For example, the first and second spacers 51*a* and 57 may be formed of an insulating material containing a silicon-based nitride, and the third spacers 81 may be air spacers having a lower dielectric constant than the silicon-based nitride.

Hereinafter, for brevity, the first spacers 51*a* will be termed "inner spacers", the second spacers 57 will be termed "outer spacers", and the third spacers 81 will be termed "air spacers". Here, terms, such as "inner" and "outer" are used to distinguish one element of the spacer structure 84 from another element thereof, and the inventive concept is not limited by these terms.

The inner spacers 51*a* may be interposed between the air spacers 81 and the first conductive structure 43, between the air spacers 81 and the insulating mask pattern 45, and between the air spacers 81 and the interlayer insulating layer 25.

The outer spacers 51*a* may be interposed between the air spacers 81 and the second conductive structure 78, between the air spacer 81 and the insulating isolation pattern 63, and between the insulating isolation pattern 63 and the interlayer insulating layer 25.

The upper spacers 69*a* may be disposed on edges of the lower contact pattern 66 of the second conductive structure 78. The upper spacers 69*a* may be interposed between the lower portion 75*a*_1 and the outer spacers 57 and interposed between the lower portion 75*a*_1 and the insulating isolation pattern 63. Also, the upper spacers 69a may be disposed between the lower portion 75a_1 and the outer spacers 57 and extend between the middle contact pattern 72 and the outer spacers 57.

A first portion 81_1 of the air spacer 81 disposed in the first portion 84_1 of the spacer structure 84 and a third portion 81_3 of the air spacer 81 disposed in the third portion 84_3 of the spacer structure 84 may be covered with the upper capping pattern 87a and hermetically sealed. A second portion 81_2 of the air spacer 81 disposed in the second portion 84_2 of the spacer structure 84 may be covered with the upper portion 75a_2 of the upper contact pattern 75a of the second conductive structure 78 and hermetically sealed.

The insulating capping pattern 87a may hermetically seal upper portions of the first portion 81_1 and the third portion 81_3 of the air spacers 81, and fill spaces between the upper portion 75a_2 of the upper contact patterns 75a. The insulating capping pattern 87a may have a greater width than the spacer structure 84.

At least one of the inner spacers 51a, the outer spacers 57, and the upper spacers 69a may be formed with a thickness in a range of about 1 Å to about 33 Å. For example, the inner spacers 51a may be formed with a thickness in a range of about 1 Å to about 33 Å, the outer spacers 57 may be formed with a thickness in a range of about 1 Å to about 33 Å, and the upper spacers 69a may be formed with a thickness in a range of about 1 Å to about 33 Å.

In an embodiment, the inner spacers 51a, the outer spacers 57, and/or the upper spacers 69a may include a nitrided base layer and a nitrided silicon layer.

In an embodiment, the inner spacers 51a, the outer spacers 57, and/or the upper spacers 69a may include the nitrided base layer, the nitrided silicon layer, and a nitrided barrier layer.

In an embodiment, the inner spacers 51a, the outer spacers 57, and/or the upper spacers 69a may include the nitrided base layer, the nitrided silicon layer, and an N-rich silicon nitride layer.

In an embodiment, the inner spacers 51a and/or the outer spacers 57 may include the nitrided base layer, the nitrided silicon layer, the nitrided barrier layer, and the N-rich silicon nitride layer.

The nitrided silicon layer may be thicker than the nitrided base layer. The nitrided base layer may be formed of a material having a higher density than the nitrided silicon layer.

The nitrided silicon layer may be formed of Si-rich silicon nitride that is richer in Si than silicon nitride formed using a chemical vapor deposition (CVD) or atomic layer deposition (ALD) process. For example, the nitrided silicon layer may have a higher silicon concentration than silicon nitride formed using a CVD or ALD process.

The nitrided base layer may be formed of a material having a higher C content than the nitrided silicon layer. The nitrided base layer may be formed of a SiHCN material.

The nitrided barrier layer may be formed of the same material as the nitrided base layer. The nitrided barrier layer may have a higher density than the nitrided silicon layer and be formed to a smaller thickness than the nitrided silicon layer.

The N-rich silicon nitride layer may be formed using a deposition process (e.g., a CVD process or an ALD process) that causes a reaction between silicon of a silicon precursor and nitrogen of a nitrogen precursor.

The inner and outer spacers 51a and 57 may increase an etching resistance to an HF-containing oxide wet etchant.

For example, the formation of the air spacers 81 may include forming sacrificial spacers using silicon oxide and removing the sacrificial spacers by performing an etching process using an oxide wet etchant. Here, when the spacer structures 84 have the same width with the same design rules, the inner and outer spacers 51a and 57 are not damaged due to the oxide wet etchant. Thus, the inner and outer spacers 51a and 57 may be formed to relatively small thicknesses, and the sacrificial spacers may be formed to relatively greater thicknesses by as much as the thicknesses of the inner and outer spacers 57 are reduced. Accordingly, the widths and volumes of the air spaces 81 formed during the removal of the sacrificial spacers may increase. As a result, since the widths and volumes of the air spacers 81 having a low dielectric constant may be increased in the spacer structures 84, a parasitic capacitance between the first and second conductive structures 43 and 78 and a parasitic capacitance between the first conductive structures 43 may be further reduced. Accordingly, when the first conductive structures 43 are bit lines of DRAMs, a bit line loading capacitance may be further reduced, and a relatively large bit line sensing margin may be ensured. Therefore, performance of the semiconductor device 1 may be enhanced.

Each of FIGS. 3A through 3G is an enlarged view of portion "A" of FIG. 2A, illustrating the inner spacer 51a, and each of FIGS. 4A through 4G is an enlarged view of portion "B" of FIG. 2A, illustrating the outer spacer 57. Also, each of FIGS. 5A through 5C is an enlarged view of portion "C" of FIG. 2A, illustrating the upper spacer 69a.

To begin with, the inner spacer 51a will be described with reference to FIGS. 3A through 3G.

Figure 3A:
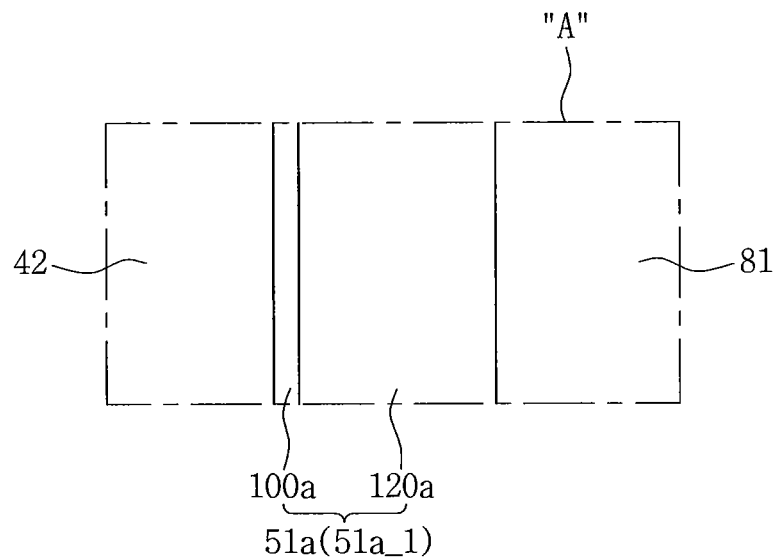
FIG. 3A is a cross-sectional view of a semiconductor device according to an embodiment of the inventive concept.

Referring to FIG. 3A, the inner spacer 51a according to an embodiment may be a spacer 51a_1 that includes a nitrided base layer 100a and a nitrided silicon layer 120a disposed on the nitrided base layer 100a. The nitrided silicon layer 120a may be disposed between the nitrided base layer 100a and the air spacer 81.

The nitrided silicon layer 120a may be thicker than the nitrided base layer 100a. The nitrided base layer 100a may be formed of a material having a higher density than the nitrided silicon layer 120a. The nitrided base layer 100a may be formed of a material having a higher C content than the nitrided silicon layer 120a. The nitrided base layer 100a may be formed of a SiHCN material. The nitrided silicon layer 120a may include silicon nitride, which is formed by forming a silicon layer using a deposition process and nitriding the silicon layer using a nitridation process. The nitrided silicon layer 120a may be formed of Si-rich silicon nitride, which is richer in Si than silicon nitride formed using a CVD or ALD process. For example, the nitrided silicon layer 120a may have a higher Si concentration than silicon nitride formed using a CVD or ALD process.

Figure 3B:
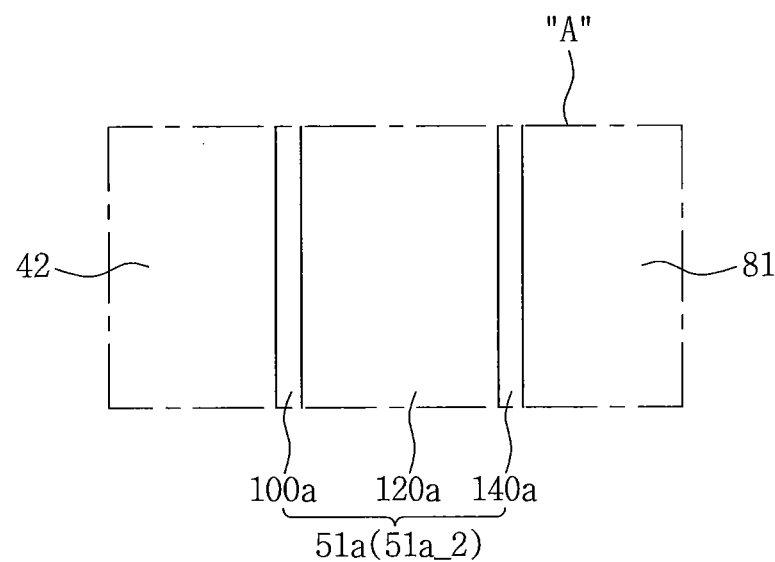
FIG. 3B is a cross-sectional view of a semiconductor device according to an embodiment of the inventive concept.

Referring to FIG. 3B, the inner spacer 51a according to an embodiment may be a spacer 51a_2 that includes a nitrided base layer 100a, a nitrided silicon layer 120a, and a nitrided barrier layer 140a. The nitrided silicon layer 120a may be disposed between the nitrided base layer 100a and the nitrided barrier layer 140a. The nitrided barrier layer 140a may be disposed between the nitrided silicon layer 120a and the air spacer 81. The nitrided barrier layer 140a may increase an etching resistance to an oxide wet etchant.

The nitrided base layer 100a and/or the nitrided barrier layer 140a may be thinner than the nitrided silicon layer 120a. The nitrided base layer 100a and the nitrided barrier layer 140a may be formed of a material having a higher density than the nitrided silicon layer 120a. The nitrided base layer 100a and the nitrided barrier layer 140a may be formed of the same material.

Figure 3C:
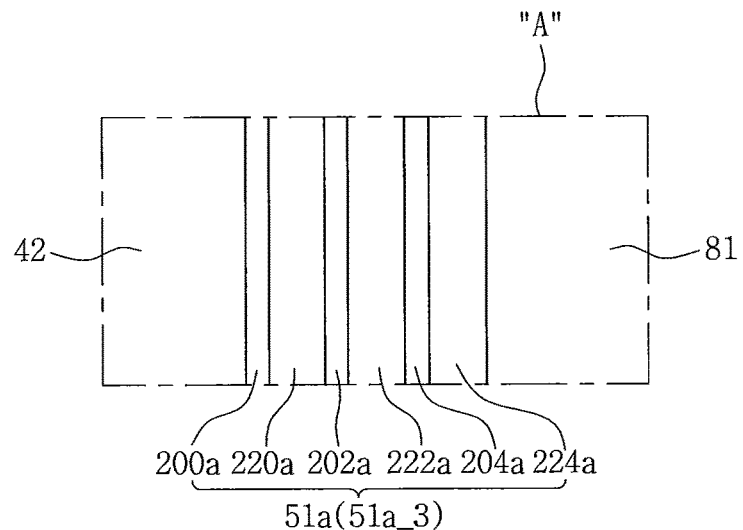
FIG. 3C is a cross-sectional view of a semiconductor device according to an embodiment of the inventive concept.

Referring to FIG. 3C, the inner spacer 51a according to an embodiment may be a spacer 51a_3 that includes a plurality of nitrided base layers 200a, 202a, and 204a and a plurality of nitrided silicon layers 220a, 222a, and 224a. The plurality of nitrided base layers 200a, 202a, and 204a may be thinner than the plurality of nitrided silicon layers 220a, 222a, and 224a. The plurality of nitrided base layers 200a, 202a, and 204a may be formed of a material having a higher density than the plurality of nitrided silicon layers 220a, 222a, and 224a. The plurality of nitrided base layers 200a, 202a, and 204a may have a higher C content than the plurality of nitrided silicon layers 220a, 222a, and 224a. For example, the plurality of nitrided base layers 200a, 202a, and 204a may be formed of SiHCN. The plurality of nitrided silicon layers 220a, 222a, and 224a may be formed of a Si-rich silicon nitride. The plurality of nitrided base layers 200a, 202a, and 204a may include a first nitrided base layer 200a, a second nitrided base layer 202a, and a third nitrided base layer 204a, and the plurality of nitrided silicon layers 220a, 222a, and 224a may include a first nitrided silicon layer 220a, a second nitrided silicon layer 222a, and a third nitrided silicon layer 224a. The first nitrided base layer 200a may be interposed between the first nitrided silicon layer 220a and the upper interconnection pattern 42, the second nitrided base layer 202a may be disposed between the first and second nitrided silicon layers 220a and 222a, and the third nitrided base layer 204a may be disposed between the second and third nitrided silicon layers 222a and 224a.

The plurality of nitrided base layers 200a, 202a, and 204a and the plurality of nitrided silicon layers 220a, 222a, and 224a may increase an etching resistance to an oxide wet etchant.

Figure 3D:
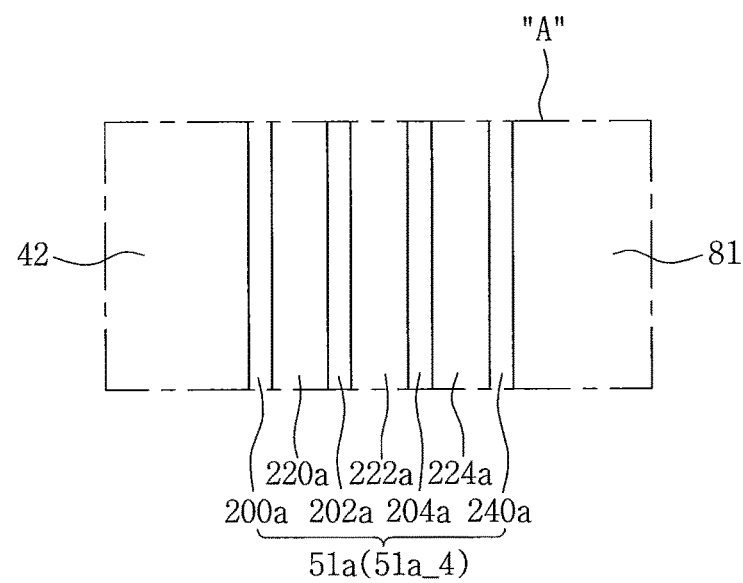
FIG. 3D is a cross-sectional view of a semiconductor device according to an embodiment of the inventive concept.

Referring to FIG. 3D, the inner spacer 51a according to an embodiment may be a spacer 51a_4 that includes a plurality of nitrided base layers 200a, 202a, and 204a, a plurality of nitrided silicon layers 220a, 222a, and 224a, and a nitrided barrier layer 240a.

The plurality of nitrided base layers 200a, 202a, and 204a and the plurality of nitrided silicon layers 220a, 222a, and 224a may be the same as described with reference to FIG. 3C. The nitrided barrier layer 240a may be formed to a smaller thickness than each of the nitrided silicon layers 220a, 222a, and 224a. The nitrided barrier layer 240a may be formed of the same material as the plurality of nitrided base layers 200a, 202a, and 204a. The nitrided barrier layer 240a may be formed of a material having a higher density than the nitrided silicon layers 220a, 222a, and 224a. The nitrided barrier layer 240a and the plurality of nitrided base layers 200a, 202a, and 204a may be formed of a SiHCN material. The plurality of nitrided silicon layers 220a, 222a, and 224a may include a Si-rich silicon nitride.

The nitrided barrier layer 240a may be in contact with the air spacer 81. Accordingly, the nitrided barrier layer 240a may be disposed between the air spacer 81 and the nitrided silicon layer 224a that is disposed farthest from the upper interconnection pattern 42 of the first conductive structure 43 from among the plurality of nitrided silicon layers 220a, 222a, and 224a.

Figure 3E:
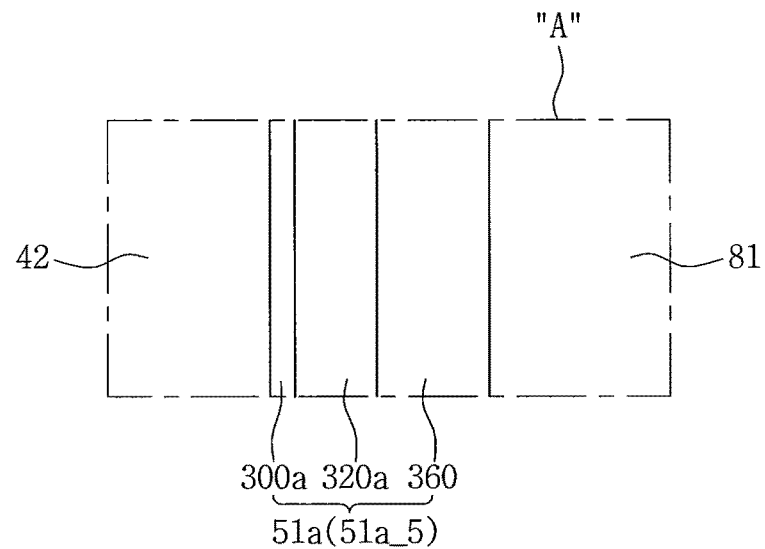
FIG. 3E is a cross-sectional view of a semiconductor device according to an embodiment of the inventive concept.

Referring to FIG. 3E, the inner spacer 51a according to an embodiment may be a spacer 51a_5 that includes a nitrided base layer 300a, a nitrided silicon layer 320a, and a silicon nitride layer 360.

The nitrided silicon layer 320a may be disposed between the nitrided base layer 300a and the silicon nitride layer 360. The silicon nitride layer 360 may be disposed between the nitrided silicon layer 320a and the air spacer 81. The nitrided base layer 300a may be disposed between the nitrided silicon layer 320a and the upper interconnection pattern 42 of the first conductive structure 43.

The nitrided base layer 300a may be formed to a smaller thickness than the nitrided silicon layer 320a and the silicon nitride layer 360. The nitrided base layer 300a may be formed of a material having a higher density than the nitrided silicon layer 320a and/or the silicon nitride layer 360. The nitrided base layer 300a may be formed of SiHCN. The silicon nitride layer 360 may have a higher N content than the nitrided silicon layer 320a. The silicon nitride layer 360 may be formed of N-rich silicon nitride, and the nitrided silicon layer 320a may be formed of Si-rich silicon nitride.

Figure 3F:
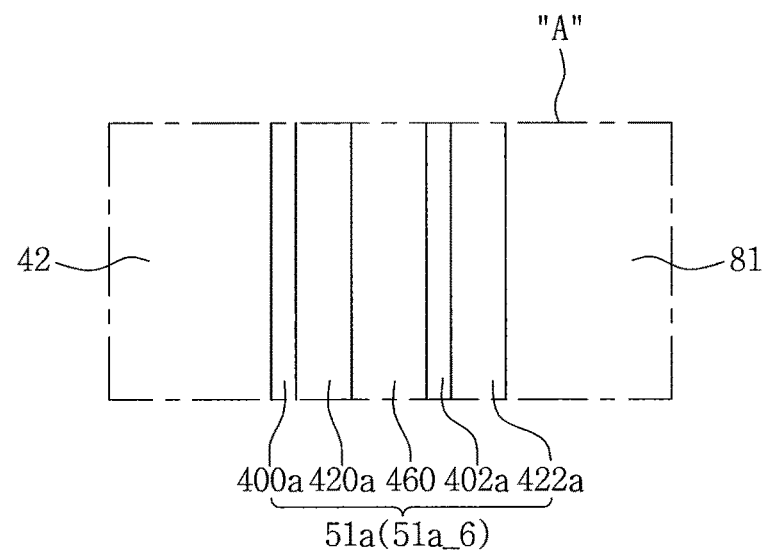
FIG. 3F is a cross-sectional view of a semiconductor device according to an embodiment of the inventive concept.

Referring to FIG. 3F, the inner spacer 51a according to an embodiment may be a spacer 51a_6 that includes first and second nitrided base layers 400a and 402a, first and second nitrided silicon layers 420a and 422a, and a silicon nitride layer 460.

The first nitrided base layer 400a, the first nitrided silicon layer 420a, the silicon nitride layer 460, the second nitrided base layer 402, and the second nitrided silicon layer 422a may be sequentially arranged from the upper interconnection pattern 42 of the first conductive structure 43 toward the air spacer 81. The first and second nitrided base layers 400a and 402a may be formed of a material having a higher density than the first and second nitrided silicon layers 420a and 422a and/or the silicon nitride layer 460. The first and second nitrided base layers 400a and 402a may be formed of a material having a higher C content than the first and second nitrided silicon layers 420a, 422a. The first and second nitrided base layers 400a and 402a may be thinner than the first and second nitrided silicon layers 420a and 422a and the silicon nitride layer 460. The first and second nitrided base layers 400a and 402a may be formed of SiHCN, the first and second nitrided silicon layers 420a, 422a may be formed of a Si-rich silicon nitride, and the silicon nitride layer 460 may be formed of an N-rich silicon nitride.

Figure 3G:
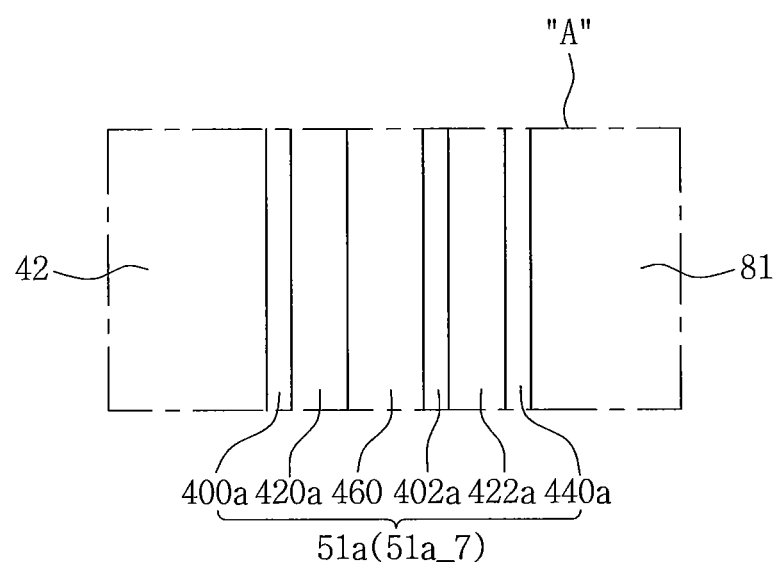
FIG. 3G is a cross-sectional view of a semiconductor device according to an embodiment of the inventive concept.

Referring to FIG. 3G, the inner spacer 51a according to an embodiment may be a spacer 51a_7 that includes first and second nitrided base layers 400a and 402a, first and second nitrided silicon layers 420a and 422a, a silicon nitride layer 460, and a nitrided barrier layer 440a.

The first and second nitrided base layers 400a and 402a, the first and second nitrided silicon layers 420a and 422a, and the silicon nitride layer 460 may be the same as described with reference to FIG. 3F. The nitrided barrier layer 440a may be disposed between the second nitrided silicon layer 422a and the air spacer 81. The nitrided barrier layer 440a may be formed of the same material as the first and second nitrided base layers 400a and 402a. The nitrided barrier layer 440a may be formed to a smaller thickness than the first and second nitrided silicon layers 420a and 422a and the silicon nitride layer 460.

Next, the outer spacer 57 will be described with reference to FIGS. 4A through 4G.

Figure 4A:
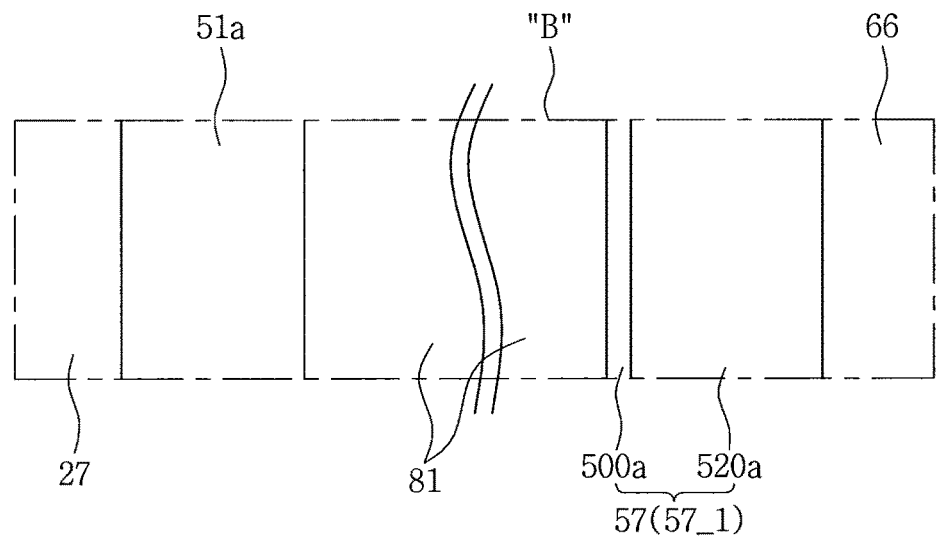
FIG. 4A is a cross-sectional view of a semiconductor device according to an embodiment of the inventive concept.
Figure 5A:
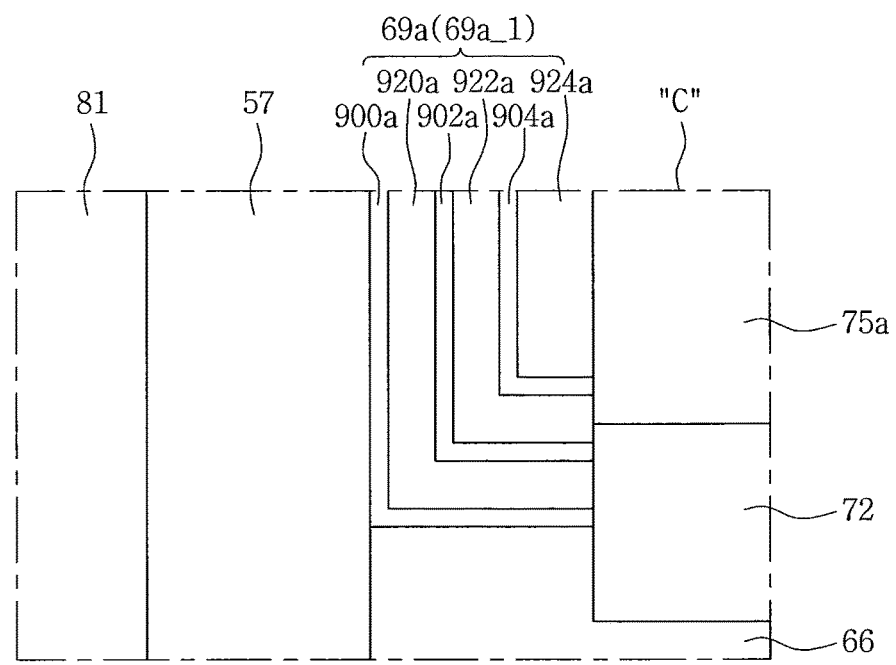
FIG. 5A is a cross-sectional view of a semiconductor device according to an embodiment of the inventive concept.
Figure 5B:
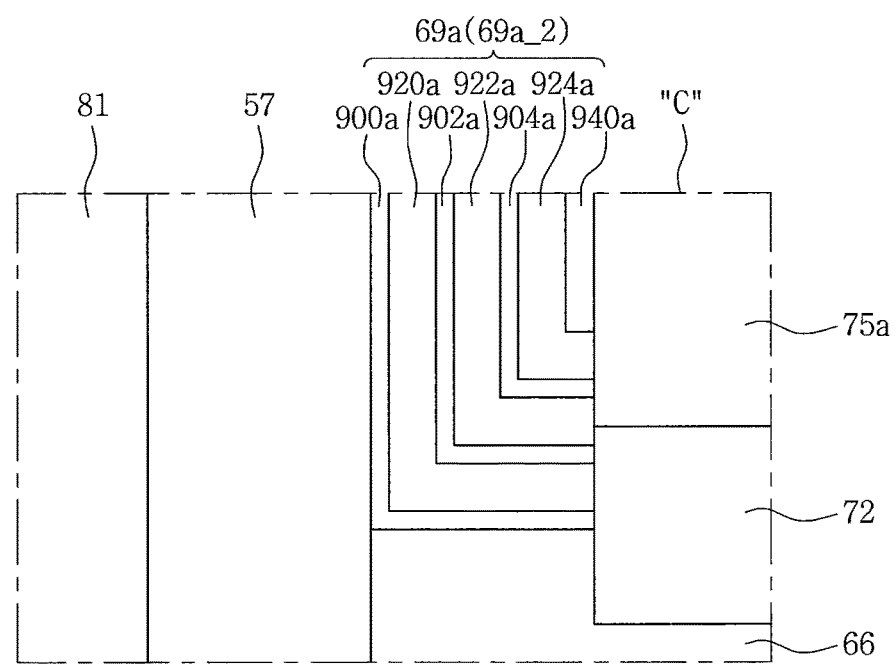
FIG. 5B is a cross-sectional view of a semiconductor device according to an embodiment of the inventive concept.
Figure 5C:
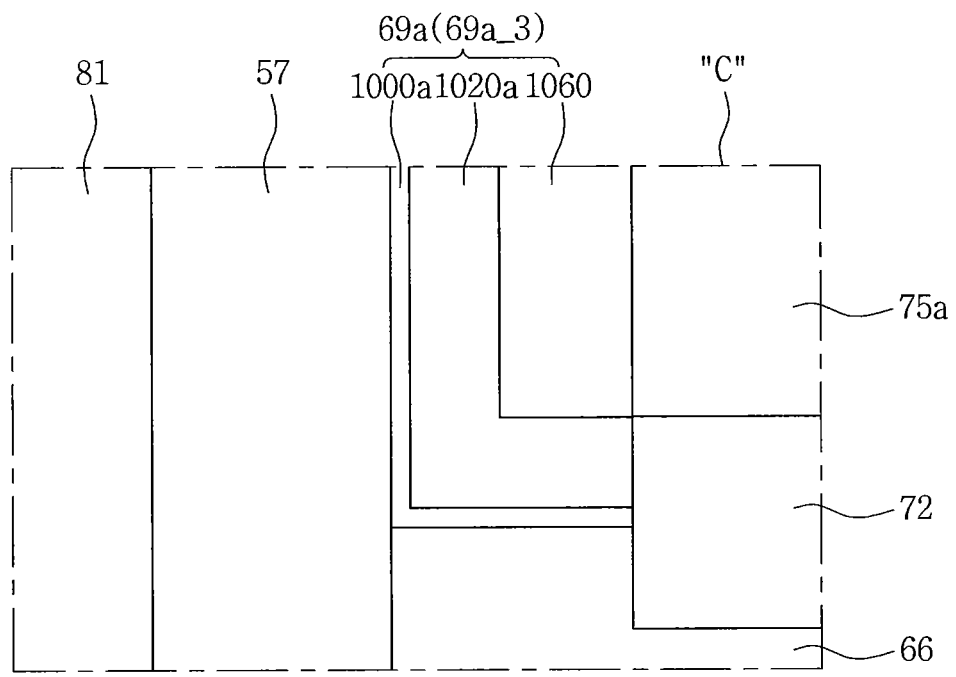
FIG. 5C is a cross-sectional view of a semiconductor device according to an embodiment of the inventive concept.

Referring to FIG. 4A, the outer spacer 57 according to an embodiment may be a spacer 57_1 that includes a nitrided base layer 500a and a nitrided silicon layer 520a disposed on the nitrided base layer 500a.

The nitrided base layer 500a may be disposed between the nitrided silicon layer 520a and the air spacer 81. The nitrided silicon layer 520a may be thicker than the nitrided base layer 500a. The nitrided base layer 500a may be formed of a material having a higher density than the nitrided silicon layer 520a. The nitrided base layer 500a may be formed of a material having a higher C content than the nitrided silicon layer 520a. The nitrided base layer 500a may be formed of a SiHCN material. The nitrided silicon layer 520a may be formed of a Si-rich silicon nitride.

Figure 4B:
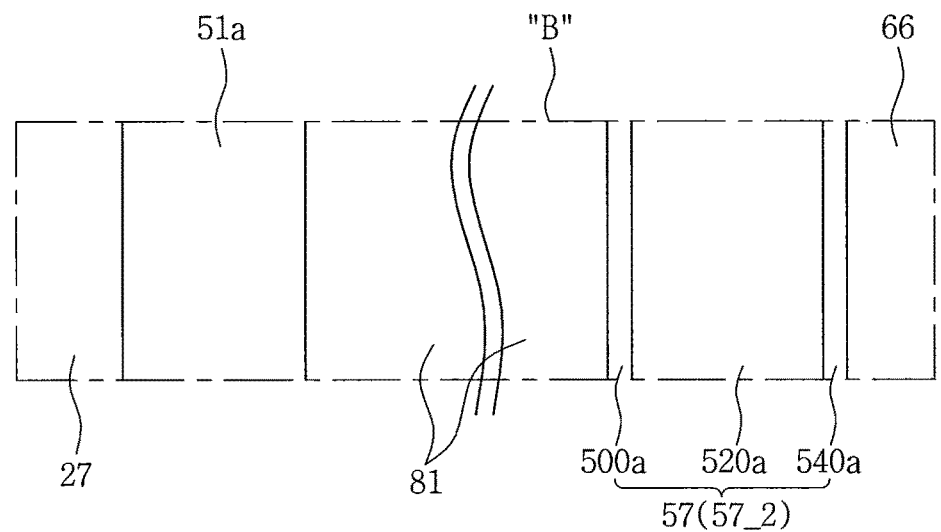
FIG. 4B is a cross-sectional view of a semiconductor device according to an embodiment of the inventive concept.

Referring to FIG. 4B, the outer spacer 57 according to an embodiment may be a spacer 57_2 that includes a nitrided base layer 500a, a nitrided silicon layer 520a, and a nitrided barrier layer 540a.

The nitrided silicon layer 520a may be disposed between the nitrided base layer 500a and the nitrided barrier layer 540a. The nitrided base layer 500a may be disposed between the nitrided silicon layer 520a and the air spacer 81. The nitrided silicon layer 520a may be thicker than the nitrided base layer 500a and/or the nitrided barrier layer 540a. The nitrided base layer 500a and the nitrided barrier layer 540a may be formed of a material having a higher density than the nitrided silicon layer 520a. The nitrided base layer 500a and the nitrided barrier layer 540a may be formed of the same material. The nitrided base layer 500a and/or the nitrided barrier layer 540a may be formed of a material having a higher C content than the nitrided silicon layer 520a. The nitrided base layer 500a and/or the nitrided barrier layer 540a may be formed of SiHCN, and the nitrided silicon layer 520a may be formed of a Si-rich silicon nitride.

Figure 4C:
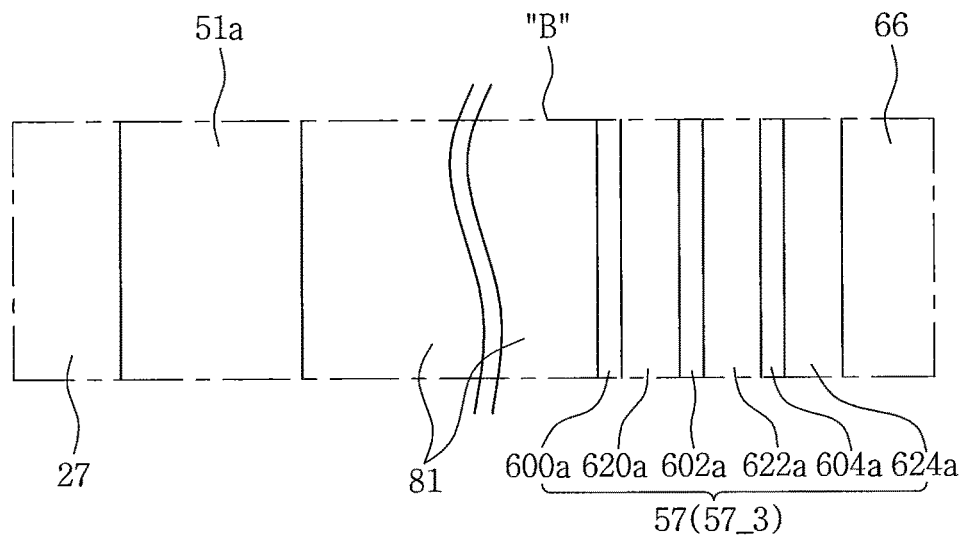
FIG. 4C is a cross-sectional view of a semiconductor device according to an embodiment of the inventive concept.

Referring to FIG. 4C, the outer spacer 57 according to an embodiment may be a spacer 57_3 that includes a plurality of nitrided base layers 600a, 602a, and 604a and a plurality of nitrided silicon layers 620a, 622a, and 624a. The plurality of nitrided base layers 600a, 602a, and 604a may be formed to smaller thicknesses than the plurality of nitrided silicon layers 620a, 622a, and 624a. The plurality of nitrided base layers 600a, 602a, and 604a may be formed of a material having a higher density than the plurality of nitrided silicon layers 620a, 622a, and 624a. The plurality of nitrided base layers 600a, 602a, and 604a may be formed of SiHCN. The plurality of nitrided silicon layers 620a, 622a, and 624a may be formed of a Si-rich silicon nitride.

The plurality of nitrided base layers 600a, 602a, and 604a may include first, second, and third nitrided base layers 600a, 602a, and 604a, and the plurality of nitrided silicon layers 620a, 622a, and 624a may include first, second and third nitrided base layers 600a, 602a, and 604a. The first nitrided base layer 600a may be disposed between the first nitrided silicon layer 620a and the air spacer 81, the second nitrided base layer 602a may be disposed between the first and second nitrided silicon layers 620a and 622a, and the third nitrided base layer 604a may be disposed between the second and third nitrided silicon layers 622a and 624a.

Figure 4D:
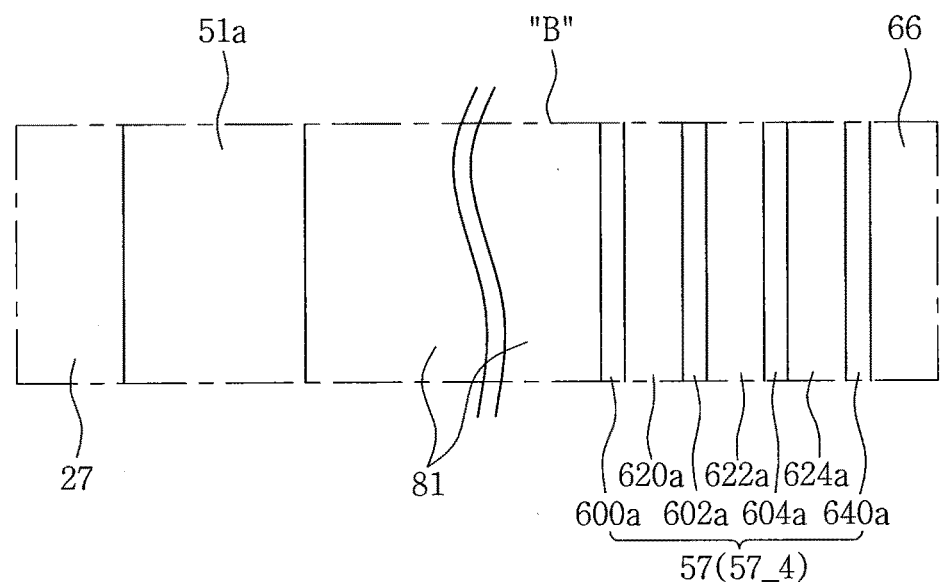
FIG. 4D is a cross-sectional view of a semiconductor device according to an embodiment of the inventive concept.

Referring to FIG. 4D, the outer spacer 57 according to an embodiment may be a spacer 57_4 that includes a plurality of nitrided base layers 600a, 602a, and 604a, a plurality of nitrided silicon layers 620a, 622a, and 624a, and a nitrided barrier layer 640a.

The plurality of nitrided base layers 600a, 602a, and 604a and the plurality of nitrided silicon layers 620a, 622a, and 624a may be the same as described with reference to FIG. 4C. The nitrided barrier layer 640a may be formed of the same material as the plurality of nitrided base layers 600a, 602a, and 604a. The nitrided barrier layer 640a may be formed to a smaller thickness than the plurality of nitrided silicon layers 620a, 622a, and 624a. The nitrided barrier layer 640a and the plurality of nitrided base layers 600a, 602a, and 604a may be formed of SiHCN. The plurality of nitrided silicon layers 620a, 622a, and 624a may include a Si-rich silicon nitride. The nitrided barrier layer 640a may be disposed between the third nitrided silicon layer 624a and the second conductive structure 66.

Figure 4E:
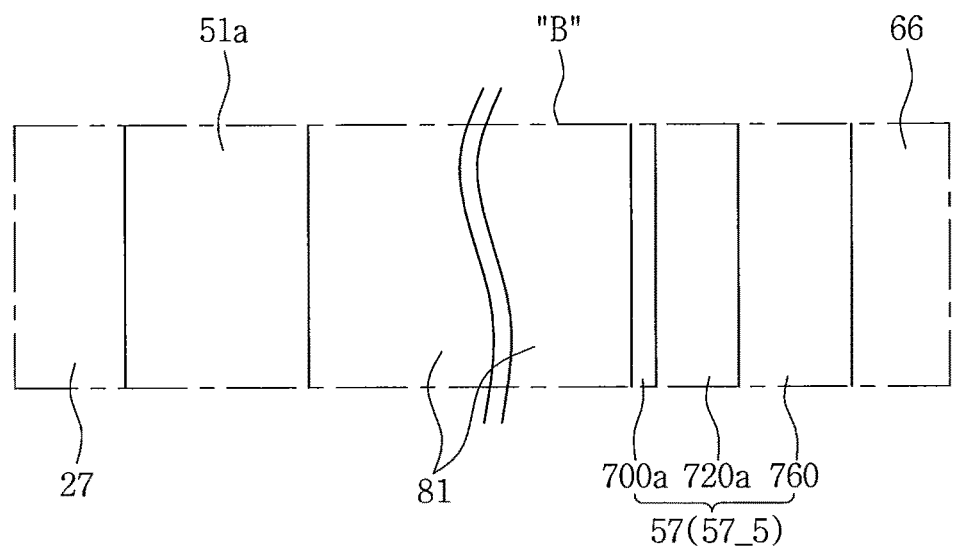
FIG. 4E is a cross-sectional view of a semiconductor device according to an embodiment of the inventive concept.

Referring to FIG. 4E, the outer spacer 57 according to an embodiment may be a spacer 57_5 that includes a nitrided base layer 700a, a nitrided silicon layer 720a, and a silicon nitride layer 760.

The nitrided silicon layer 720a may be disposed between the nitrided base layer 700a and the silicon nitride layer 760. The nitrided base layer 700a may be disposed between the nitrided silicon layer 720a and the air spacer 81. The nitrided silicon layer 720a may be disposed between the silicon nitride layer 760 and the nitrided base layer 700a.

The nitrided base layer 700a may be formed to a smaller thickness than the nitrided silicon layer 720a and the silicon nitride layer 760. The nitrided base layer 700a may have a higher density than the nitrided silicon layer 720a and/or the silicon nitride layer 760. The nitrided base layer 700a may be formed of SiHCN. The silicon nitride layer 760 may have a higher N content than the nitrided silicon layer 720a. The silicon nitride layer 760 may be formed of N-rich silicon nitride, and the nitrided silicon layer 720a may be formed of Si-rich silicon nitride.

Figure 4F:
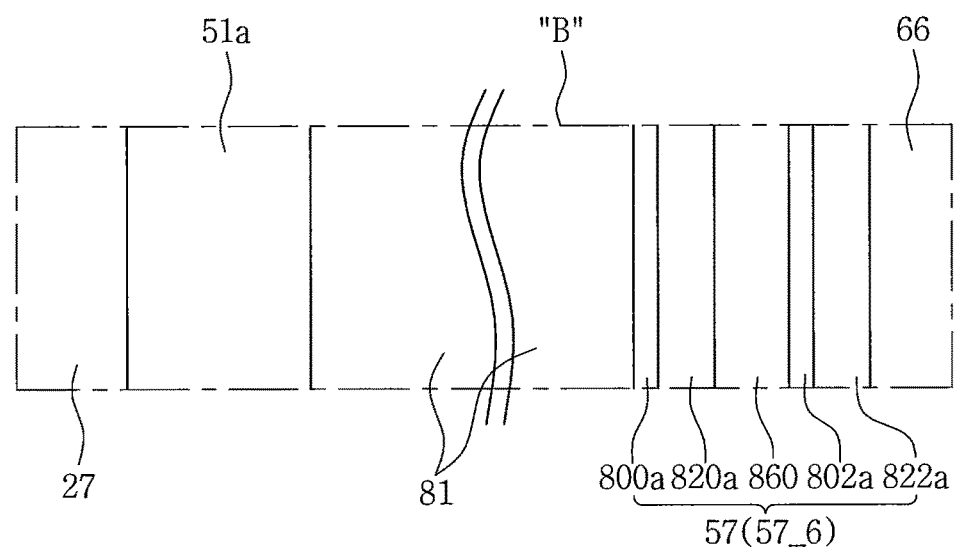
FIG. 4F is a cross-sectional view of a semiconductor device according to an embodiment of the inventive concept.

Referring to FIG. 4F, the outer spacer 57 according to an embodiment may be a spacer 57_6 that includes first and second nitrided base layers 800a and 802a, first and second nitrided silicon layers 820a and 822a, and a silicon nitride layer 860.

The first nitrided base layer 800a, the first nitrided silicon layer 820a, the silicon nitride layer 860, the second nitrided base layer 802a, and the second nitrided silicon layer 822a may be sequentially arranged from the air spacer 81 toward the second conductive structure 66. The first and second nitrided base layers 800a and 802a may be formed of a material having a higher density than the first and second nitrided silicon layers 820a and 822a and/or the silicon nitride layer 860. The first and second nitrided base layers 800a and 802a may be formed of a material having a higher C content than the first and second nitrided silicon layers 820a and 822a. The first and second nitrided base layers 800a and 802a may be thinner than the first and second nitrided silicon layers 820a and 822a and the silicon nitride layer 860. The first and second nitrided base layers 800a and 802a may be formed of a SiHCN material. The first and second nitrided silicon layers 820a and 822a may be formed of a Si-rich silicon nitride, and the silicon nitride layer 860 may be formed of an N-rich silicon nitride.

Figure 4G:
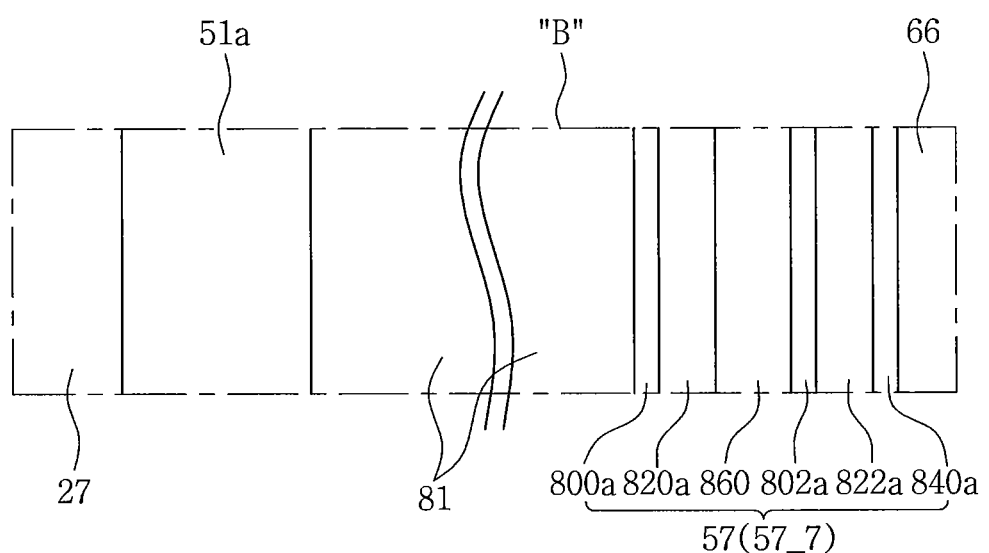
FIG. 4G is a cross-sectional view of a semiconductor device according to an embodiment of the inventive concept.

Referring to FIG. 4G, the outer spacer 57 according to an embodiment may be a spacer 57_7 that includes first and second nitrided base layers 800a and 802a, first and second nitrided silicon layers 820a and 822a, a silicon nitride layer 860, and a nitrided barrier layer 840a.

The first and second nitrided base layers 800a and 802a, the first and second nitrided silicon layers 820a and 822a, and the silicon nitride layer 860 may be the same as described with reference to FIG. 4F. The nitrided barrier layer 840a may be disposed between the second nitrided silicon layer 822a and the second conductive structure 66. The nitrided barrier layer 840a may be formed of the same material as the first and second nitrided base layers 800a and 802a. The nitrided barrier layer 840a may be formed to a smaller thickness than the first and second nitrided silicon layers 820a and 822a and the silicon nitride layer 860.

Next, the upper spacer 69a will be described with reference to FIGS. 5A through 5C.

Referring to FIG. 5A, the upper spacer 69a according to an embodiment may be a spacer 69a_1 that includes a plurality of nitrided base layers 900a, 902a, and 904a and a plurality of nitrided silicon layers 920a, 922a, and 924a.

The plurality of nitrided base layers 900a, 902a, and 904a may be formed to smaller thicknesses than the plurality of nitrided silicon layers 920a, 922a, and 924a. The plurality of nitrided base layers 900a, 902a, and 904a may be formed of a material having a higher density than the plurality of nitrided silicon layers 920a, 922a, and 924a. The plurality of nitrided base layers 900a, 902a, and 904a may be formed of SiHCN. The plurality of nitrided silicon layers 920a, 922a, and 924a may be formed of Si-rich silicon nitride. The plurality of nitrided base layers 900a, 902a, and 904a may include first, second, and third nitrided base layers 900a, 902a, and 904a, and the plurality of nitrided silicon layers 920a, 922a, and 924a may include first, second and third nitrided silicon layers 920a, 922a, and 924a. The first nitrided base layer 900a may be interposed between the first nitrided silicon layer 920a and the outer spacer 57 and between the first nitrided silicon layer 920a and the lower contact pattern 66. The second nitrided base layer 902a may be interposed between the first nitrided silicon layer 920a and the second nitrided silicon layer 922a. The third nitrided base layer 904a may be interposed between the second nitrided silicon layer 922a and the third nitrided silicon layer 924a.

Referring to FIG. 5B, the upper spacer 69a according to an embodiment may be a spacer 69a_2 that includes a plurality of nitrided base layers 900a, 902a, and 904a, a plurality of nitrided silicon layers 920a, 922a, and 924a, and a nitrided barrier layer 940a. The plurality of nitrided base layers 900a, 902a, and 904a and the plurality of nitrided silicon layers 920a, 922a, and 924a may be the same as described with reference to FIG. 5A. The nitrided barrier layer 940a may be formed of the same material as the plurality of nitrided base layers 900a, 902a, and 904a. The nitrided barrier layer 940a may be formed to a smaller thickness than the plurality of nitrided silicon layers 920a, 922a, and 924a. The nitrided barrier layer 940a and the plurality of nitrided base layers 900a, 902a, and 904a may be formed of SiHCN. The plurality of nitrided silicon layers 920a, 922a, and 924a may include Si-rich silicon nitride. The nitrided barrier layer 940a may be disposed between the third nitrided silicon layer 924a and the upper contact pattern 75a.

Referring to FIG. 5C, the upper spacer 69a according to an embodiment may be a spacer 69a_3 that includes a nitrided base layer 1000a, a nitrided silicon layer 1020a, and a silicon nitride layer 1060.

The nitrided silicon layer 1020a may be disposed between the nitrided base layer 1000a and the silicon nitride layer 1060. The nitrided base layer 1000a may be interposed between the nitrided silicon layer 1020a and the outer spacer 57 and between the nitrided silicon layer 1020a and the lower contact pattern 66. The nitrided base layer 1000a may be formed to a smaller thickness than the nitrided silicon layer 1020a and the silicon nitride layer 1060. The nitrided base layer 1000a may have a higher density than the nitrided silicon layer 1020a and/or the silicon nitride layer 1060. The nitrided base layer 1000a may be formed of SiHCN. The silicon nitride layer 1060 may have a lower Si content (i.e., concentration) than the nitrided silicon layer 1020a. The silicon nitride layer 1060 may be formed of N-rich silicon nitride, and the nitrided silicon layer 1020a may be formed of Si-rich silicon nitride.

Figure 6A:
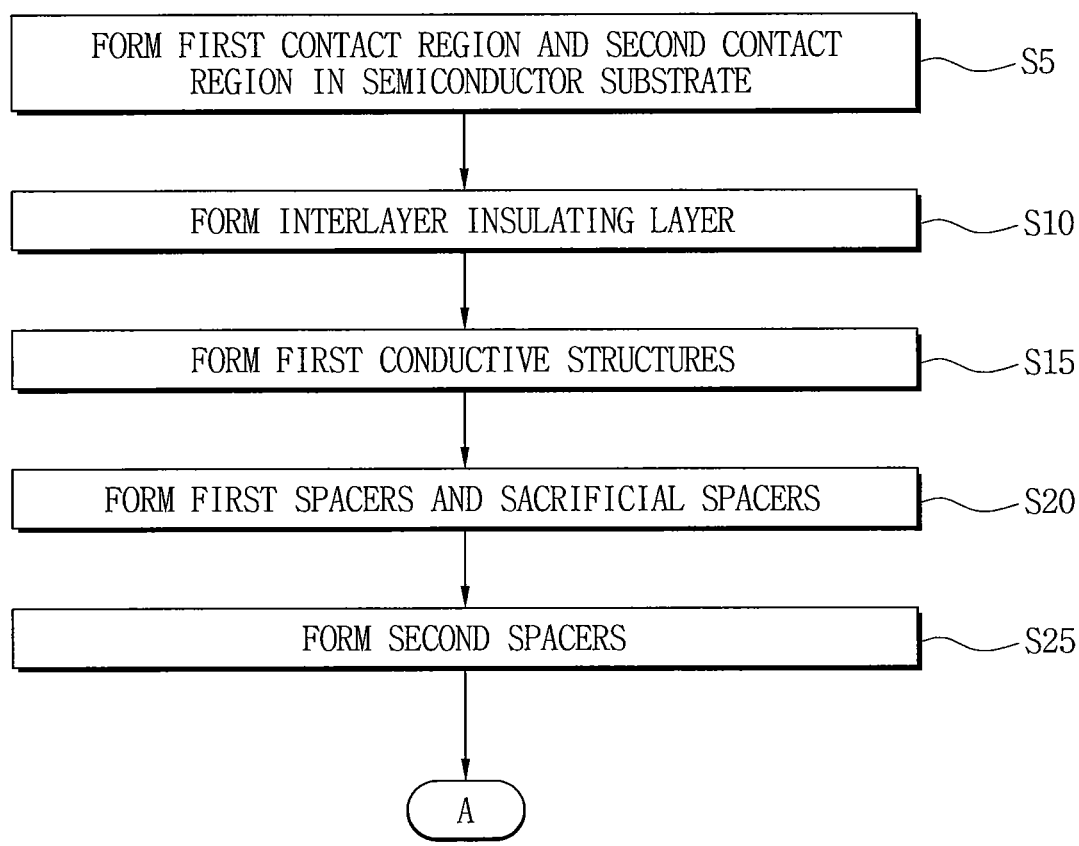
FIGS. 6A and 6B are flowcharts of a method of forming a semiconductor device according to an embodiment of the inventive concept.
Figure 6B:
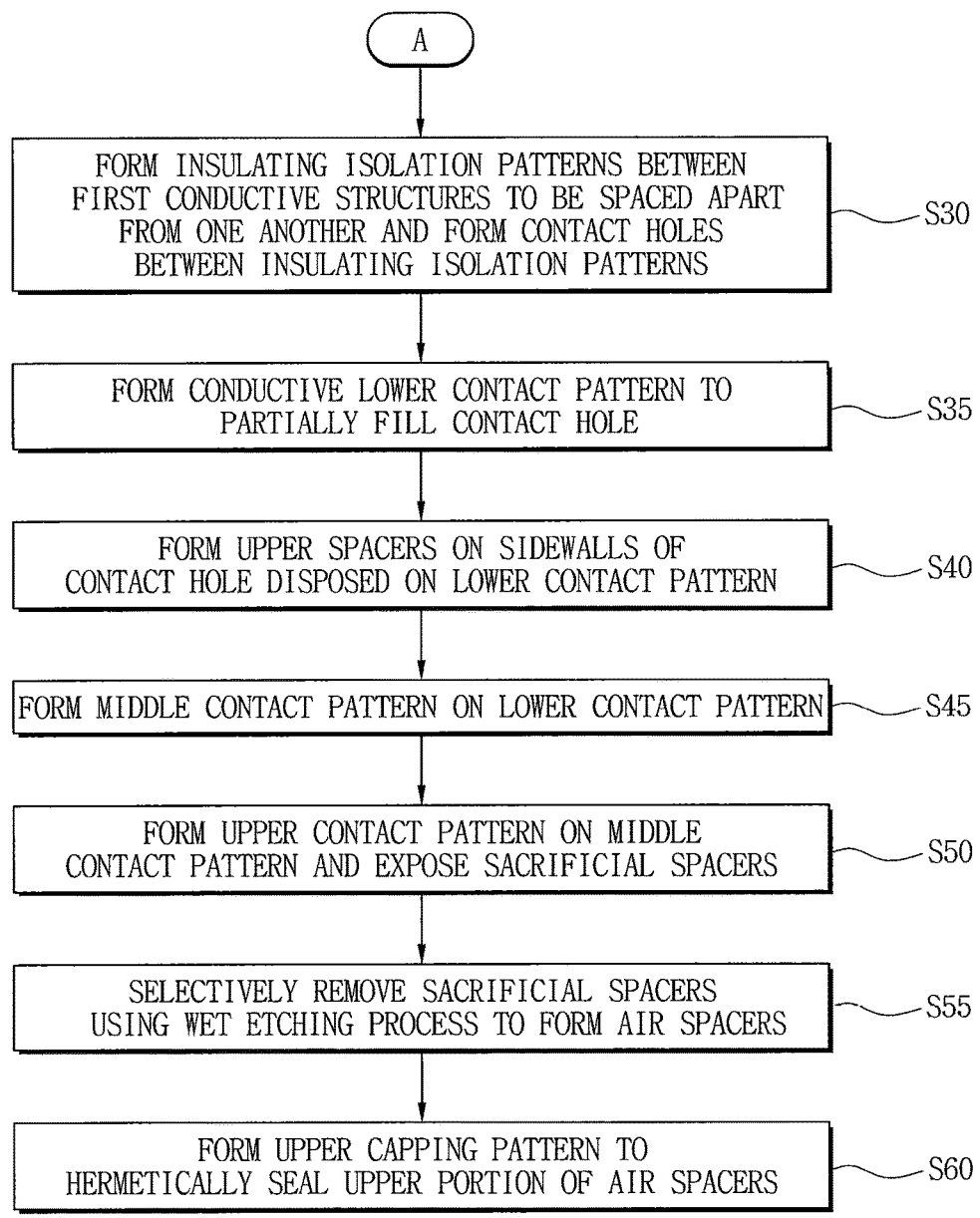

Next, a method of forming a semiconductor device according to embodiments of the inventive concept will be described with reference to FIGS. 6A and 6B. FIGS. 6A and 6B are flowcharts of a method of forming a semiconductor device according to an embodiment of the inventive concept.

Referring to FIGS. 6A and 6B, a semiconductor substrate may be prepared. The semiconductor substrate may be a silicon substrate. A first contact region and a second contact region may be formed in the semiconductor substrate (S5). The first contact region may be a first source/drain region of a transistor, and the second contact region may be a second source/drain region of the transistor.

An interlayer insulating layer may be formed (S10). The interlayer insulating layer may be formed on the semiconductor substrate having the first and second contact regions. First conductive structures may be formed apart from one another (S15). The first conductive structures may be formed on the interlayer insulating layer. First spacers and sacrificial spacers may be formed (S20). The first spacers may be inner spacers. The inner spacers and the sacrificial spacers may be sequentially formed on side surfaces of the first conductive structures.

In some embodiments, the sacrificial spacers may be oxide spacers. The sacrificial spacers may be formed of silicon oxide.

Second spacers may be formed (S25). The second spacers may be outer spacers. The outer spacers may be conformally formed on the substrate having the inner spacers and the sacrificial spacers.

Insulating isolation patterns may be formed between the first conductive structures and spaced apart from one another, and a contact hole may be formed between the insulating isolation patterns (S30). A conductive lower contact pattern may be formed to partially fill the contact hole (S35). Upper spacers may be formed on sidewalls of the remaining contact hole disposed on the lower contact pattern (S40). A middle contact pattern may be formed on the lower contact pattern (S45). An upper contact pattern may be formed on the middle contact pattern to expose sacrificial spacers (S50). The sacrificial spacers may be selectively removed by performing a wet etching process, thereby forming third spacers (S55). The third spacers may be air spacers. An upper capping pattern may be formed to hermetically seal upper portions of the third spacers (S60).

Next, a method of forming a semiconductor device according to embodiments of the inventive concept will be described with reference to FIGS. 7 through 12H and reference back to FIGS. 6A and 6B.

Figure 7:
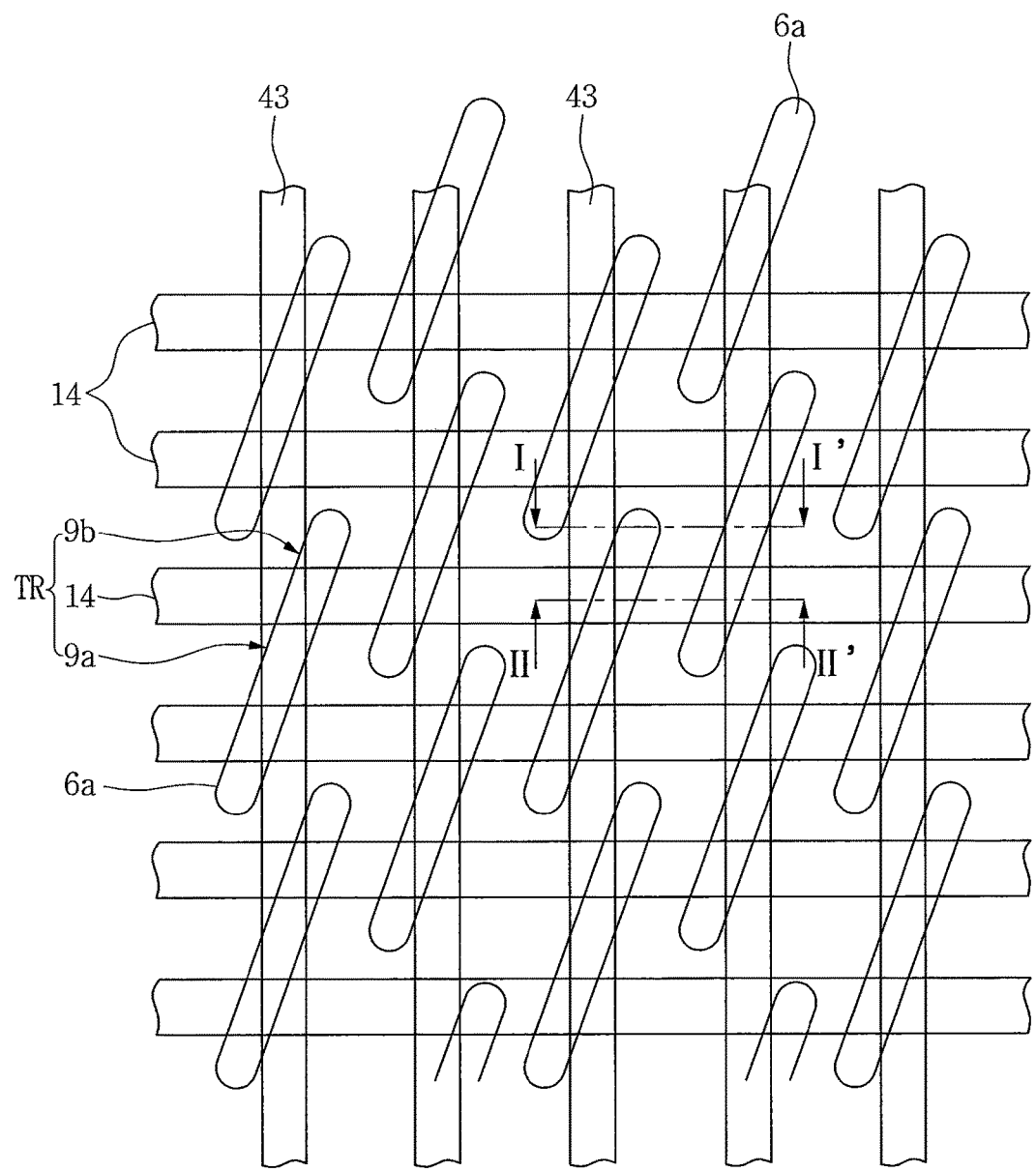
FIGS. 7, 9, and 11 are plan views of a method of forming a semiconductor device according to embodiments of the inventive concept.
Figure 8A:
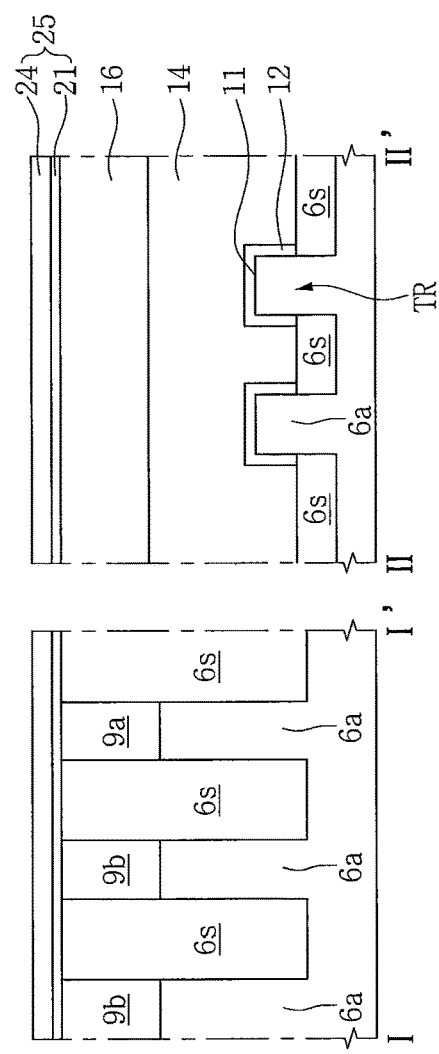
FIGS. 8A to 8F, 10A to 10D, and 12A to 12H are cross-sectional views of regions taken along lines I-I' of FIGS. 7, 9, and 11 and regions taken along lines II-II' of FIGS. 7, 9, and 11.
Figure 8B:
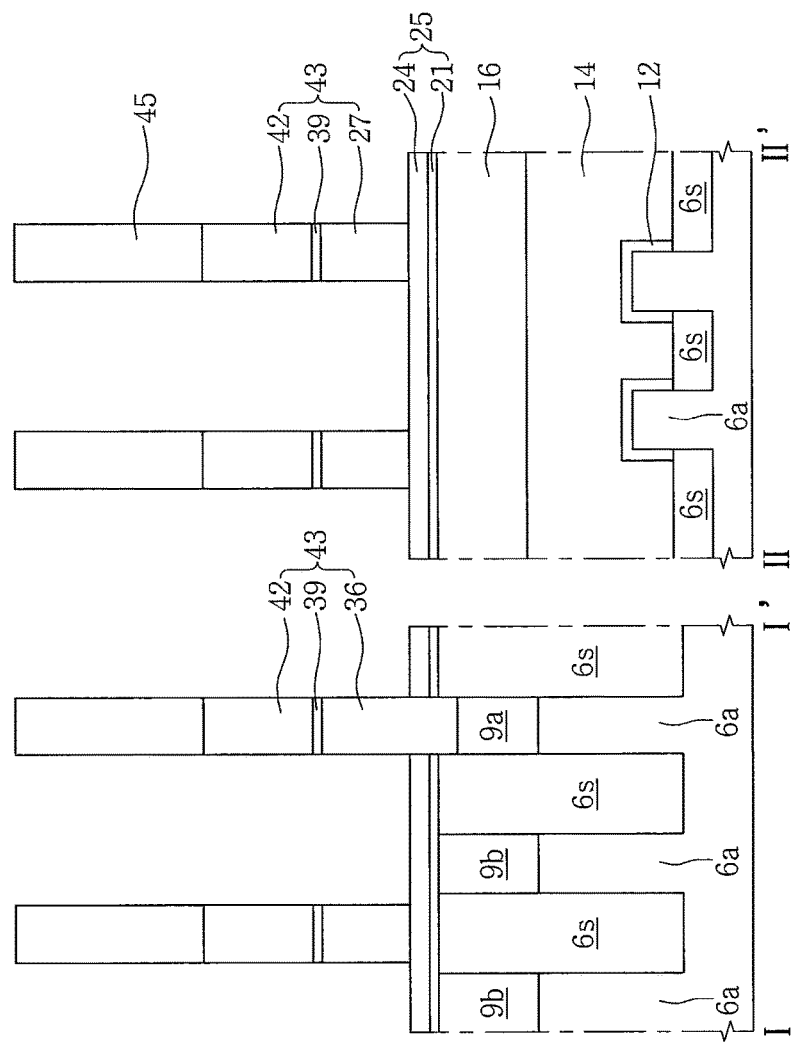
Figure 8C:
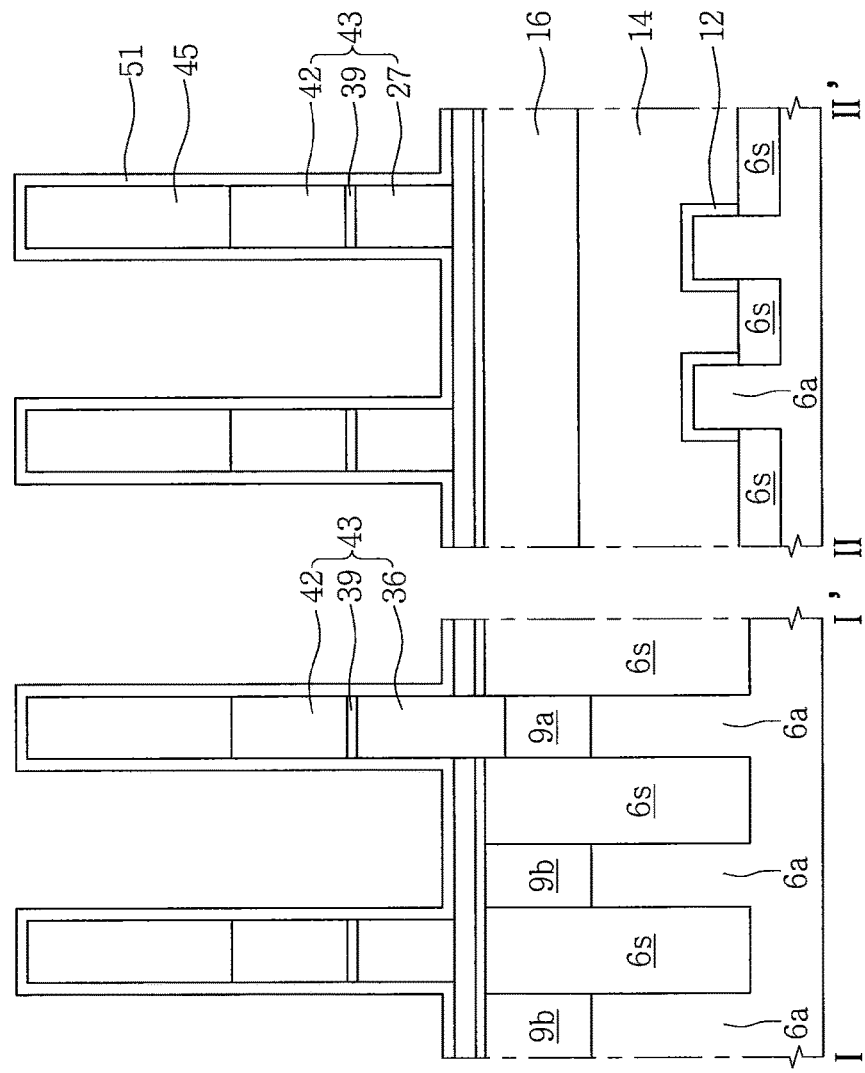
Figure 8D:
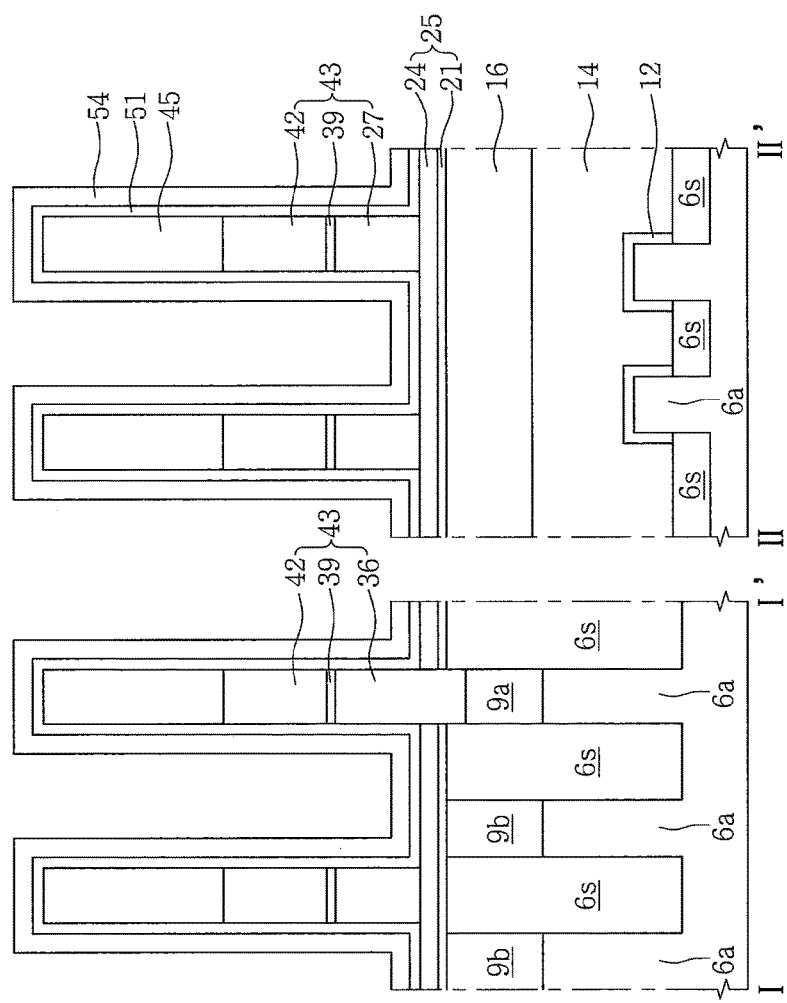
Figure 8E:
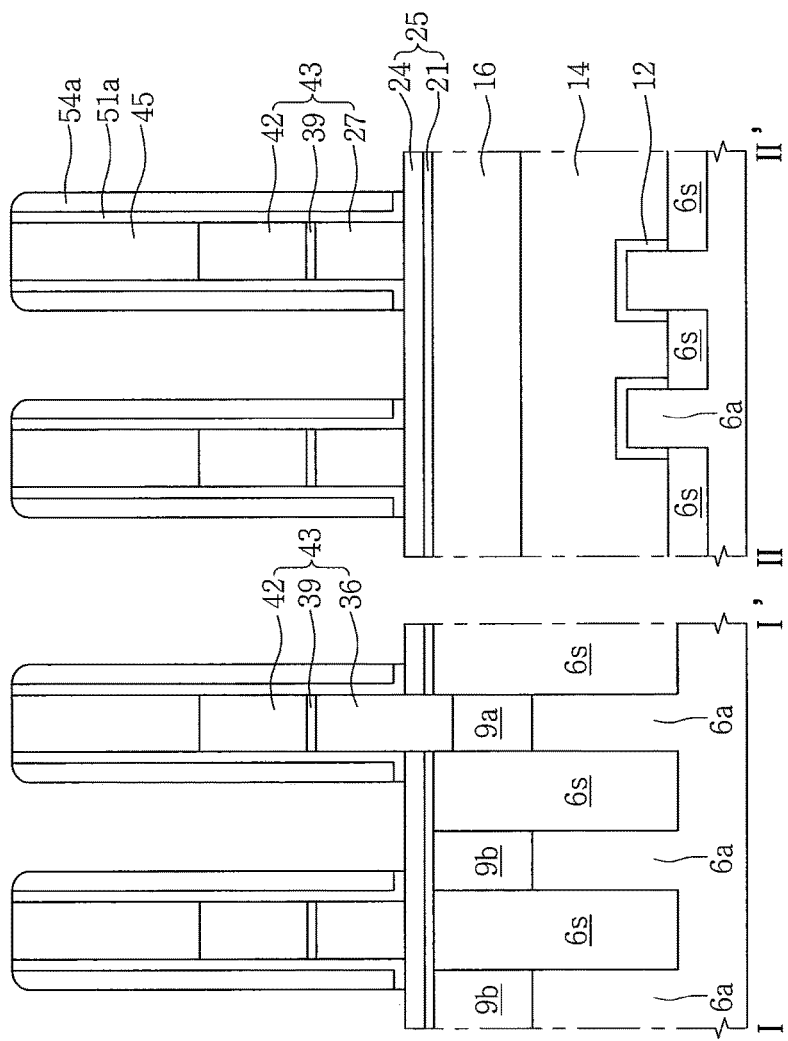
Figure 8F:
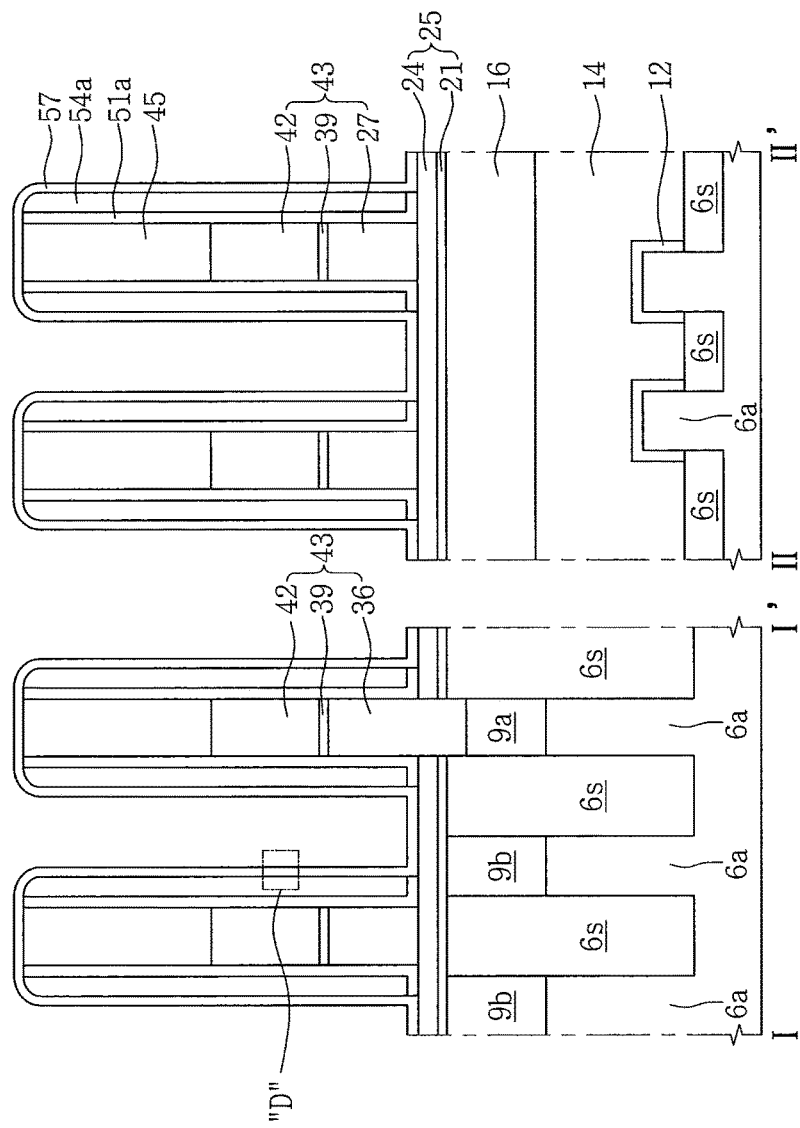
Figure 9:
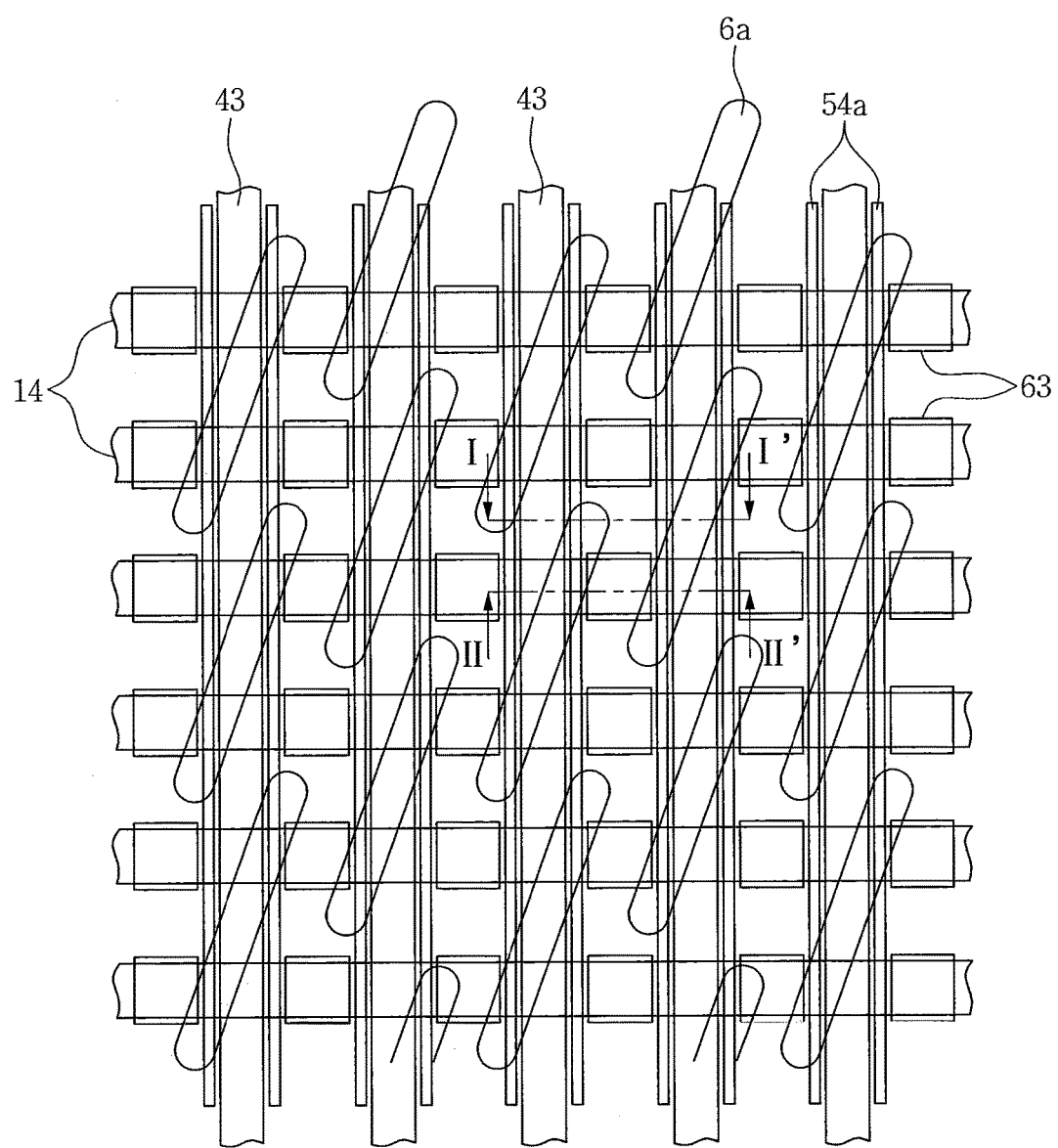
Figure 10A:
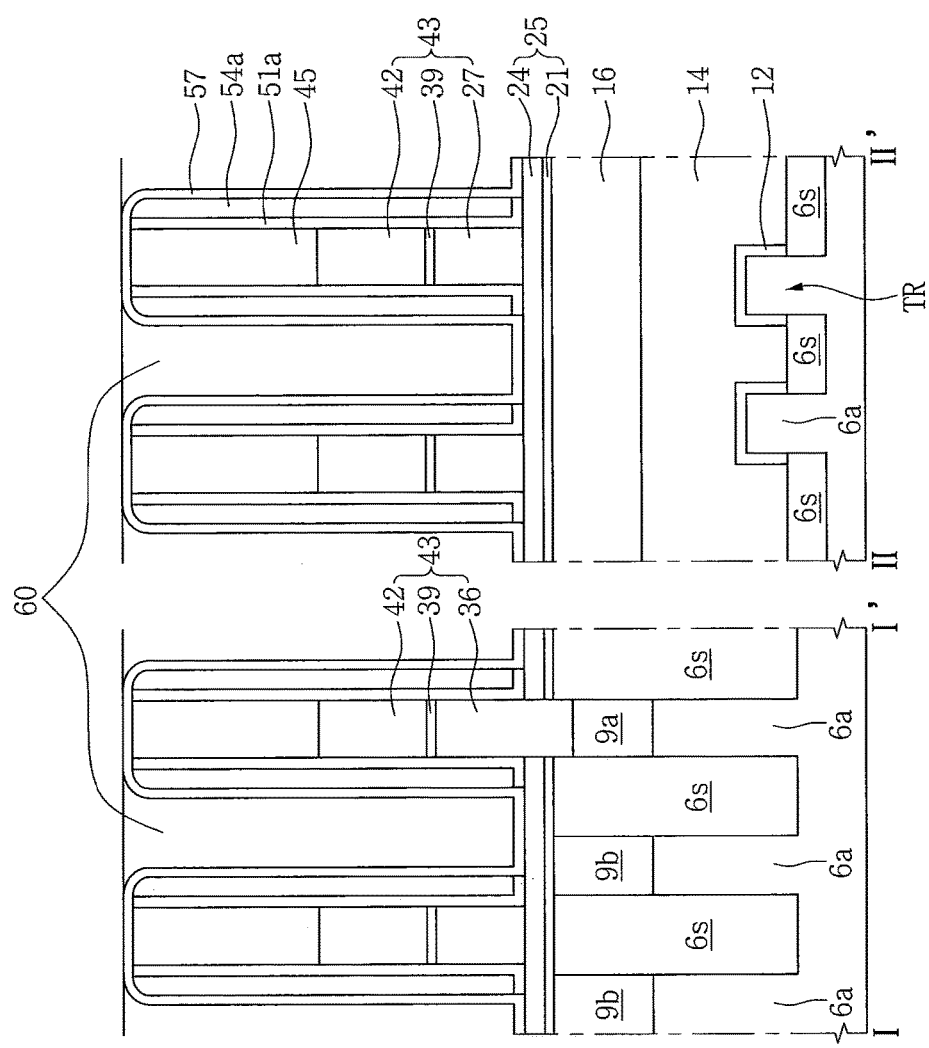
Figure 10B:
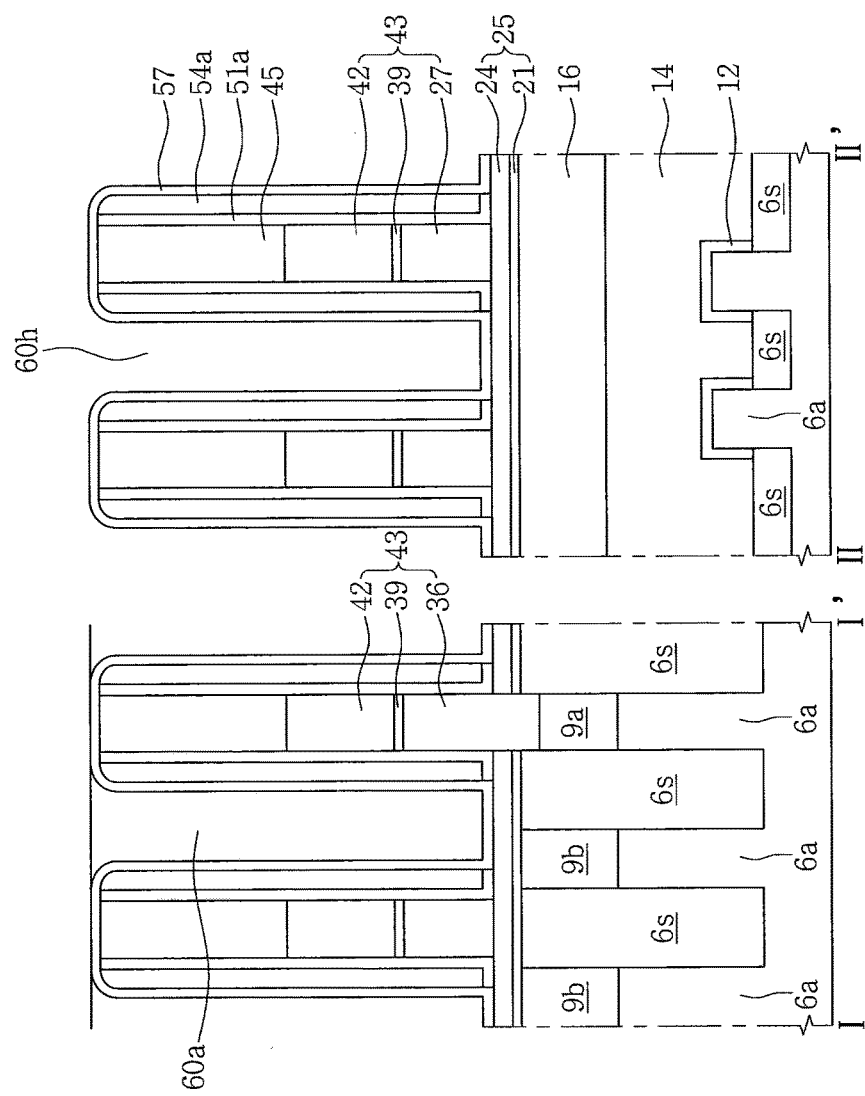
Figure 11:
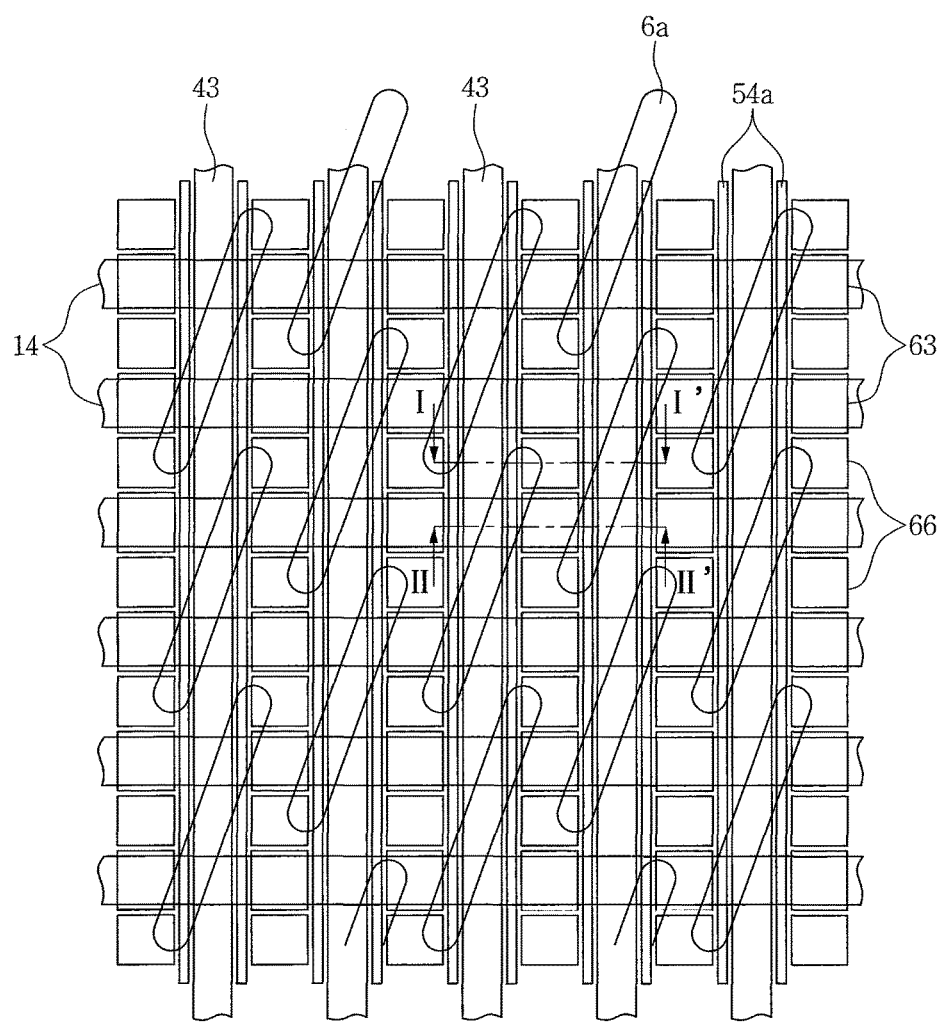

FIGS. 7, 9, and 11 are plan views of a method of forming a semiconductor device according to embodiments of the inventive concept. FIGS. 8A through 8F, 10A, 10B, and 12A through 12H are cross-sectional views of regions taken along lines I-I' of FIGS. 7, 9, and 11 and regions taken along lines II-II' of FIGS. 7, 9, and 11.

Referring to FIGS. 6A, 7, and 8A, a semiconductor substrate 3 may be prepared. The semiconductor substrate 3 may be formed of a semiconductor material, such as silicon. Isolation regions 6s may be formed in the semiconductor substrate 3 to define active regions 6a. The isolation regions 6s may be shallow trench isolation (STI) layers.

First and second contact regions 9a and 9b may be formed in the semiconductor substrate 3 (S5). The first and second contact regions 9a and 9b may be formed in upper regions of the active regions 6a.

The first contact regions 9a may be first source/drain regions 9a of transistors TR, and the second contact regions 9b may be second source/drain regions 9b of the transistors TR.

Each of the transistors TR may include a gate dielectric material 12, a gate electrode 14, the first source/drain region 9a, and the second source/drain region 9b.

The first and second source/drain regions 9a and 9b may provide the first and second contact regions. The formation of the first and second source/drain regions 9a and 9b may include performing an ion implantation process to implant impurity ions into an upper region of the active region 6a. The formation of the gate dielectric material 12 may include forming a gate trench 11 to run across the active region 6a and extend into the isolation region 6s and forming a dielectric material on the active region 6a exposed by the gate trench 11. The formation of the gate electrode 14 may include forming a gate conductive layer after forming the gate dielectric material 12, and partially etching the gate conductive layer to form a gate conductive pattern partially filling the gate trench 11. The gate electrode 14 may be a word line of a memory device, such as a dynamic random access memory (DRAM). A bottom surface of the gate electrode 14 may be formed at a level lower than a top surface of the active region 6a.

A gate capping pattern 16 may be formed on the gate electrode 14 to fill the remaining portion of the gate trench 11. The gate capping pattern 16 may be formed of silicon nitride. For example, the gate capping pattern 16 may be formed of N-rich nitride using a CVD or ALD process.

An interlayer insulating layer 25 may be formed on the substrate 3 having the transistor TR and the gate capping pattern 16 (S10).

The formation of the interlayer insulating layer 25 may include forming a lower interlayer insulating layer 21 and forming an upper interlayer insulating layer 24 on the lower interlayer insulating layer 21. The lower interlayer insulating layer 21 may be formed of silicon oxide. The upper interlayer insulating layer 24 may be formed of N-rich silicon nitride formed using a CVD process. For example, the upper interlayer insulating layer 24 may be formed of silicon nitride formed by a reaction of silicon of a silicon precursor with nitrogen of a nitrogen precursor.

Referring to FIGS. 6A, 7, and 8B, first conductive structures 43 and insulating mask patterns 45 may be sequentially stacked (S15). The first conductive structures 43 may be bit line structures in a memory device, such as a DRAM.

An example of a method of forming the first conductive structures 43 and the insulating mask patterns 45 will now be described.

An example of the method of forming the first conductive structures 43 and the insulating mask patterns 45 may include forming a lower interconnection layer on the interlayer insulating layer 25, forming interconnection contact patterns 36 to pass through the lower interconnection layer and the interlayer insulating layer 25 and contact the first contact regions 9a, forming a middle interconnection layer and an upper interconnection layer on the lower interconnection layer and the interconnection contact patterns 36, forming line-shaped insulating mask patterns 45 on the upper interconnection layer, and sequentially etching the upper interconnection layer, the middle interconnection layer, and the lower interconnection layer using the insulating mask patterns 45 as an etch mask. The upper interconnection layer may be etched to form the upper interconnection patterns 42, the middle interconnection layer may be etched to form the middle interconnection patterns 39, and the lower interconnection layer may be etched to form the lower interconnection patterns 27.

Referring to FIG. 6A, 7, 8C, a first preliminary spacer layer 51 may be conformally formed on the substrate 3 having the first conductive structures 43 and the insulating mask patterns 45.

The first preliminary spacer layer 51 may include a nitrided base layer and a nitrided silicon layer disposed on the nitrided base layer. The first preliminary spacer layer 51 may have a structure of any one of the spacers $51a\_1$, $51a\_2$, $51a\_3$, $51a\_4$, $51a\_5$, $51a\_6$, and $51a\_7$ described with reference to FIGS. 3A through 3G. The first preliminary spacer layer 51 may have an amorphous structure.

The formation of the first preliminary spacer layer 51 may include sequentially forming a base layer and a silicon layer using a deposition process, and forming a nitrided base layer and a nitrided silicon layer using a nitridation process. Each of the silicon layer and the nitrided silicon layer may have an amorphous structure.

The nitrided base layer may be formed by nitriding the base layer using the nitridation process, and the nitrided silicon layer may be formed by nitriding the silicon layer using the nitridation process. The nitrided base layer may be formed to a smaller thickness than the nitrided silicon layer. The nitrided base layer may be formed to have a higher density than the nitrided silicon layer. The base layer may be formed of a SiHC material, and the nitrided base layer may be formed of a SiHCN material.

Referring to FIGS. 6A, 7, and 8D, a sacrificial preliminary spacer layer 54 may be conformally formed on the first preliminary spacer layer 51. The sacrificial preliminary spacer layer 54 may be formed of silicon oxide. The sacrificial preliminary spacer layer 54 may be formed to a greater thickness than the first preliminary spacer layer 51.

Referring to FIGS. 6A, 7, and 8E, the sacrificial preliminary spacer layer 54 and the first preliminary spacer layer 51 may be anisotropically etched to form sacrificial spacers 54a and first spacers 51a. The first spacers 51a may be named "inner spacers." The sacrificial spacers 54a may be oxide spacers. The inner spacers 51a may be formed between the first conductive structures 43 and the sacrificial spacers 54a and extend between the sacrificial spacers 54a and the interlayer insulating layer 25.

Referring to FIGS. 6A, 7, and 8F, second spacers 57 may be formed (S25). The second spacers 57 may be named "outer spacers." The outer spacers 57 may be conformally formed on the substrate 3 having the sacrificial spacers 54a and the inner spacers 51a. The outer spacers 57 may be formed to a smaller thickness than the sacrificial spacers 54a.

The outer spacers 57 may include a nitrided base layer and a nitrided silicon layer disposed on the nitrided base layer. The outer spacers 57 may have a structure of any one of the spacers $57\_1$, $57\_2$, $57\_3$, $57\_4$, $57\_5$, $576$, and $57\_7$ described with reference to FIGS. 4A through 4G. The outer spacers 57 may have an amorphous structure.

The formation of the outer spacers 57 may include sequentially forming a base layer and an amorphous silicon layer using a deposition process, and forming a nitrided base layer and a nitrided silicon layer using a nitridation process. The nitrided base layer may be formed by nitriding the base layer using the nitridation process, and the nitrided silicon layer may be formed by nitriding the silicon layer using the nitridation process. The nitrided base layer may be formed to a smaller thickness than the nitrided silicon layer. The nitrided base layer may be formed to have a higher density than the nitrided silicon layer. The base layer may be formed of a SiHC material, and the nitrided base layer may be formed of a SiHCN material. The nitrided silicon layer may include a Si-rich silicon nitride.

Referring to FIGS. 6B, 9, and 10A, a mold layer 60 may be formed on the outer spacer 57 to fill spaces between the first conductive structures 43.

The formation of the mold layer 60 may include forming a mold material layer on the substrate 3 having the outer spacers 57 and planarizing the mold material layer until the outer spacers 57 disposed on top surfaces of the first conductive structures 43 are exposed. The mold layer 60 may have a line shape in a plan view. The mold layer 60 may be formed of a material having an etch selectivity with respect to the outer spacers 57. For example, the outer spacers 57 may be formed of silicon-based nitride, and the mold layer 60 may be formed of silicon oxide.

Referring to FIGS. 6B, 9, and 10B, the mold layer 60 may be patterned to form mold patterns 60a. The mold pattern 60a may be formed between the first conductive structures 43. During the formation of the mold patterns 60a, isolation holes 60h may be formed between the mold patterns 60a. The isolation holes 60h may be formed between the first conductive structures 43 and between the mold patterns 60a. The isolation holes 60h may expose the outer spacers 57 disposed between the first conductive structures 43 and between the mold patterns 60a.

Figure 10C:
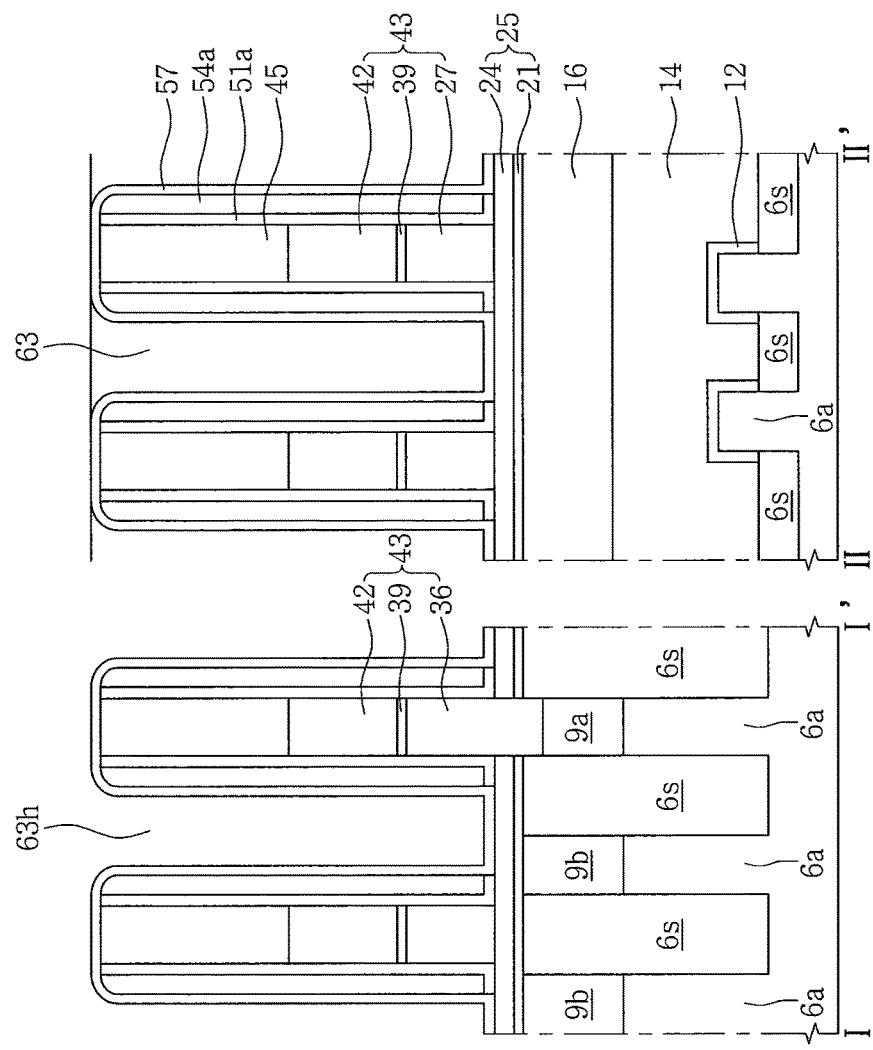

Referring to FIGS. 6B, 9, and 10C, insulating isolation patterns 63 may be formed between the first conductive structures 43 and spaced apart from one another, while forming contact holes 63h between the insulating isolation patterns 63 (S30). The contact holes 63h may be formed between the insulating isolation patterns 63 and between the first conductive structures 43.

The formation of the insulating isolation patterns 63 and the contact holes 63h may include forming the insulating isolation patterns 63 to fill the isolation holes (refer to 60h in FIG. 10B), and removing the mold patterns 60a) to form the contact holes 63h.

The insulating isolation patterns 63 may be formed of a material having an etch selectivity with respect to the mold patterns 60a. For example, the mold patterns 60a may be formed of silicon oxide, and the insulating isolation patterns 63 may be formed of silicon nitride.

The insulating isolation patterns 63 may be formed of N-rich silicon nitride. The insulating isolation patterns 63 may be formed using a CVD or ALD process.

The insulating isolation patterns 63 may be formed of a material having an etch selectivity with respect to the sacrificial spacers 54a. For example, the sacrificial spacers 54a may be formed of silicon oxide, the insulating isolation patterns 63 may be formed of silicon nitride.

Figure 10D:
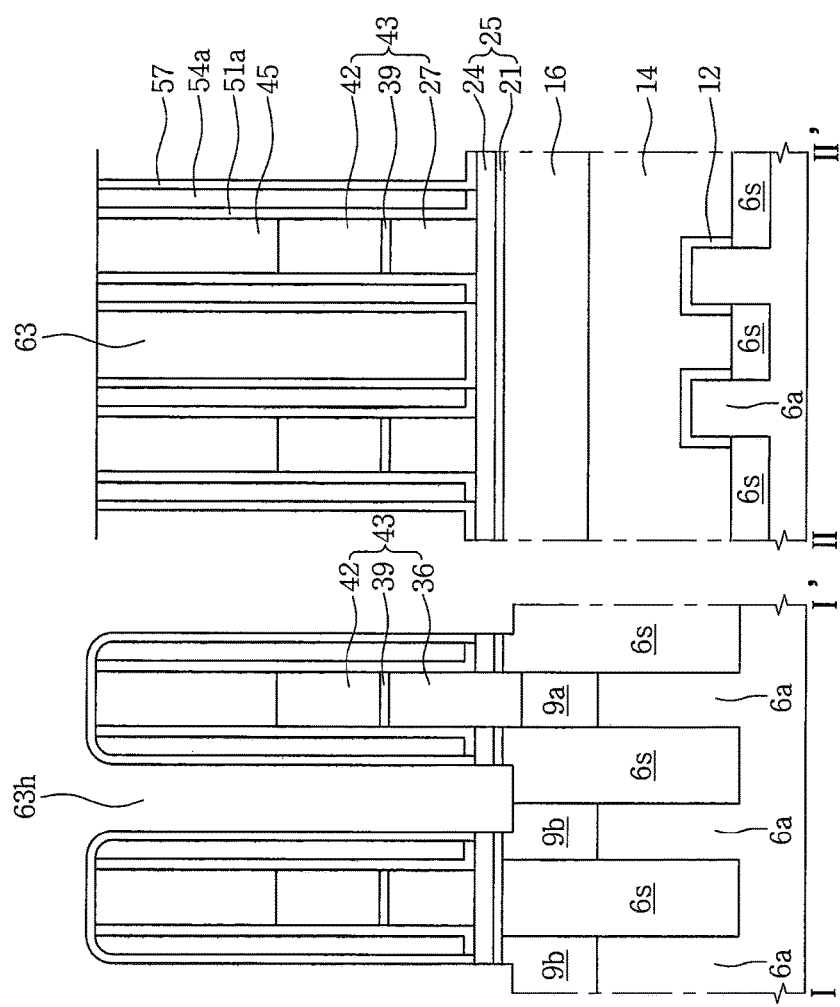

Referring to FIGS. 6B, 9, and 10D, the outer spacers 57 and the interlayer insulating layer 25, which are disposed under the contact holes 63h, may be sequentially etched to expose the second contact regions 9b. The second contact regions 9b may be the second source/drain regions 9b.

Figure 12A:
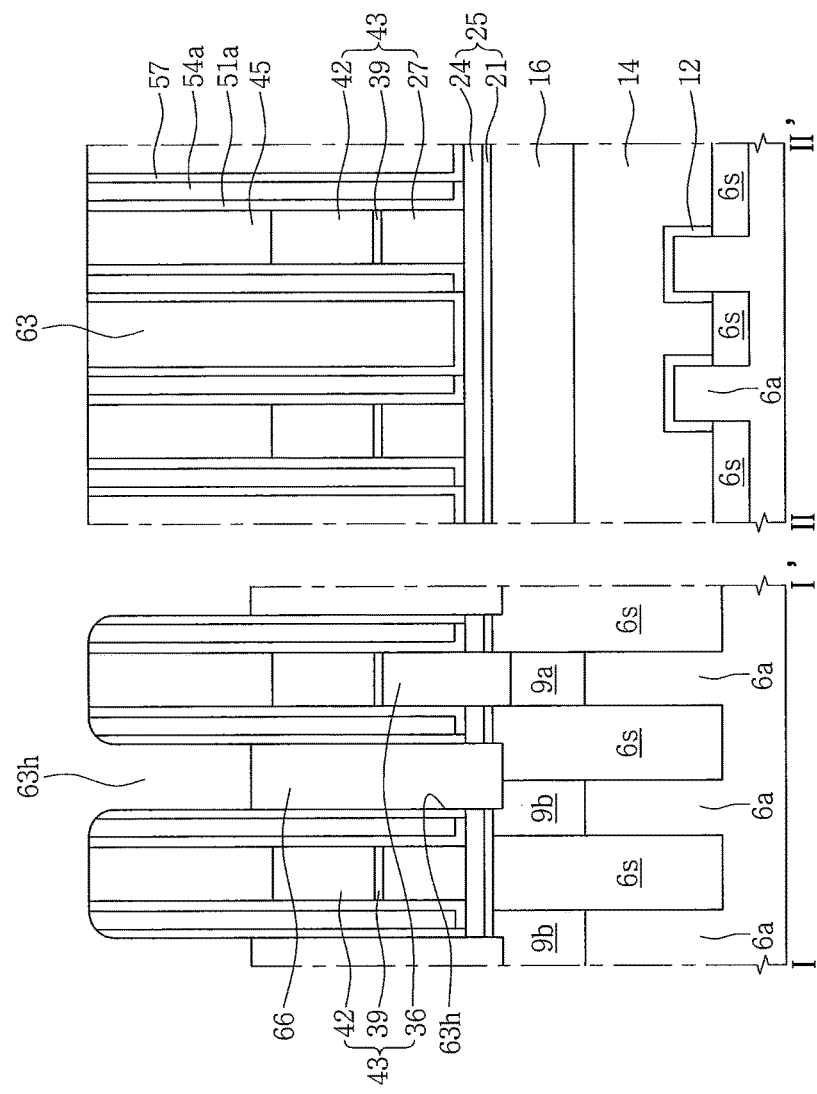

Referring to FIGS. 6B, 11, and 12A, lower contact patterns 66 may be formed to partially fill the contact holes 63h (S35).

Each of the lower contact patterns 66 may be formed between the first conductive structures 43 and between the insulating isolation patterns 63. The lower contact patterns 66 may be formed of polysilicon. The formation of the lower contact patterns 66 may include forming a lower conductive layer on the substrate 3 having the contact holes 63h and etching the lower conductive layer.

Figure 12B:
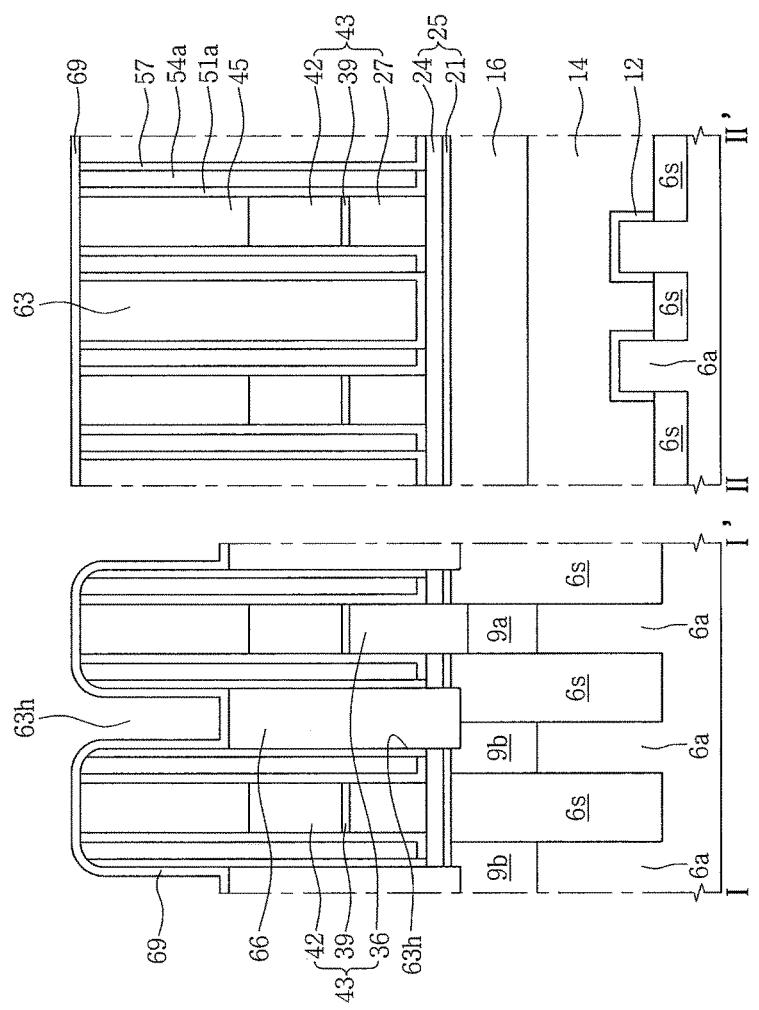

Referring to FIGS. 6B, 11, and 12B, an upper preliminary spacer layer 69 may be formed. The upper preliminary spacer layer 69 may be conformally formed on the substrate having the lower contact patterns 66.

The upper preliminary spacer layer 69 may include a nitrided base layer and a silicon-based nitride layer disposed on the nitrided base layer. The upper preliminary spacer layer 69 may have a structure of any one of the spacers 69a_1, 69a_2, and 69a_3 described with reference to FIGS. 5A through 5C.

The formation of the upper preliminary spacer layer 69 may include sequentially forming a base layer and a silicon layer using a deposition process, and forming a nitrided base layer and a nitrided silicon layer using a nitridation process.

The nitrided base layer may be formed by nitriding the base layer using the nitridation process, and the nitrided silicon layer may be formed by nitriding the silicon layer using the nitridation process. The nitrided base layer may be formed to a smaller thickness than the nitrided silicon layer. The nitrided base layer may be formed to have a higher density than the nitrided silicon layer. The base layer may be formed of a SiHC material, and the nitrided base layer may be formed of a SiHCN material.

Figure 12C:
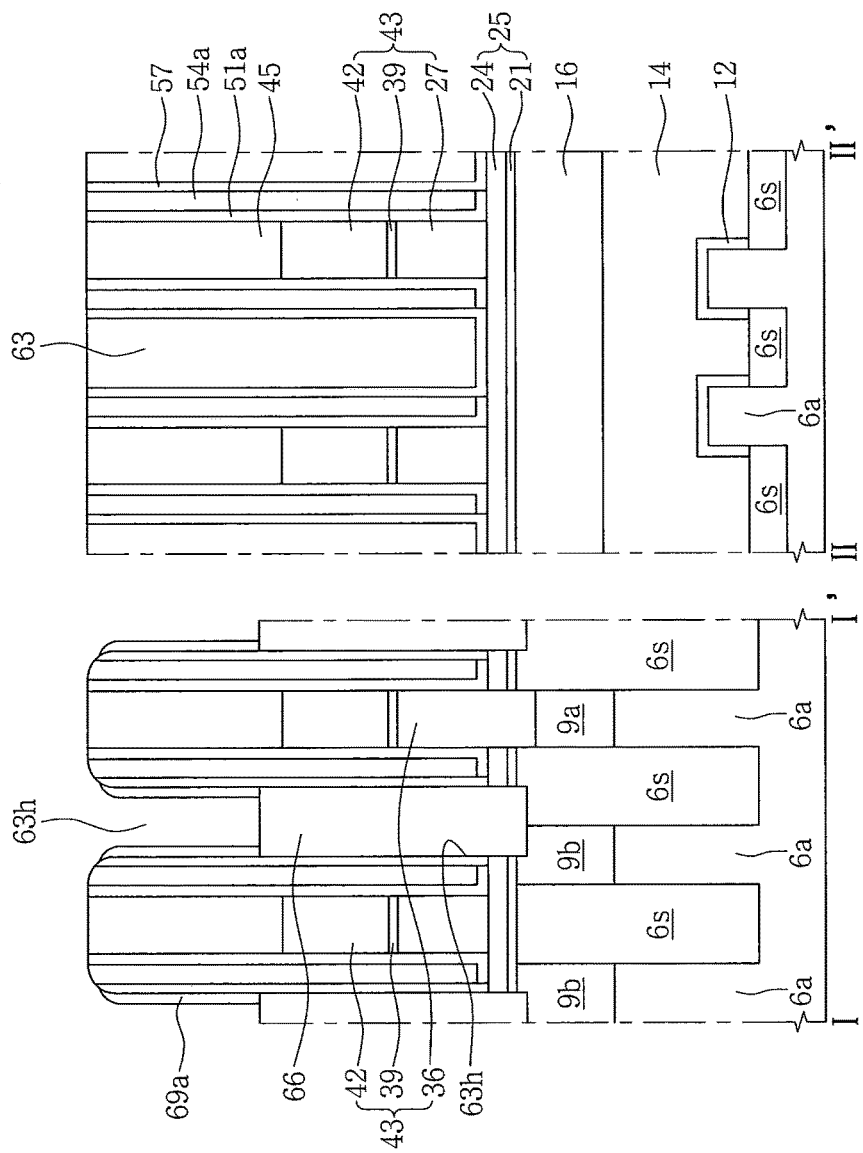

Referring to FIGS. 6B, 11, and 12C, the upper preliminary spacer layer 69 may be anisotropically etched to form upper spacers 69a on upper sidewalls of the contact holes 63h (S50). The upper spacers 69a may be formed on edges of the lower contact patterns 66.

Figure 12D:
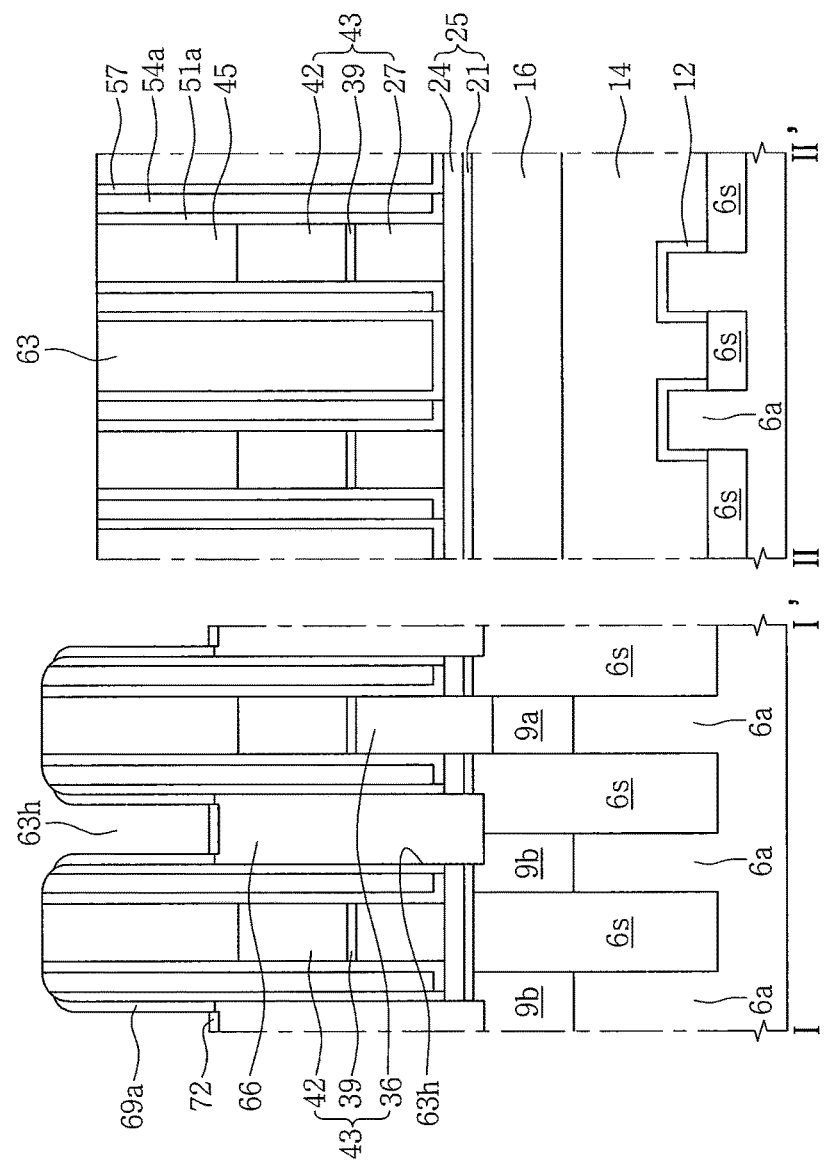

Referring to FIGS. 6B, 11, and 12D, after forming the upper spacers 69a, middle contact patterns 72 may be formed on the lower contact patterns 66 using a silicidation process (S45). The middle contact patterns 72 may be formed of a silicide, such as cobalt silicide, titanium silicide, or tantalum silicide.

Figure 12E:
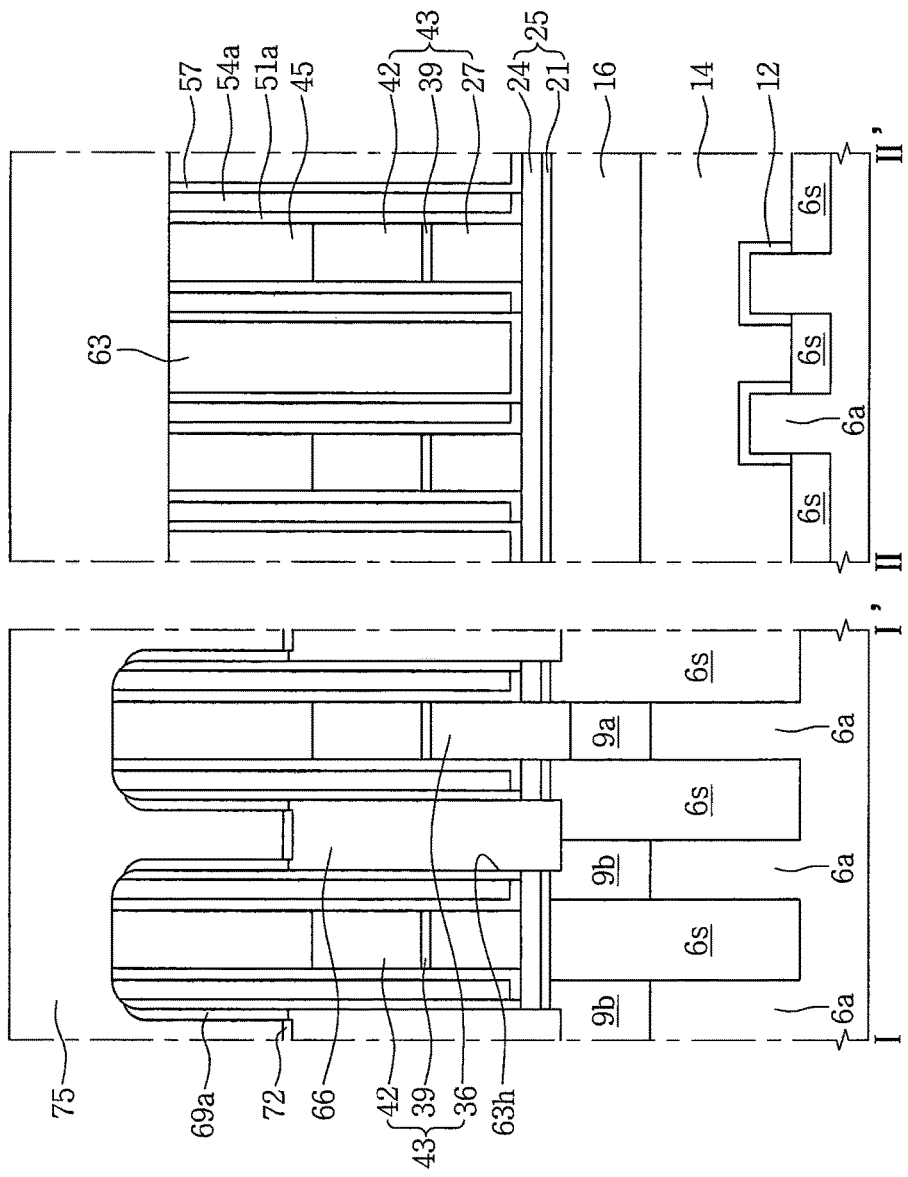

Referring to FIGS. 6B, 11, and 12E, an upper conductive layer 75 may be formed on the substrate having the middle contact patterns 72. A top surface of the upper conductive layer 75 may be formed at a higher level than top surfaces of the first conductive structures 43. The upper conductive layer 75 may be formed to fill the remaining portions of the contact holes 63h disposed on the lower contact patterns 66, and cover the top surfaces of the first conductive structures 43.

The upper conductive layer 75 may be formed of a material having a high etching resistance to a HF-containing silicon oxide wet etchant. For example, the formation of the upper conductive layer 75 may include forming a metal nitride layer (e.g., a titanium nitride layer or a tungsten nitride layer), and forming a metal layer (e.g., a tungsten layer) on the metal nitride layer.

Figure 12F:
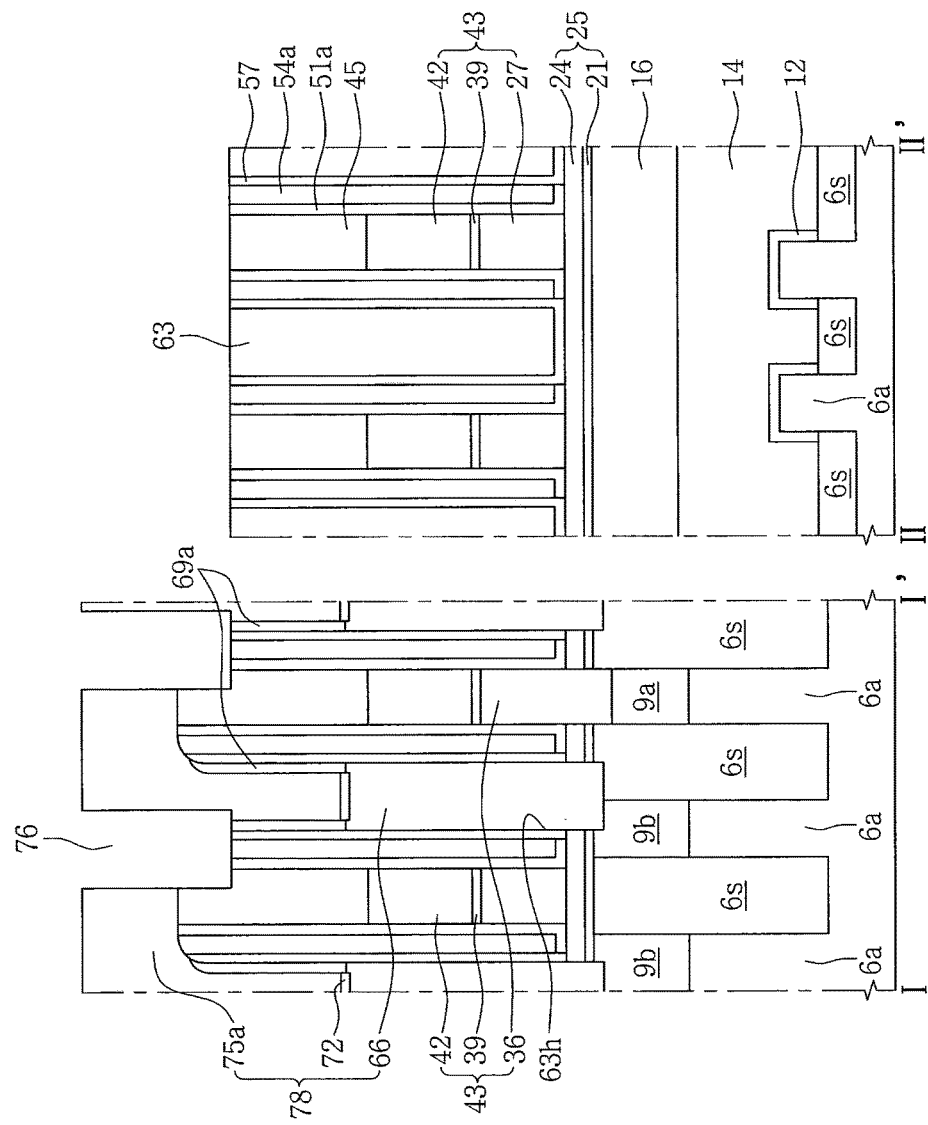

Referring to FIGS. 6B, 11, and 12F, the upper conductive layer 75 may be patterned to form upper contact patterns 75a on the middle contact patterns 72 and to expose an upper surface of the sacrificial spacers 54a (S50).

The lower contact patterns 66, the middle contact patterns 72, and the upper contact patterns 75a may provide second conductive structures 78. The second conductive structures 78 may be named "contact structures." The upper contact patterns 75a may be spaced apart from one another. During the formation of the upper contact patterns 75a, a recessed portion 76 may be formed between the upper contact patterns 75a.

The formation of the recessed portion 76 may include patterning the upper conductive layer 75 to form the upper contact patterns 75a, and sequentially etching the insulating mask patterns 45, the inner and outer spacers 51a and 57, and the sacrificial spacers 54a. A bottom surface of the recessed portion 76 may be formed at a higher level than the top surfaces of the first conductive structures 43.

Figure 12G:
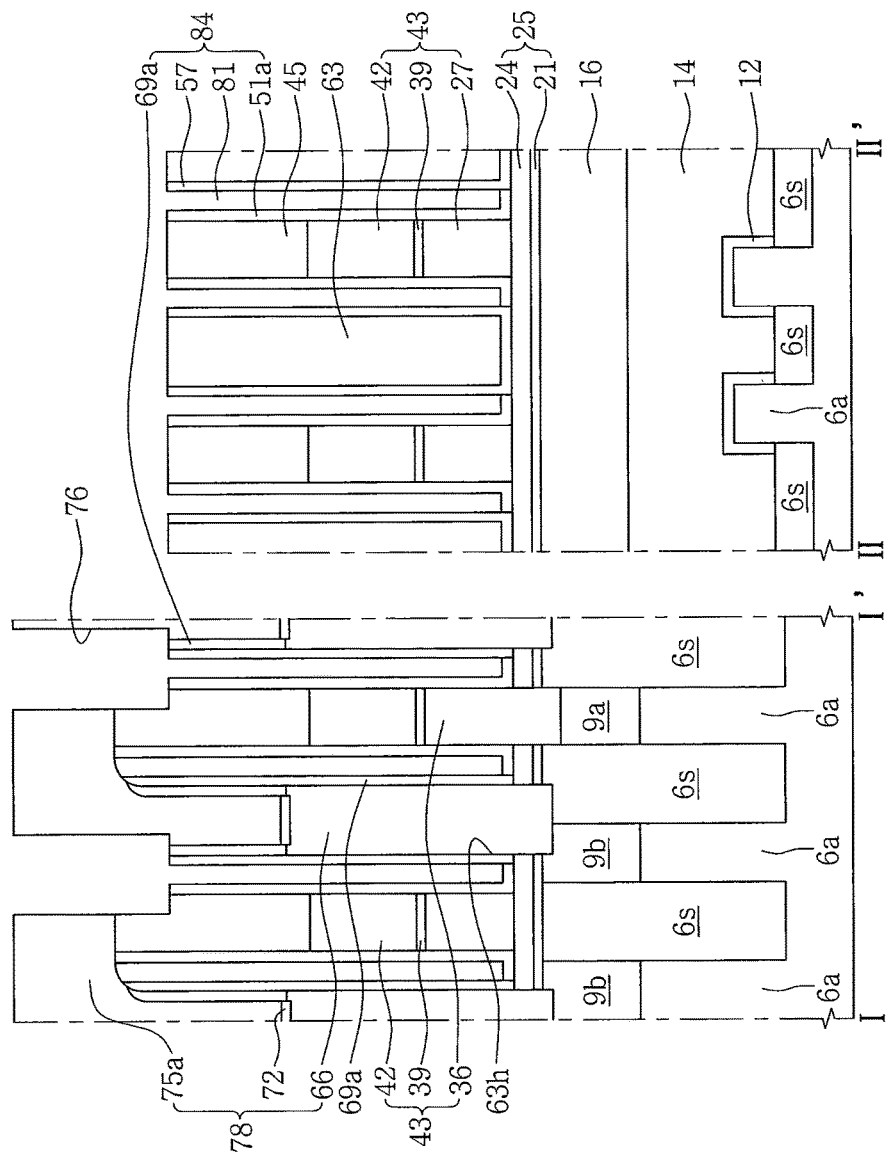

Referring to FIGS. 6B, 11, and 12G, the exposed sacrificial spacers 54a may be selectively removed using an oxide wet etching process to form third spacers 81. The third spacers 81 may be air spacers.

The etching of the third spacers 81 may include removing the exposed sacrificial spacers 54a by performing a wet etching process using a HF-containing wet etchant. The inner spacers 51a, outer spacers 57, and air spacers 81 and the upper spacers 69a may constitute spacer structures 84.

The inner spacer 51a and the outer spacer 57 according to an embodiment of the inventive concept may have a high etching tolerance to a HF-containing wet etchant. Accordingly, the inner spacer 51a and the outer spacer 57 may not be damaged due to the oxide wet etching process.

In addition, since the upper contact patterns 75a are formed of a material having a high etching resistance to a HF-containing silicon oxide wet etchant, the upper contact patterns 75a may not be damaged by the wet etchant. For instance, the upper contact patterns 75a may include a metal nitride layer (e.g., a titanium nitride layer or a tungsten nitride layer) and a metal layer (e.g., a tungsten layer) formed on the metal nitride layer.

Figure 12H:
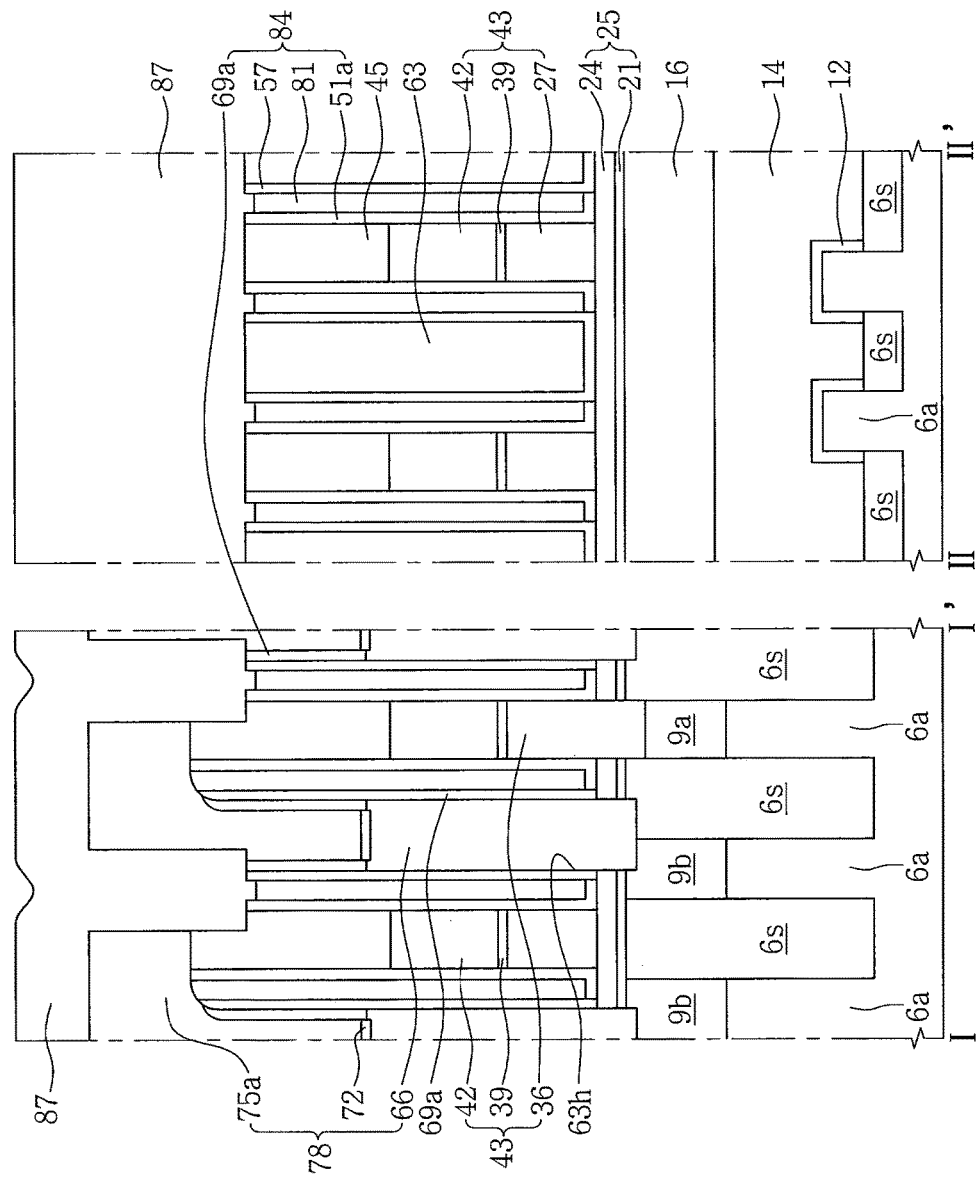

Referring to FIGS. 6B, 11, and 12H, an upper insulating capping layer 87 may be formed on the substrate having the spacer structures 84. The upper capping layer 87 may be formed of silicon nitride using a CVD process to fill the recessed portion 76 and thermally seal upper portions of the air spacers 81.

Referring to FIG. 6B and referring back to FIGS. 1A, 2A, and 2B, upper capping patterns 87a may be formed to hermetically seal the upper portions of the air spacers 81 (S60). The formation of the upper capping pattern 87a may include planarizing the upper capping layer (refer to 87 in FIG. 12H) until a top surface of the upper contact pattern 75a is exposed.

In an embodiment, the inner spacers 51a, the outer spacers 57, or the upper spacer 69a may include a nitrided base layer and a nitrided silicon layer. For example, the inner spacers 51a may be any one of the spacers 51a_1 and 51a_3 described with reference to FIGS. 3A and 3C. The outer spacers 57 may be any one of the spacers 57_1 and 57_3 described with reference to FIGS. 4A and 4C. The upper spacers 69a may be the spacers 69a_1 described with reference to FIG. 5A.

In an embodiment, the inner spacers 51a, the outer spacers 57, or the upper spacers 69a may include the nitrided base layer, the nitrided silicon layer, and nitrided barrier layer. For example, the inner spacers 51a may be any one of the spacers 51a_2 and 51a_4 described with reference to FIGS. 3B and 3D, the outer spacers 57 may be any one of the spacers 57_2 and 57_4 described with reference to FIGS. 4B and 4D, and the upper spacers 69a may be the spacers 69a_2 described with reference to FIG. 5B.

In an embodiment, the inner spacers 51a, the outer spacers 57, or the upper spacers 69a may include the nitrided base layer, the nitrided silicon layer, and an N-rich silicon nitride layer. For example, the inner spacers 51a may be any one of the spacers 51a_5 and 51a_6 described with reference to FIGS. 3E and 3F, the outer spacers 57 may be any one of the spacers 57_5 and 57_6 described with reference to FIGS. 4E and 4F, and the upper spacers 69a may be the spacers 69a_3 described with reference to FIG. 5C.

In an embodiment, the inner spacers 51a or the outer spacers 57 may include the nitrided base layer, the nitrided silicon layer, the nitrided barrier layer, and the N-rich silicon nitride layer. For example, the inner spacers 51a may be the spacers 51a_7 described with reference to FIG. 3G, and the outer spacers 57 may be the spacers 57_7 described with reference to FIG. 4G.

A method of forming the first preliminary spacer layer (refer to 51 in FIG. 8C) to form the inner spacers 51a, a method of forming the outer spacers (refer to 57 in FIG. 8F), or a method of forming the preliminary upper spacer layer (refer to 69 in FIG. 12B) to form the upper spacers 69a will now be described with reference to FIG. 13.

Figure 13:
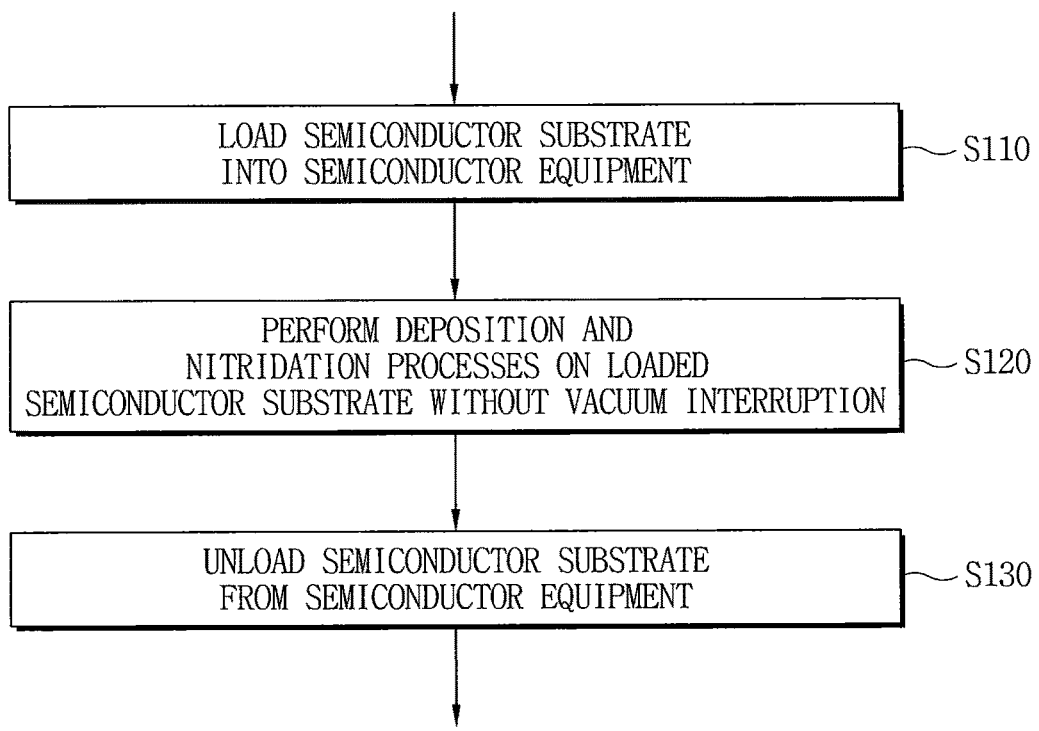
FIG. 13 is a flowchart of a method of forming a semiconductor device according to an embodiment of the inventive concept.

FIG. 13 is a flowchart illustrating the method of forming the first preliminary spacer layer (refer to 51 in FIG. 8C) to form the inner spacers 51a, the method of forming the outer spacers (refer to 57 in FIG. 8F), or the method of forming the preliminary upper spacer layer (refer to 69 in FIG. 12B) to form the upper spacers 69a.

Referring to FIG. 13, a semiconductor substrate may be loaded into semiconductor equipment (S110).

In an embodiment, when the inner spacers 51a are formed, the semiconductor substrate, which is loaded into the semiconductor equipment, may be a semiconductor substrate having the first conductive structures 43 and the insulating mask patterns 45 that are formed by performing the processes described with reference to FIGS. 7, 8A, and 8B.

In an embodiment, when the outer spacers 57 are formed, the semiconductor substrate, which is loaded into the semiconductor equipment, may be a substrate having the sacrificial spacers 54a and the inner spacers 51a that are formed by performing the processes described with reference to FIGS. 7 and 8A through 8E.

In an embodiment, when the upper spacers 69a are formed, the semiconductor substrate, which is loaded into the semiconductor equipment, may be a substrate having the lower contact patterns 66 formed by performing the processes described with reference to FIGS. 7 through 12B.

Deposition and nitridation processes may be performed on the loaded semiconductor substrate without vacuum interruption (S120). The deposition and nitridation processes may be processes of forming the first preliminary spacer layer (refer to 51 in FIG. 8C), the outer spacers (refer to 57 in FIG. 8F) or the preliminary upper spacer layer (refer 69 in FIG. 12B).

The semiconductor substrate may be unloaded from the semiconductor equipment (S130).

Hereinafter, the deposition and nitridation processes (S120) of forming the first preliminary spacer layer (refer to 51 in FIG. 8C), the outer spacers (refer to 57 in FIG. 8F) or the preliminary upper spacer layer (refer to 69 in FIG. 12B) will be described.

Figure 14:
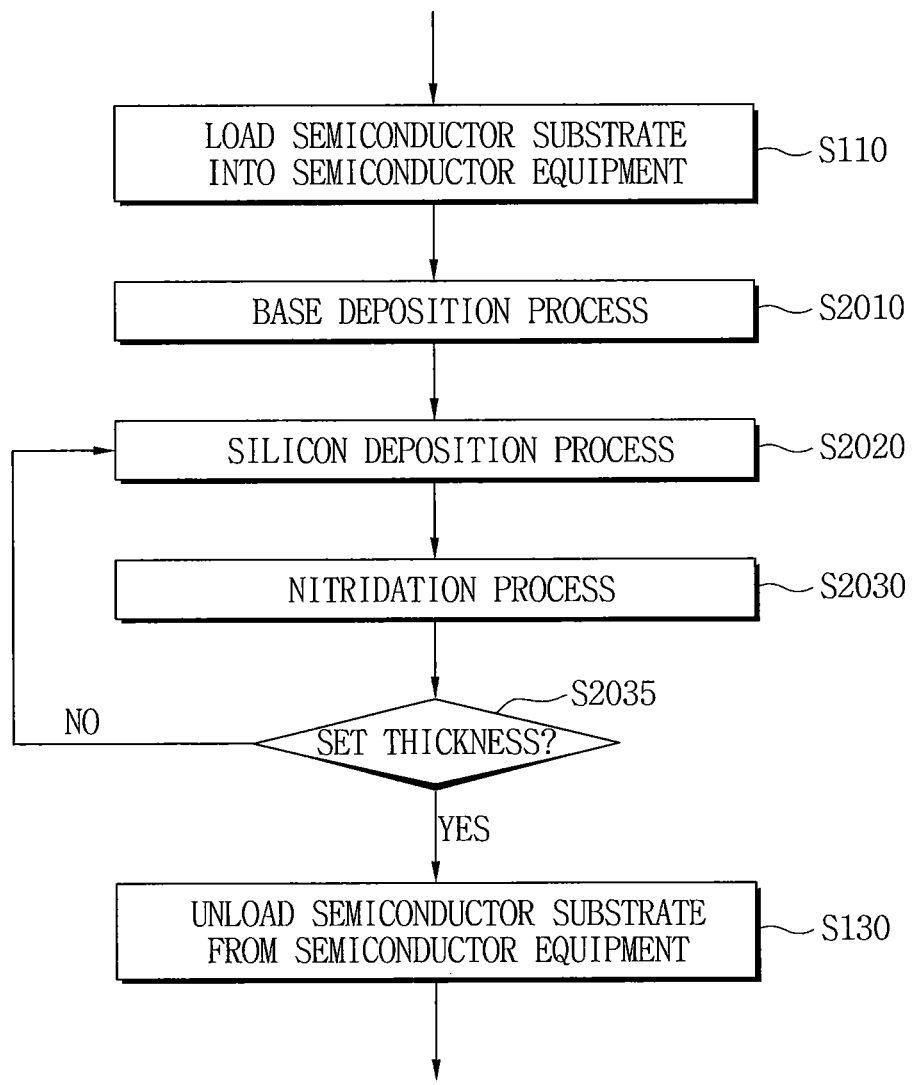
FIG. 14 is a flowchart of a method of forming a semiconductor device according to an embodiment of the inventive concept.

Initially, an example of a method of forming the first preliminary spacer layer (refer to 51 in FIG. 8C), the outer spacers (refer to 57 in FIG. 8F) or the preliminary upper spacer layer (refer to 69 in FIG. 12B) will be described with reference to FIG. 14. FIG. 14 is a flowchart of a method of performing deposition and nitridation processes on the loaded semiconductor substrate without vacuum interruption.

Referring to FIG. 14, a semiconductor substrate may be loaded into semiconductor equipment (S110). A base deposition process (S2010) may be performed on the loaded semiconductor substrate to form a base layer. After performing the base deposition process (S2010), a silicon deposition process (S2020) may be performed without vacuum interruption so that a silicon layer can be formed on the base layer to a greater thickness than the base layer. After performing the silicon deposition process (S2020), a nitridation process (S2030) may be performed without vacuum interruption.

The silicon layer and the base layer may be nitrided using the nitridation process (S2030) to form a nitrided silicon layer and a nitrided base layer, respectively.

When layers formed using the base deposition process (S2010) and the silicon deposition process (S2020) do not reach set thicknesses (S2035), a nitrided silicon layer may be repetitively formed by repetitively performing the silicon deposition process (S2020) and the nitridation process (S2030) until the layers reach the set thicknesses. The nitridation process (S2030) may be a plasma nitridation or thermal nitridation process. Thereafter, the semiconductor substrate may be unloaded from the semiconductor equipment (S130). In an embodiment, the base deposition process (S2010) may be a deposition process using a carbon-containing base source material. The base source material may be an organic material. The base source material may contain diisoprophyl aminosilane (DIPAS) or tris(dimethylamino)silane (TDMAS).

In an embodiment, the silicon deposition process (S2020) may be a deposition process using a different silicon source material from the base deposition process (S2010). The silicon deposition process (S2020) may be a deposition process using a carbon-free silicon source material. The silicon source material may contain dichlorosilane (DCS), disilane (DS), or monosilane (MS).

In an embodiment, the base deposition process (S2010) may be performed using a carbon-containing base source material expressed by Formula 1, and the silicon deposition process (S2020) may be performed using a carbon-free silane-based silicon source material expressed by Formula 2.

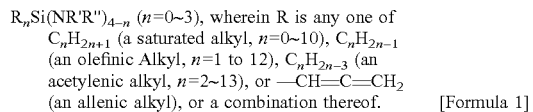

[Formula 1]

[Formula 2]

In an embodiment, the silicon deposition process (S2020) may be performed at a higher temperature than the base deposition process (S2010). For instance, the base deposition process (S2010) may be performed at a temperature in a range of about 350° C. to about 450° C. using DIPAS as a base source material, and the silicon deposition process (S2020) may be performed at a temperature in a range higher than the base deposition process (S2010) and lower than a temperature of about 700° C.

In an embodiment, the nitridation process (S2030) may be a nitridation process using a nitrogen source material expressed by Formula 3.

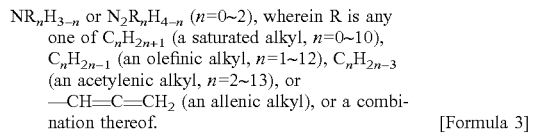

[Formula 3]

In an embodiment, the nitridation process S2030 may be a remote plasma process.

In an embodiment, the nitridation process S2030 may be performed using a nitrogen source material, such as NH3, under a process pressure in a range of about 5 Torr to about 10 Torr at a temperature in a range of about 580° C. to about 680° C.

As used herein, a "base deposition process" may be substantially the same process as the base deposition process (S2010) described with reference to FIG. 14, a "silicon deposition process" may be substantially the same process as the silicon deposition process (S2020) described with reference to FIG. 14, and a "nitridation process" may be substantially the same process as the nitridation process (S2030) described with reference to FIG. 14. For example, a "base deposition process" described with reference to drawings other than FIG. 14 may be performed using the base source material of the base deposition process (S2010) described with reference to FIG. 14. Similarly, a "silicon deposition process" and a "nitridation process" described in reference to drawings other than FIG. 14 may be performed using the silicon source material of the silicon deposition process (S2020) described with reference to FIG. 14 and the nitrogen source material of the nitridation process (S2030) described with reference to FIG. 14. Accordingly, even if a "base deposition process," a "silicon deposition process," and a "nitridation process" are not described in detail below, they may be inferred from the "base deposition process (S2010)", the "silicon deposition process (S2020)", and the "nitridation process (S2030)" described, for example, with reference to FIG. 14.

An example of a method of forming the outer spacers (refer to 57 in FIG. 8F) will be described with reference to FIGS. 15A through 15C along with FIG. 14.

Figure 15A:
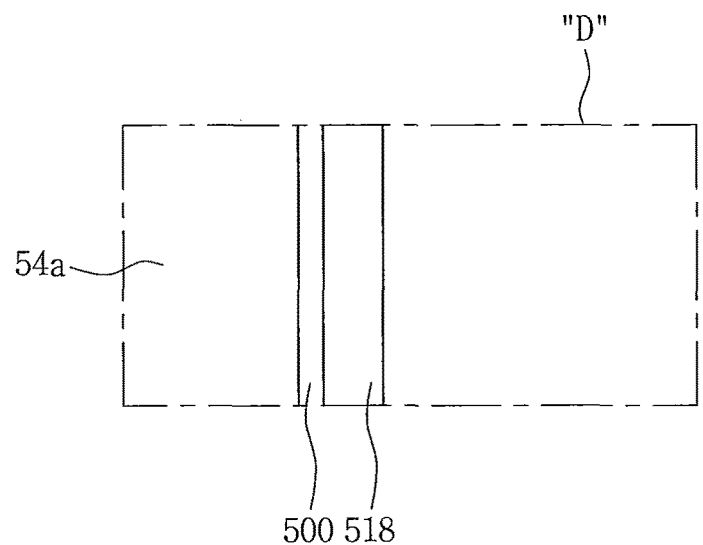
FIGS. 15A to 15C are cross-sectional views illustrating a method of forming a semiconductor device according to an embodiment of the inventive concept.
Figure 15B:
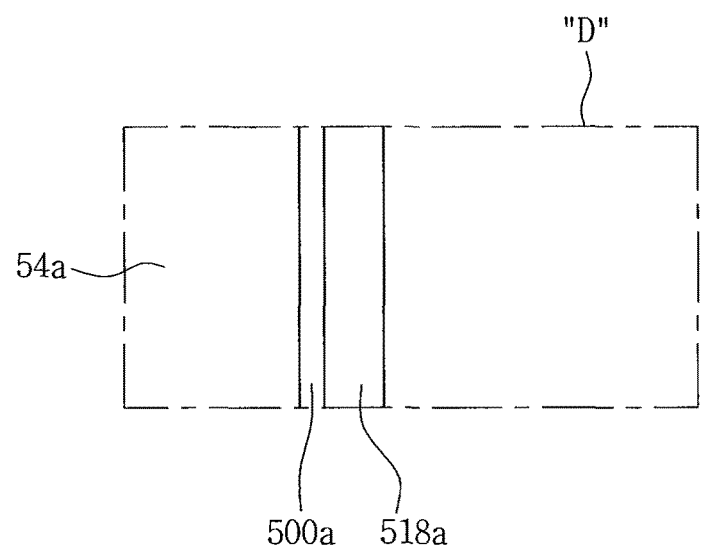
Figure 15C:
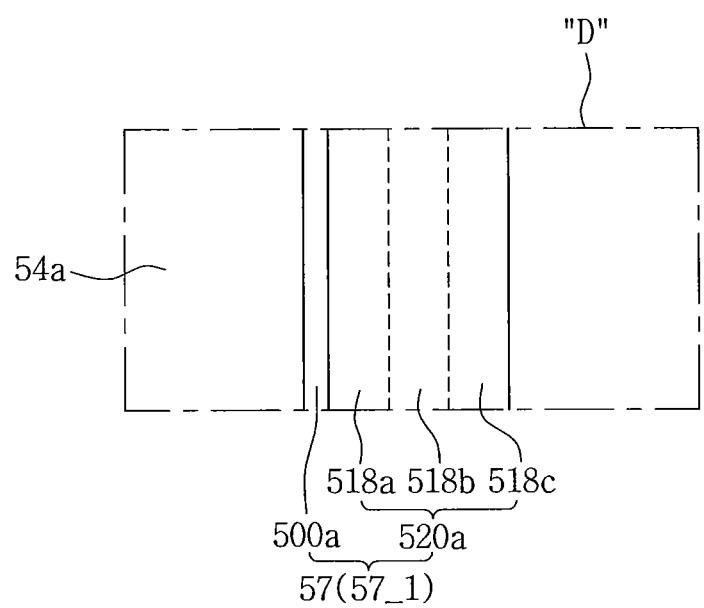

Referring to FIGS. 14 and 15A, a semiconductor substrate having the sacrificial spacers 54a may be loaded into semiconductor equipment (S110). A base deposition process (S2010) may be performed on the loaded semiconductor substrate to form a base layer 500.

The base layer 500 may be formed of a material containing silicon (Si), hydrogen (H), and carbon (C). The base layer 500 may be formed of a SiHC material. After the base deposition process (S2010) is performed, a silicon deposition process (S2020) may be performed without vacuum interruption, a first silicon layer 518 having a greater thickness than the base layer 500 may be formed on the base layer 500. The base layer 500 and the first silicon layer 518 may have an amorphous structure. Referring to FIGS. 14 and 15B, a nitridation process (S2030) may be performed to form a nitrided base layer 500a and a first nitrided silicon layer 518a. The nitrided base layer 500a may be formed by nitriding the base layer 500 using the nitridation process (S2030). The first nitrided silicon layer 518a may be formed by nitriding the first silicon layer 518 using the nitridation process (S2030). The nitridation process (S2030) may be a plasma nitridation process or a thermal nitridation process. Referring to FIGS. 14 and 15C, when the nitrided base layer 500a and the first nitrided silicon layer 518a do not reach a set thickness (S2035), second and third nitrided silicon layers 518b and 518c may be formed by repetitively performing the silicon deposition process (S2020) and the nitridation process (S2030). For example, the silicon deposition process (S2020) may be performed on the first nitrided silicon layer 518a to form a second silicon layer, and the second silicon layer may be nitrided using the nitridation process (S2030) to form the second nitrided silicon layer 518b. Also, the silicon deposition process (S2020) may be performed to form a third silicon layer on the second nitrided silicon layer 518b, and the third silicon layer may be nitrided using the nitridation process (S2030) to form the third nitrided silicon layer 518c. Thus, a nitrided silicon layer 520a including the first to third nitrided silicon layers 518a, 518b, and 518c may be formed. Accordingly, spacers 57-1 including the nitrided base layer 500a and the nitrided silicon layer 520a disposed on the nitrided base layer 500a may be formed. It will be understood that the process described in S2020 to S2035 can be repeated until a target thickness for the nitrided base layer and nitrided silicon layer has been reached.

The semiconductor substrate having the spacers 57_1 may be unloaded from the semiconductor equipment (S130).

Figure 16:
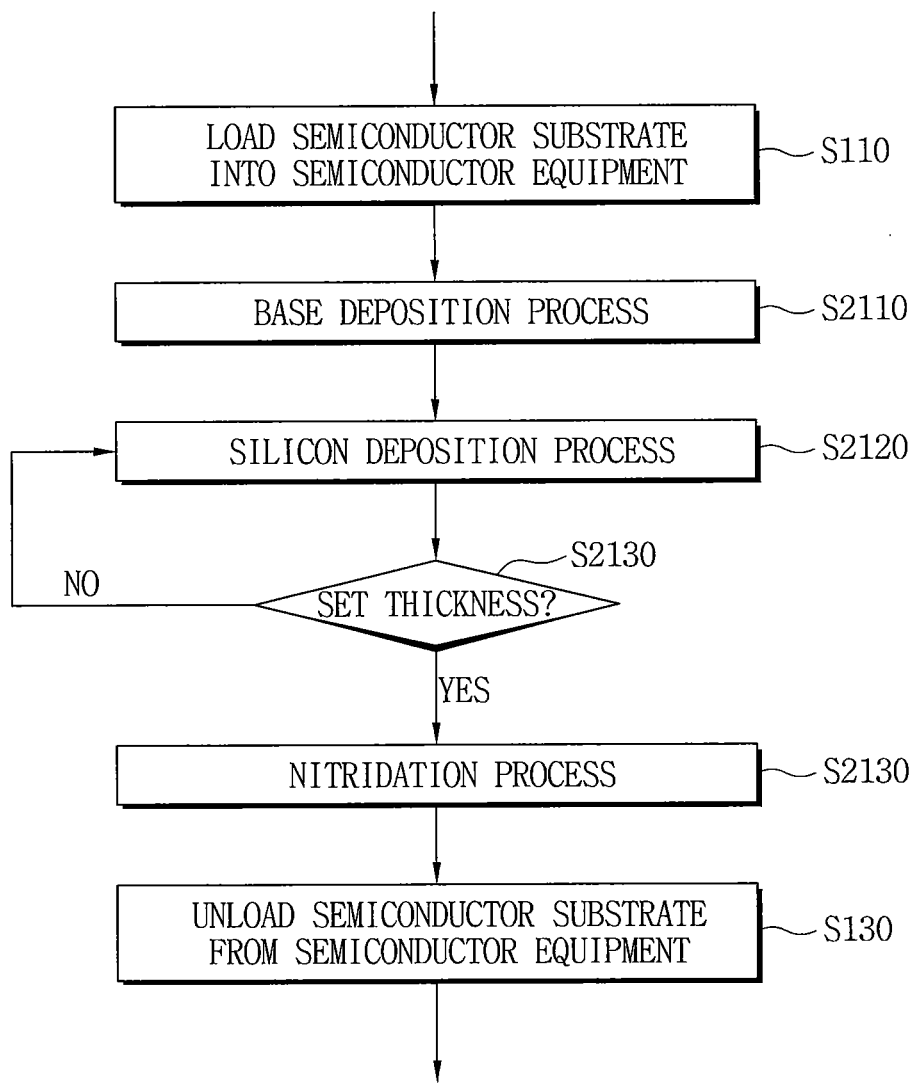
FIG. 16 is a flowchart of a method of forming a semiconductor device according to an embodiment of the inventive concept.

An example of a method of forming the first preliminary spacer layer 51 to form the inner spacer 51a, an example of a method of forming the outer spacers 57, or an example of a method of forming the upper preliminary spacer layer 69 to form the upper spacer 69a will be described with reference to FIG. 16. FIG. 16 is a flowchart of a method of performing deposition and nitridation processes on the loaded semiconductor substrate without vacuum interruption.

Referring to FIG. 16, a semiconductor substrate may be loaded into semiconductor equipment (S110). A base deposition process (S2110) and a silicon deposition process (S2120) may be sequentially performed on the loaded semiconductor substrate. When layers formed using the base deposition process (S2110) and the silicon deposition process (S2120) do not reach a set thickness (S2130), the silicon deposition process (S2120) may be repetitively performed until the set thickness is achieved. Thereafter, a nitridation process (S2130) may be performed to nitride the layers deposited using the base deposition process (S2110) and the silicon deposition process (S2120). Afterwards, the semiconductor substrate may be unloaded from the semiconductor equipment (S130).

Figure 17A:
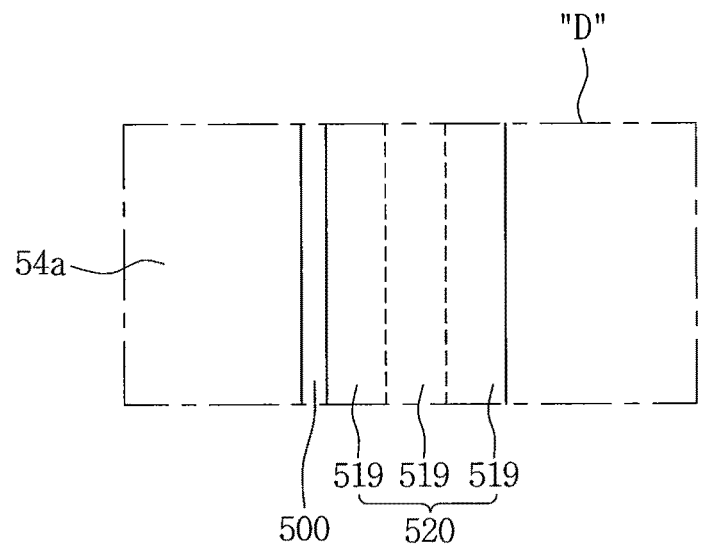
FIGS. 17A and 17B are cross-sectional views illustrating a method of forming a semiconductor device according to an embodiment of the inventive concept.
Figure 17B:
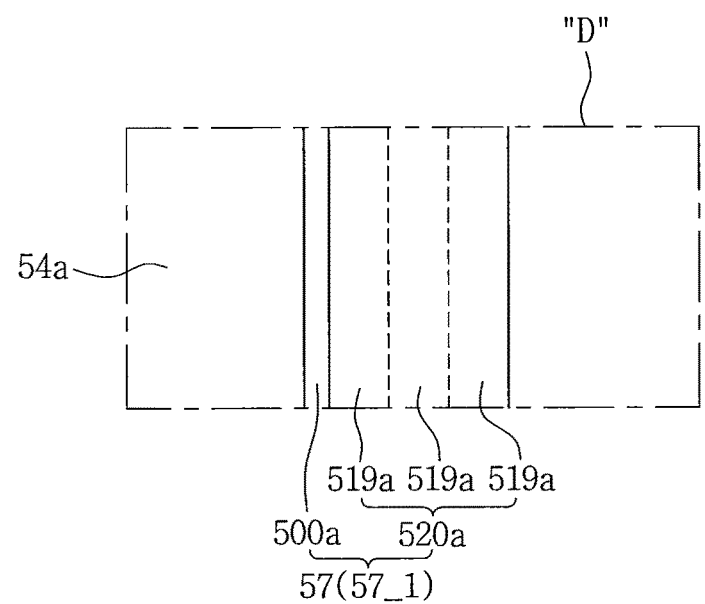

An example of a method of forming the outer spacers (refer to 57 in FIG. 8F) will be described with reference to FIGS. 17A and 17B along with FIG. 16. FIGS. 17A and 17B are enlarged views of portion D of FIG. 8F.

Referring to FIGS. 16 and 17A, a semiconductor substrate having the sacrificial spacers 54a may be loaded into semiconductor equipment (S110). The base deposition process (S2110) may be performed, thereby forming a base layer 500 on the semiconductor substrate having the sacrificial spacers 54a. The silicon deposition process (S2120) may be performed to form a silicon layer 520 on the base layer 500. When the preliminary base layer 500 and the silicon layer 520 do not reach a set thickness (S2130), a silicon deposition process may be repetitively performed until the base layer 500 and the silicon layer 520 reach the set thickness. Accordingly, a silicon layer 520 including a plurality of layers may be formed on the base layer 500.

Referring to FIGS. 16 and 17B, the nitridation process (S2130) may be performed to form a nitrided silicon layer 520a and a nitrided base layer 500a. The nitrided silicon layer 520a may be formed by nitriding the silicon layer 520. Accordingly, spacers 57_1 including the nitrided base layer 500a and the nitrided silicon layer 520a formed on the nitrided base layer 500a may be formed. The semiconductor substrate having the spacers 57_1 may be unloaded from the semiconductor equipment (S130).

An example of a method of forming the first preliminary spacer layer 51 to form the inner spacer 51a, an example of a method of forming the outer spacers 57, or an example of a method of forming the upper preliminary spacer layer 69 to form the upper spacer 69a will be described with reference to FIG. 18.

Figure 18:
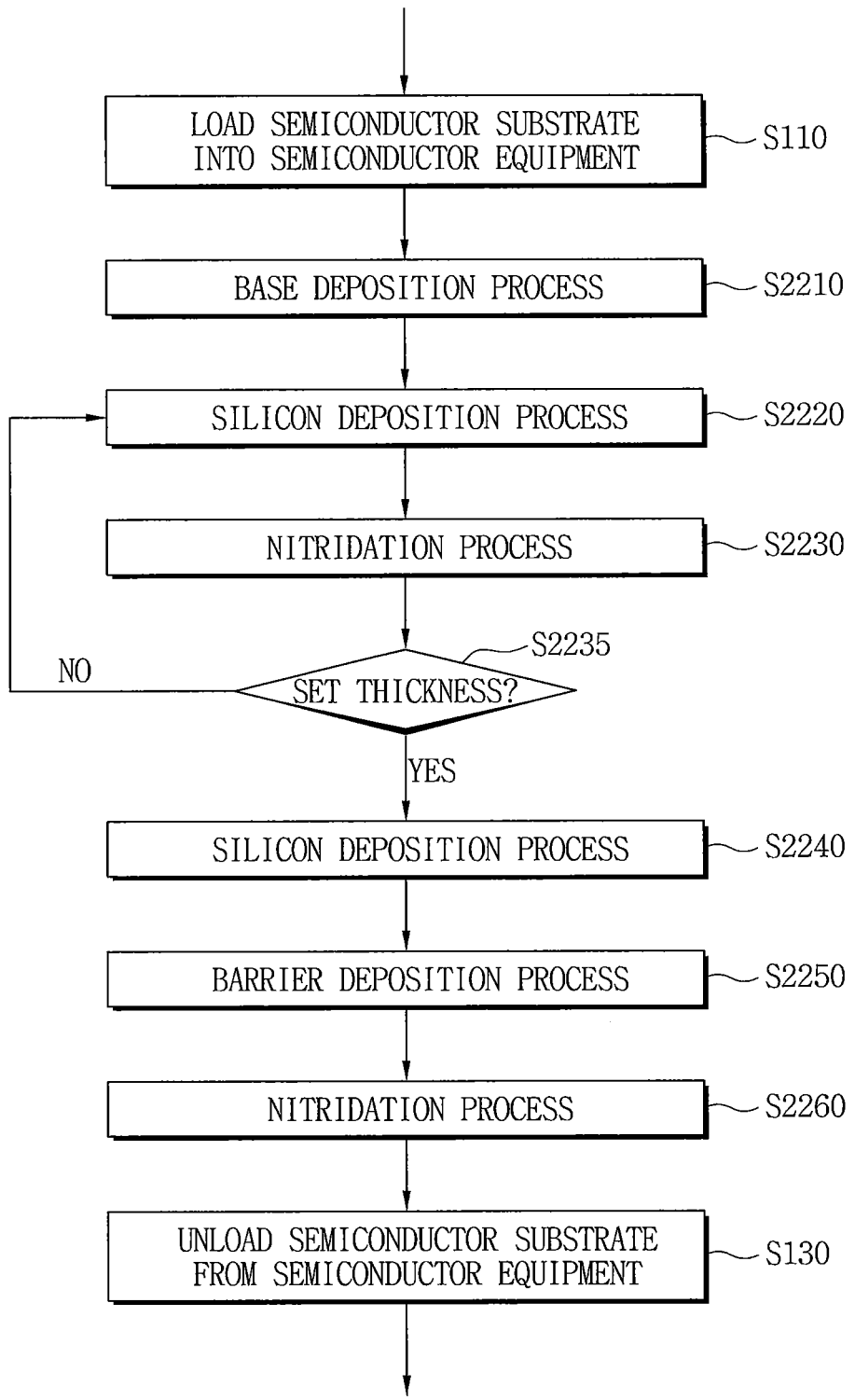
FIG. 18 is a flowchart of a method of forming a semiconductor device according to an embodiment of the inventive concept.

Referring to FIG. 18, a semiconductor substrate may be loaded into semiconductor equipment (S110). A base deposition process (S2210), a silicon deposition process (S2220), and a nitridation process (S2230) may be sequentially performed on the loaded semiconductor substrate.

When layers formed using the base deposition process (S2210), the silicon deposition process (S2220), and the nitridation process (S2230) do not reach a set thickness (S2235), the silicon deposition process (S2220) and the nitridation process (S2230) may be repetitively performed until the layers reach the set thickness.

Thereafter, a silicon deposition process (S2240), a barrier deposition process (S2250), and a nitridation process (S2250) may be sequentially performed without vacuum interruption. The nitridation process (S2250) may include nitriding layers deposited using the silicon deposition process (S2240) and the barrier deposition process (S2250). Thereafter, the semiconductor substrate may be unloaded from the semiconductor equipment (S130).

Figure 19A:
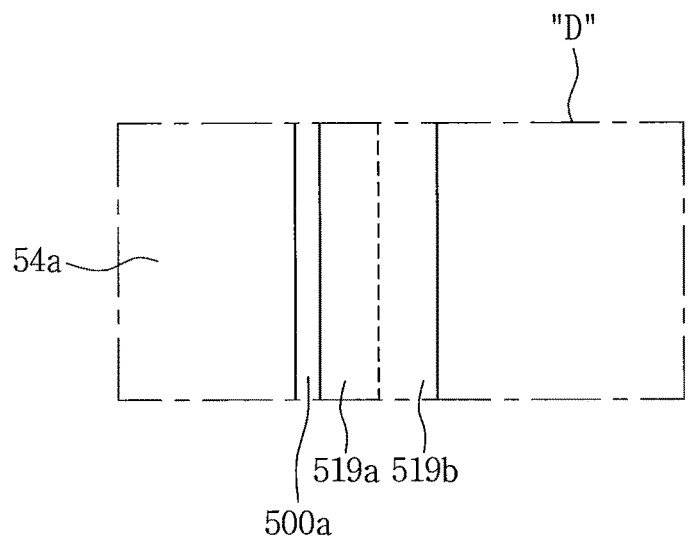
FIGS. 19A and 19B are cross-sectional views illustrating a method of forming a semiconductor device according to an embodiment of the inventive concept.
Figure 19B:
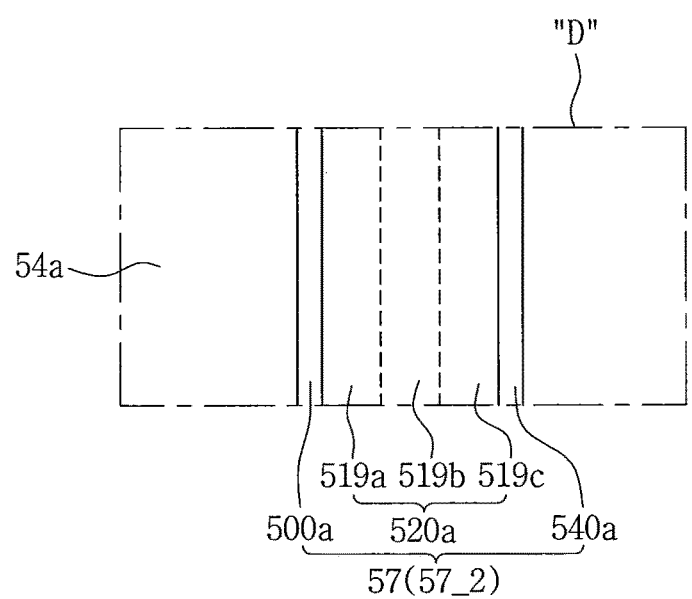

An example of a method of the outer spacers (refer to 57 in FIG. 8F) will be described with reference to FIGS. 19A and 19B along with FIG. 18. FIGS. 19A and 19B are enlarged views of portion D of FIG. 8F.

Referring to FIGS. 18 and 19A, a semiconductor substrate having the sacrificial spacers 54a may be loaded into semiconductor equipment (S110). The base deposition process (S2210), the silicon deposition process (S2220), and the nitridation process (S2230) may be sequentially performed on the loaded semiconductor substrate, thereby forming a nitrided base layer 500a and a nitrided silicon layer 519a. Thereafter, the silicon deposition process (S2220) and the nitridation process (S2230) may be repetitively performed (S2235) to form a nitrided silicon layer 519b to a set thickness. Accordingly, the nitrided base layer 500a and the nitrided silicon layer 519a and 519b may be formed on the semiconductor substrate having the sacrificial spacers 54a.

Referring to FIGS. 18 and 19B, a silicon deposition process (S2240), a barrier deposition process (S2250), and a nitridation process (S2260) may be sequentially performed on the semiconductor substrate having the nitrided base layer 500a and the nitrided silicon layers 519a and 519b, thereby forming a nitrided silicon layer 519c and a nitrided barrier layer 540a. A nitrided silicon layer 520a may include a plurality of layers 519a, 519b, and 519c. Accordingly, spacers 57_2 including the nitrided base layer 500a, the nitrided silicon layer 520a, and the nitrided barrier layer 540a may be formed.

The semiconductor substrate having the spacers 57_2 may be unloaded from the semiconductor equipment (S130).

An example of a method of forming the first preliminary spacer layer 51 to form the inner spacer 51a, an example of a method of forming the outer spacers 57, or an example of a method of forming the upper preliminary spacer layer 69 to form the upper spacer 69a will be described with reference to FIG. 20.

Figure 20:
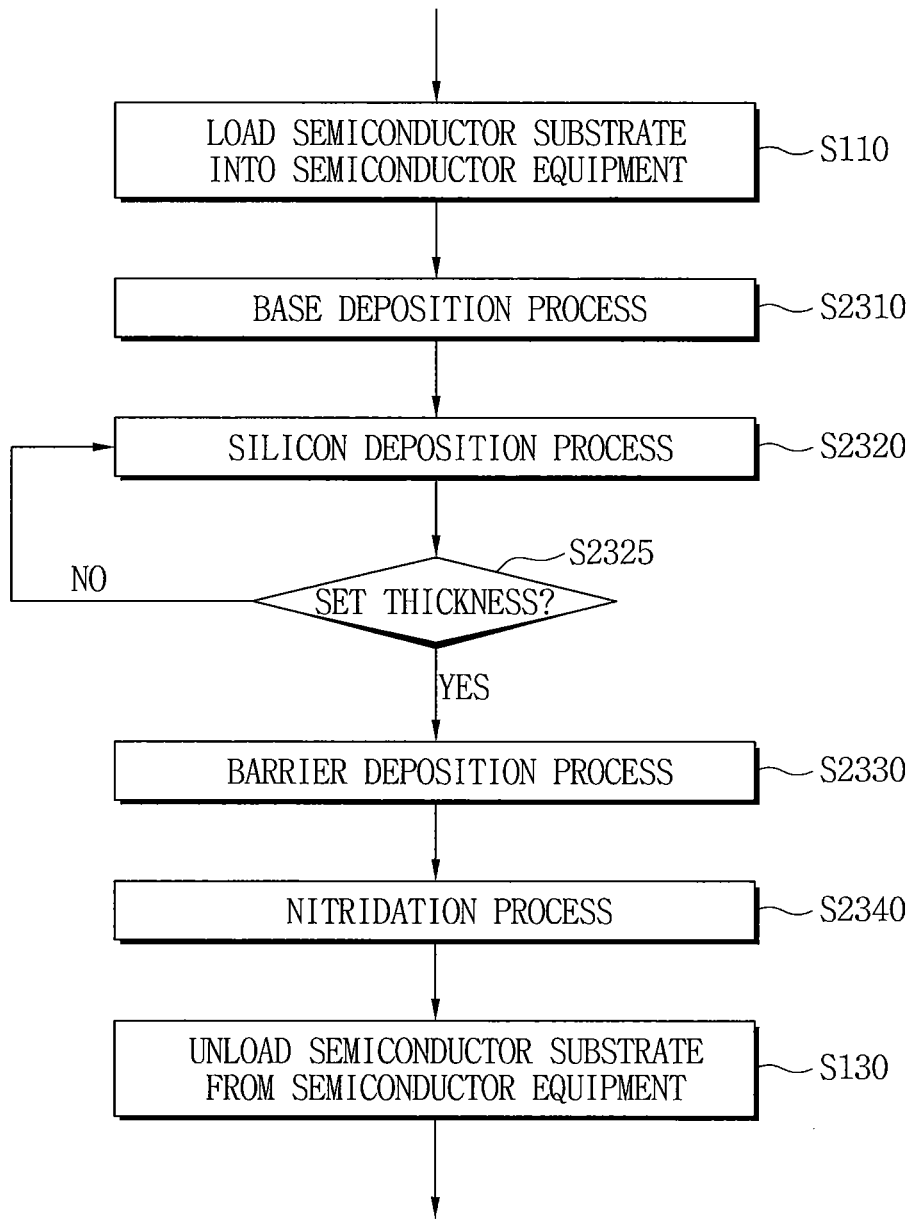
FIG. 20 is a flowchart of a method of forming a semiconductor device according to an embodiment of the inventive concept.

Referring to FIG. 20, a semiconductor substrate may be loaded into semiconductor equipment (S110). A base deposition process (S2310) may be performed on the loaded semiconductor substrate. A silicon deposition process (S2320) may be repetitively performed (S2325) until deposited layers reach a set thickness. When the deposited layers reach the set thickness (S2325), a barrier deposition process (S2330) may be performed. Thereafter, a nitridation process (S2340) may be performed to nitride the layers deposited using the base deposition process (S2310), the silicon deposition process (S2320), and the barrier deposition process (S2330). Thereafter, the semiconductor substrate may be unloaded from the semiconductor equipment (S130).

Figure 21A:
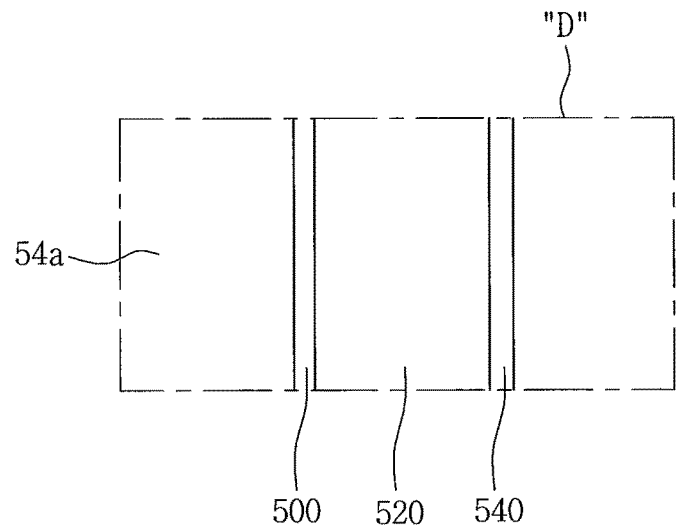
FIGS. 21A and 21B are cross-sectional views illustrating a method of forming a semiconductor device according to an embodiment of the inventive concept.
Figure 21B:
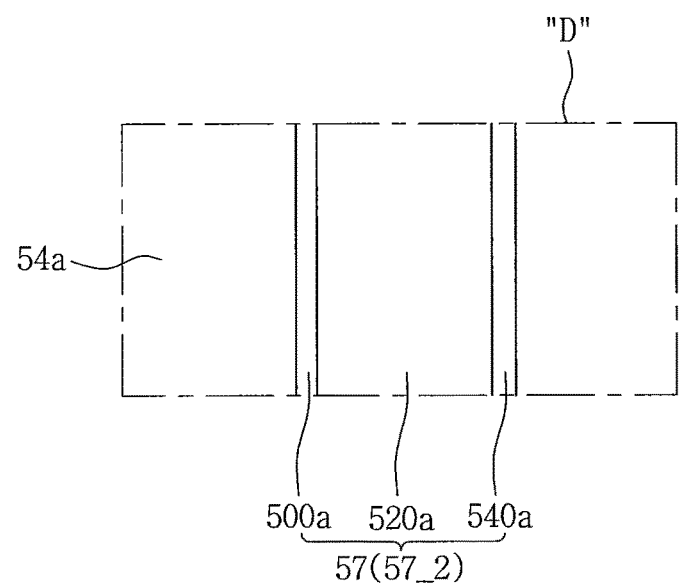

An example of a method of forming the outer spacers (refer to 57 in FIG. 8F) will be described with reference to FIGS. 21A and 21B along with FIG. 20. FIGS. 21A and 21B are enlarged views of portion D of FIG. 8F.

Referring to FIGS. 20 and 21A, a semiconductor substrate having the sacrificial spacers 54a may be loaded into semiconductor equipment (S110). The base deposition process (S2310), the silicon deposition process (S2320), and the barrier deposition process (S2330) may be performed on the loaded semiconductor substrate to the set thickness (S2325), thereby sequentially forming a base layer 500, a silicon layer 520, and a barrier layer 540.

Referring to FIGS. 20 and 21B, the base layer 500, the silicon layer 520, and the barrier layer 540 may be nitrided using the nitridation process (S2340), thereby forming a nitrided base layer 500a, a nitrided silicon layer 520a, and a nitrided barrier layer 540a.

Accordingly, spacers 57_2 including the nitrided base layer 500a, the nitrided silicon layer 520a, and the nitrided barrier layer 540a may be formed.

The semiconductor substrate having the spacers 57_2 may be unloaded from the semiconductor equipment (S130).

An example of a method of forming the first preliminary spacer layer 51 to form the inner spacer 51a, an example of a method of forming the outer spacers 57, or an example of a method of forming the upper preliminary spacer layer 69 to form the upper spacer 69a will be described with reference to FIG. 22.

Referring to FIG. 22, a semiconductor substrate may be loaded into semiconductor equipment (S110). A base deposition process (S2410), a silicon deposition process (S2420), and a nitridation process (S2430) may be sequentially performed on the loaded semiconductor substrate without vacuum interruption. When layers formed using the base deposition process (S2410), the silicon deposition process (S2420), and the nitridation process (S2430) do not reach a set thickness (S2435), the base deposition process (S2410), the silicon deposition process (S2420), and the nitridation process (S2430) may be repetitively performed (S2435) until the layers reach the set thickness. Afterwards, the semiconductor substrate may be unloaded from the semiconductor equipment (S130).

Figure 23A:
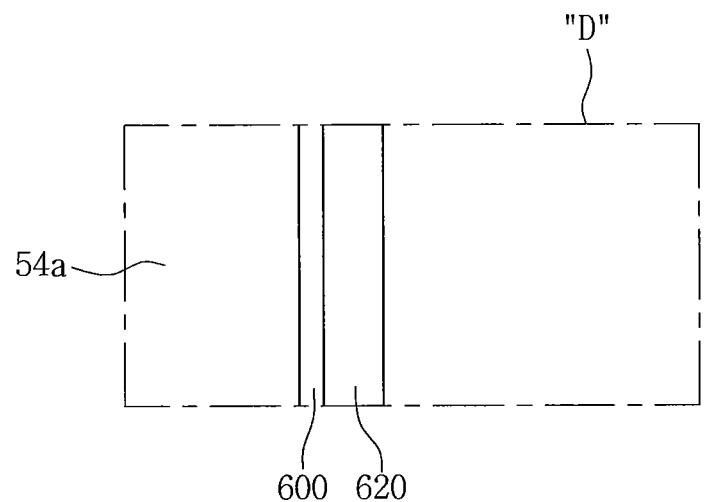
FIGS. 23A to 23C are cross-sectional views illustrating a method of forming a semiconductor device according to an embodiment of the inventive concept.
Figure 23B:
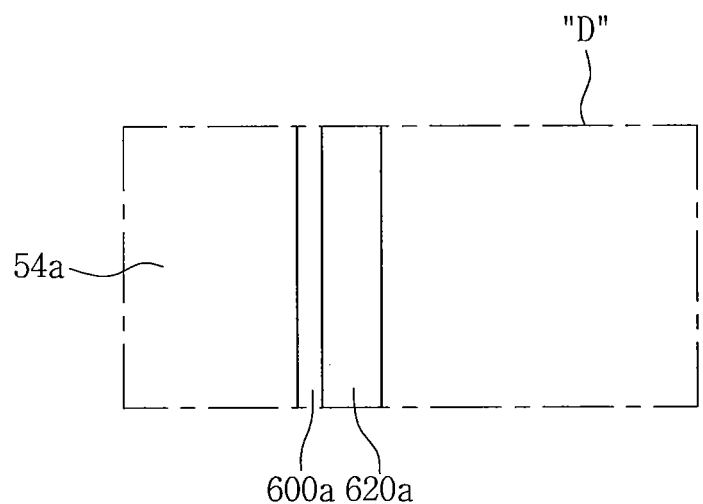
Figure 23C:
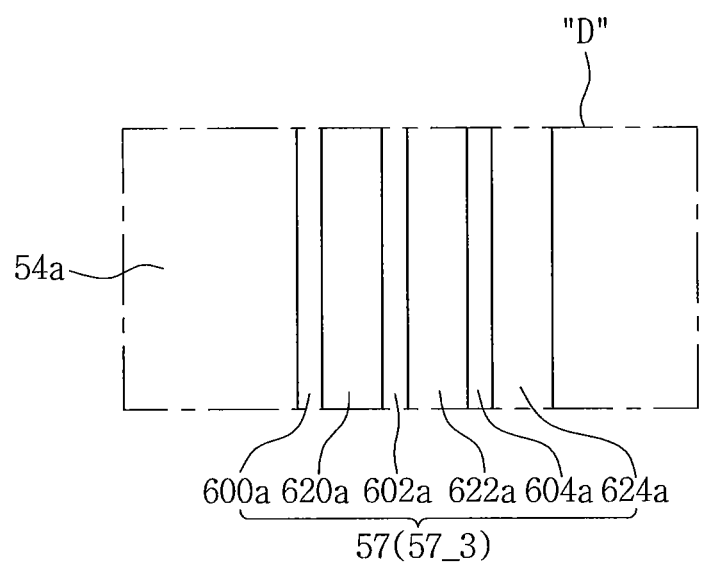

An example of a method of forming the outer spacers (refer to 57 in FIG. 8F) will be described with reference to FIGS. 23A through 23C along with FIG. 22. FIGS. 23A through 23C are enlarged views of portion D of FIG. 8F.

Referring to FIGS. 22 and 23A, a semiconductor substrate having the sacrificial spacers 54a may be loaded into semiconductor equipment (S110). The base deposition process (S2410) and the silicon deposition process (S2420) may be sequentially performed on the loaded semiconductor substrate, thereby forming a base layer 600 and a silicon layer 620 on the semiconductor substrate having the sacrificial spacers 54a.

Referring to FIGS. 22 and 23B, the nitridation process (S2430) may be performed. Thus, the silicon layer 620 may be nitrided to form a nitrided silicon layer 620a, and the base layer 600 may be nitrided to form a nitrided base layer 600a.

Referring to FIGS. 22 and 23C, the base deposition process (S2410), the silicon deposition process (S2420), and the nitridation process (S2430) may be repetitively performed (S2435), thereby forming a nitrided base layer 602a, a nitrided silicon layer 622a, a nitrided base layer 604a, and a nitrided silicon layer 624a that are stacked sequentially to provide the set thickness. Accordingly, spacers 57_3 including a plurality of nitrided base layers 600a, 602a, and 604a and a plurality of nitrided silicon layers 620a, 622a, and 624a may be formed. The semiconductor substrate having the spacers 57_3 may be unloaded from the semiconductor equipment (S130).

An example of a method of forming the first preliminary spacer layer 51 to form the inner spacer 51a, an example of a method of forming the outer spacers 57, or an example of a method of forming the upper preliminary spacer layer 69 to form the upper spacer 69a will be described with reference to FIG. 24.

Referring to FIG. 24, a semiconductor substrate may be loaded into semiconductor equipment (S110). A base deposition process (S2510) and a silicon deposition process (S2520) may be sequentially performed on the loaded semiconductor substrate. When layers formed using the base deposition process (S2510) and the silicon deposition process (S2520) do not reach a set thickness (S2525), the base deposition process (S2510) and the silicon deposition process (S2520) may be repetitively performed. Thereafter, the layers deposited using the base deposition process (S2510) and the silicon deposition process (S2520) may be nitrided using a nitridation process (S2530). Afterwards, the semiconductor substrate may be unloaded from the semiconductor equipment (S130).

Figure 25A:
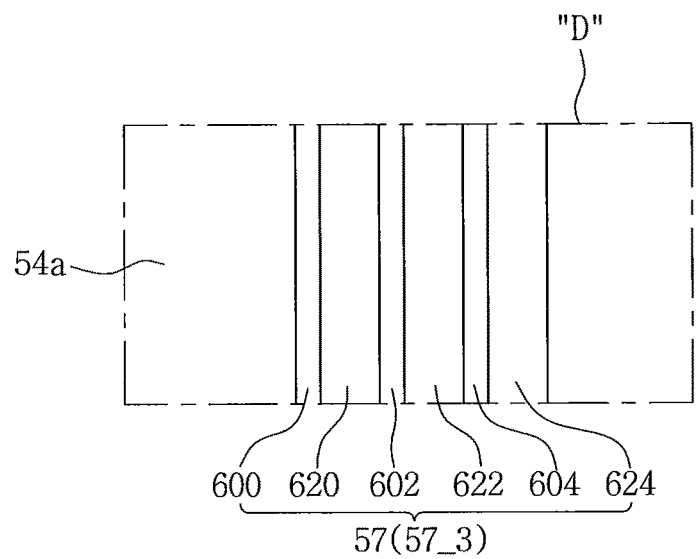
FIGS. 25A and 25B are cross-sectional views illustrating a method of forming a semiconductor device according to an embodiment of the inventive concept.
Figure 25B:
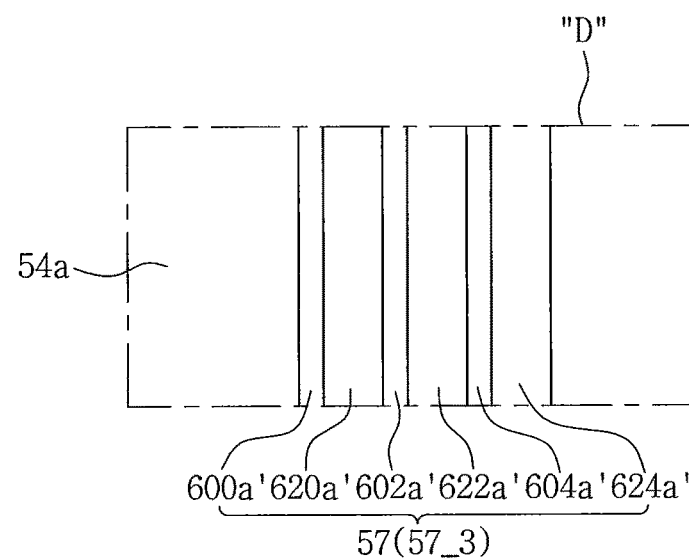

An example of a method of forming the outer spacers (refer to 57 in FIG. 8F) will be described with reference to FIGS. 25A and 25B along with FIG. 24. FIGS. 25A and 25B are enlarged views of portion D of FIG. 8F.

Referring to FIGS. 24 and 25A, a semiconductor substrate having the sacrificial spacers 54a may be loaded into semiconductor equipment (S110). The base deposition process (S2510) and the silicon deposition process (S2520) may be sequentially performed on the loaded semiconductor substrate, thereby forming a base layer 600 and a silicon layer 620 on the semiconductor substrate having the sacrificial spacers 54a.

The base deposition process (S2510) and the silicon deposition process (S2520) may be repetitively performed (S2525) to sequentially form a base layer 600, a silicon layer 620, a base layer 602, a silicon layer 622, a base layer 604, and a silicon layer 624.

Referring to FIGS. 24 and 25B, the nitridation process (S2530) may be performed. Thus, the silicon layers 620, 622, and 624 may be nitrided to form nitrided silicon layers 620a', 622a', and 624a', and the base layers 600, 602, and 604 may be nitrided to form nitrided base layers 600a', 602a', and 604a'.

Accordingly, spacers 57_3 including the nitrided base layers 600a', 602a', and 604a' and the nitrided silicon layers 620a', 622a', and 624a' may be formed. The semiconductor substrate having the spacers 57_3 may be unloaded from the semiconductor equipment (S130).

Figure 26:
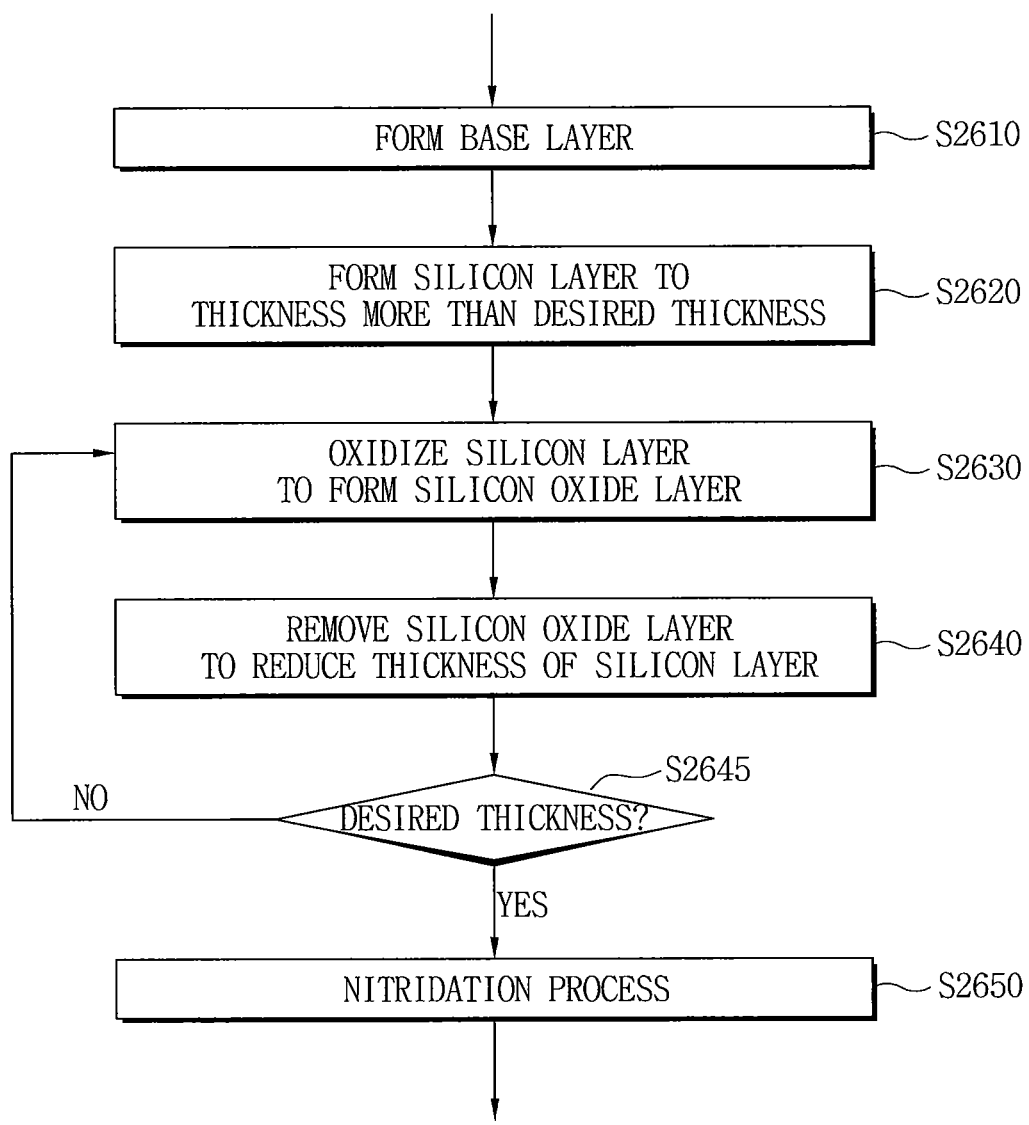
FIG. 26 is a flowchart of a method of forming a semiconductor device according to an embodiment of the inventive concept.

FIG. 26 is a flowchart of a method of reducing a thickness of a silicon layer according to an embodiment of the inventive concept. Even if not expressly mentioned in embodiments, the method of reducing the thickness of the silicon layer may be applied after a silicon deposition process and before a nitridation process in any of the embodiments.

An example of a method of forming the first preliminary spacer layer 51 to form the inner spacer 51a, an example of a method of forming the outer spacers 57, or an example of a method of forming the upper preliminary spacer layer 69 to form the upper spacer 69a will be described with reference to FIG. 26.

Referring to FIG. 26, a base layer may be formed using a base deposition process (S2610). A silicon layer may be formed using a silicon deposition process (S2620). The silicon layer may be formed on the base layer to a thickness more than a desired thickness when a surface of the silicon layer is oxidized to form a silicon oxide layer (S2630). The silicon oxide layer may be removed to reduce a thickness of the silicon layer (S2640). The silicon layer may be oxidized until the silicon layer reaches a desired thickness (S2645), thereby forming a silicon oxide layer at the desired thickness. A process of reducing the thickness of the silicon layer by removing the silicon oxide layer may be repeated.

Thereafter, a nitridation process (S2650) may be performed. The nitridation process (S2650) may nitride the base layer and the silicon layer having the desired thickness.

An example of a method of reducing the thickness of the silicon layer as described with reference to FIG. 26 will be described with reference to FIGS. 27A through 27C.

Figure 27A:
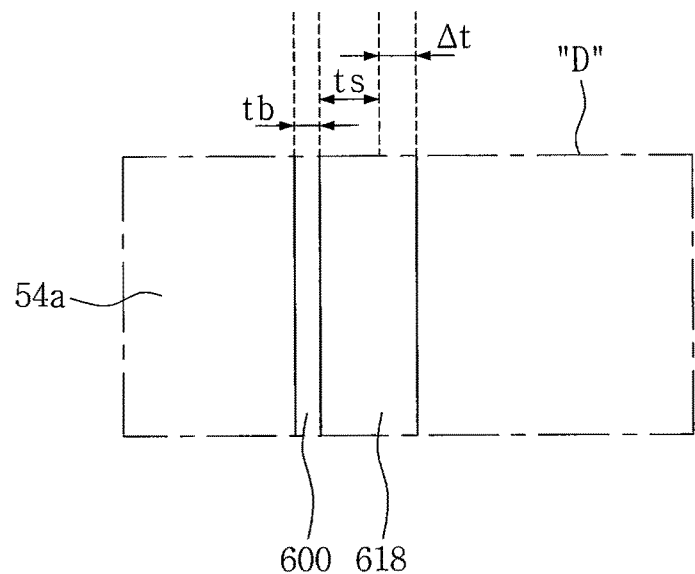
FIGS. 27A to 27C are cross-sectional views illustrating a method of forming a semiconductor device according to an embodiment of the inventive concept.

Referring to FIG. 27A, a base layer 600 and a silicon layer 618 may be sequentially formed. The silicon layer 618 may have a thickness, which is greater than a desired thickness "ts" by an excess thickness Δt. The base layer 600 may have a thickness "tb" smaller than the desired thickness "ts" of the silicon layer 618.

Figure 27B:
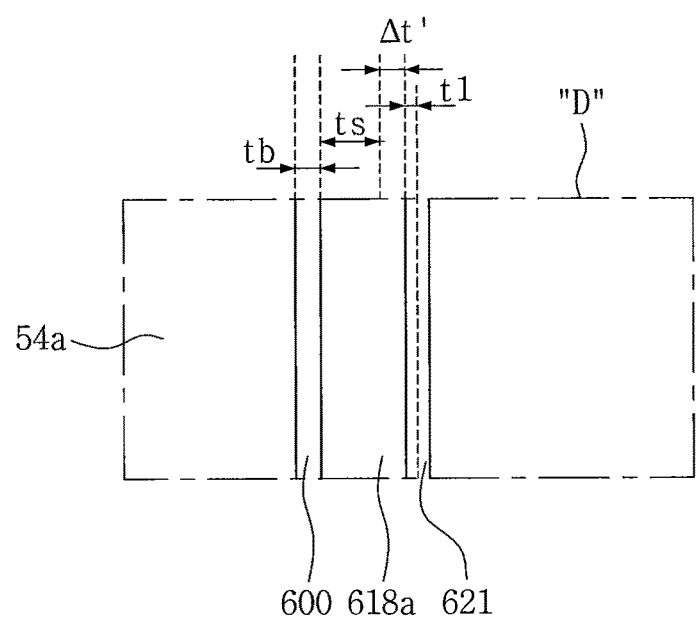

Referring to FIG. 27B, the silicon layer (refer to 618 in FIG. 27A) may be oxidized to form a silicon layer 618a having a reduced thickness. A silicon oxide layer 621 formed by oxidizing the silicon layer (refer to 618 in FIG. 27A) may be formed using elemental Si contained in the silicon layer (refer to 618 in FIG. 27A) as a source.

Accordingly, a thickness of the silicon layer (refer to 618 in FIG. 27A) may be reduced by as much as "t1" during the formation of the silicon oxide layer 621, thereby forming a silicon layer 618a having a reduced thickness. When the silicon layer 618a having the reduced thickness has a thickness Δt' more than the desired thickness "ts," a process of growing a silicon oxide layer and a process of removing the grown silicon oxide layer may be repeated.

Figure 27C:
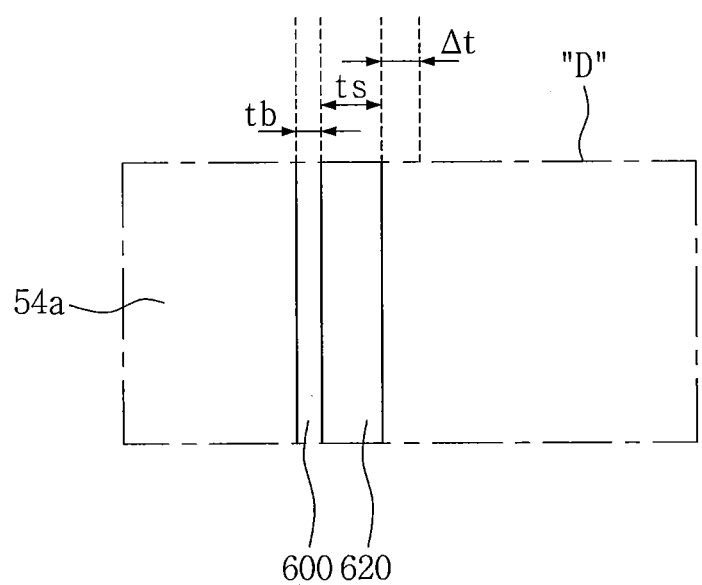

Referring to FIG. 27C, a silicon layer 620 having a reduced thickness may be formed by removing the final formed silicon oxide layer. Accordingly, to reduce the excess thickness Δt of the silicon layer, a process of growing a silicon oxide layer and a process of removing the grown silicon oxide layer may be repeated so that the silicon layer 620 having the reduced thickness may be formed with a desired thickness "ts".

An example of a method of forming the first preliminary spacer layer 51 to form the inner spacer 51a, an example of a method of forming the outer spacers 57, or an example of a method of forming the upper preliminary spacer layer 69 to form the upper spacer 69a will be described with reference to FIG. 28.

Figure 28:
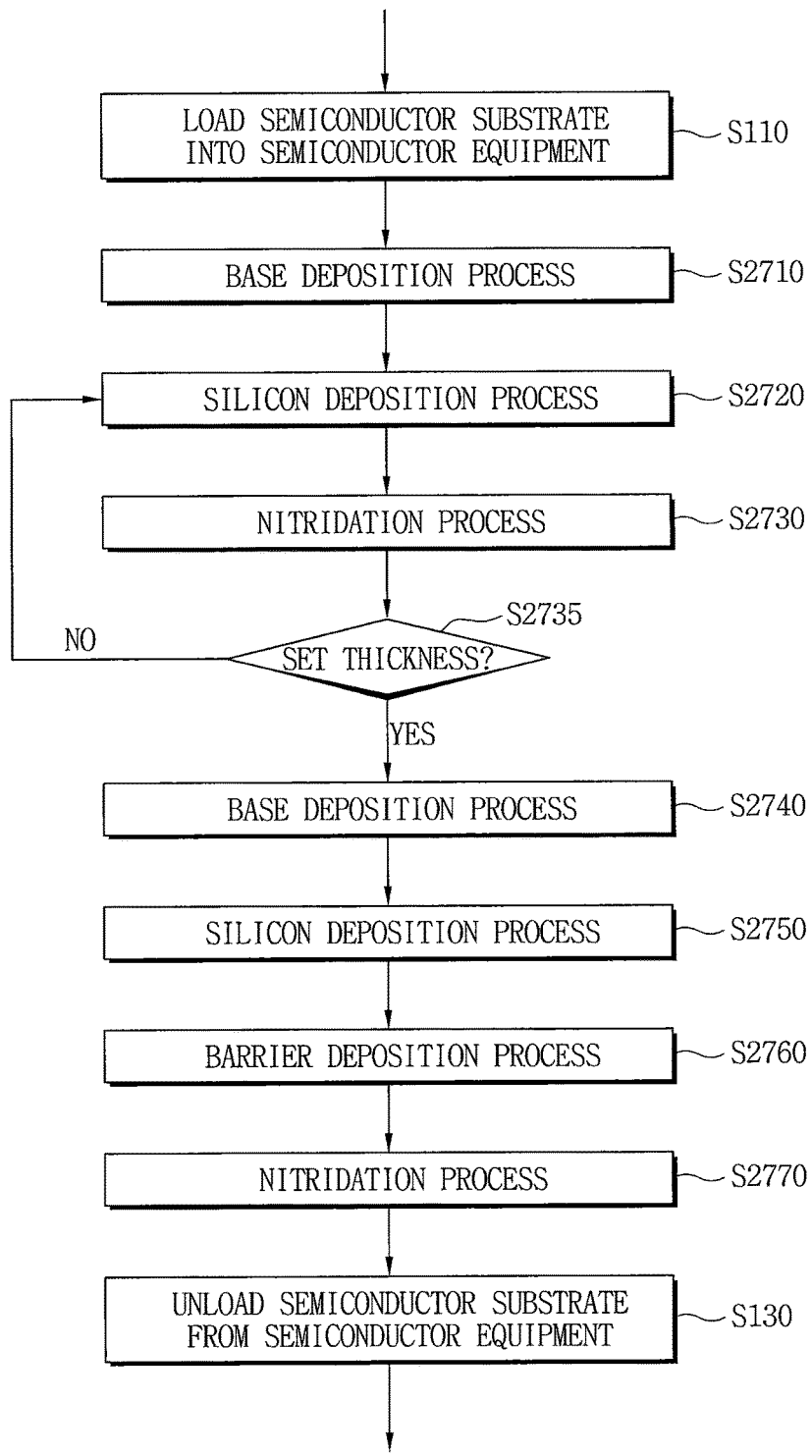
FIG. 28 is a flowchart of a method of forming a semiconductor device according to an embodiment of the inventive concept.

Referring to FIG. 28, a semiconductor substrate may be loaded into semiconductor equipment (S110). A base deposition process (S2710), a silicon deposition process (S2720), and a nitridation process (S2730) may be sequentially performed on the loaded semiconductor substrate without vacuum interruption. When layers formed using the base deposition process (S2710), the silicon deposition process (S2720), and the nitridation process (S2730) do not reach a set thickness (S2735), the base deposition process (S2710), the silicon deposition process (S2720), and the nitridation process (S2730) may be repetitively performed. Thereafter, a base deposition process (S2740), a silicon deposition process (S2750), a barrier deposition process (S2760), and a nitridation process (S2770) may be sequentially performed without vacuum interruption. Afterwards, the semiconductor substrate may be unloaded from the semiconductor equipment (S130).

Figure 29A:
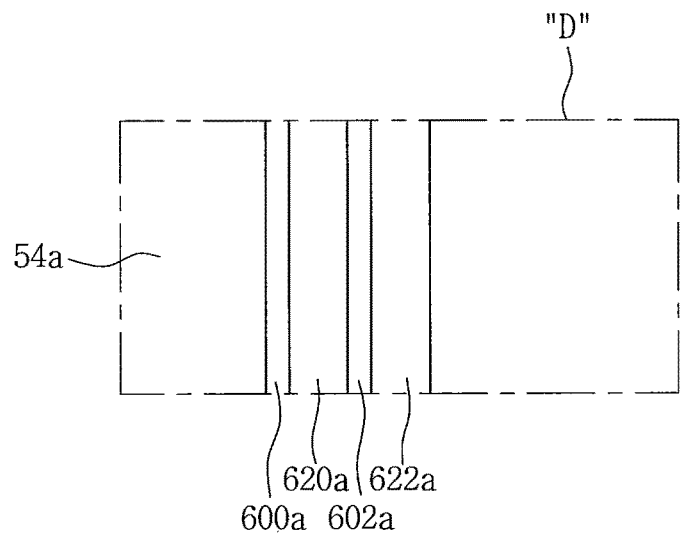
FIGS. 29A to 29C are cross-sectional views illustrating a method of forming a semiconductor device according to an embodiment of the inventive concept.
Figure 29B:
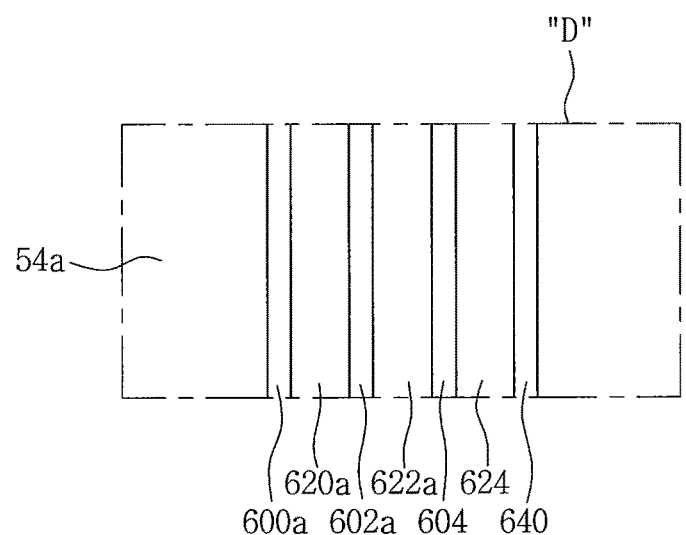
Figure 29C:
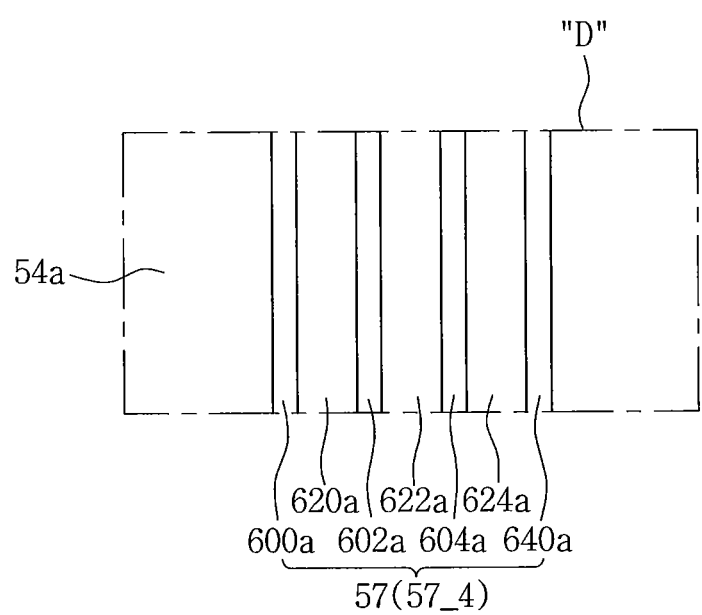

An example of a method of forming the outer spacers (refer to 57 in FIG. 8F) will be described with reference to FIGS. 29A through 29C along with FIG. 28. FIGS. 29A through 29C are enlarged views of portion D of FIG. 8F.

Referring to FIGS. 28 and 29A, a semiconductor substrate having the sacrificial spacers 54a may be loaded into semiconductor equipment (S110). The base deposition process (S2710), the silicon deposition process (S2720), and the nitridation process (S2730) may be sequentially performed on the semiconductor substrate having the sacrificial spacers 54a, thereby sequentially forming a nitrided base layer 600a, a nitrided silicon layer 620a, a nitrided base layer 602a, and a nitrided silicon layer 622a.

Referring to FIGS. 28 and 29B, the base deposition process (S2740), the silicon deposition process (S2750), and the barrier deposition process (S2760) may be sequentially performed without vacuum interruption, thereby sequentially forming a base layer 604, a silicon layer 624, and a barrier layer 640.

Referring to FIGS. 28 and 29C, the base layer 604, the silicon layer 624, and the barrier layer 640 may be nitrided using the nitridation process (S2770), thereby forming a nitrided base layer 604a, a nitrided silicon layer 624a, and a nitrided barrier layer 640a.

Accordingly, spacers 57_4 including a plurality of the nitrided base layers 600a, 602a, and 604a, a plurality of the nitrided silicon layers 620a, 622a, and 624a, and the nitrided barrier layer 640a may be formed. The semiconductor substrate having the spacers 57_4 may be unloaded from the semiconductor equipment (S130).

An example of a method of forming the first preliminary spacer layer 51 to form the inner spacer 51a, an example of a method of forming the outer spacers 57, or an example of a method of forming the upper preliminary spacer layer 69 to form the upper spacer 69a will be described with reference to FIG. 30.

Figure 30:
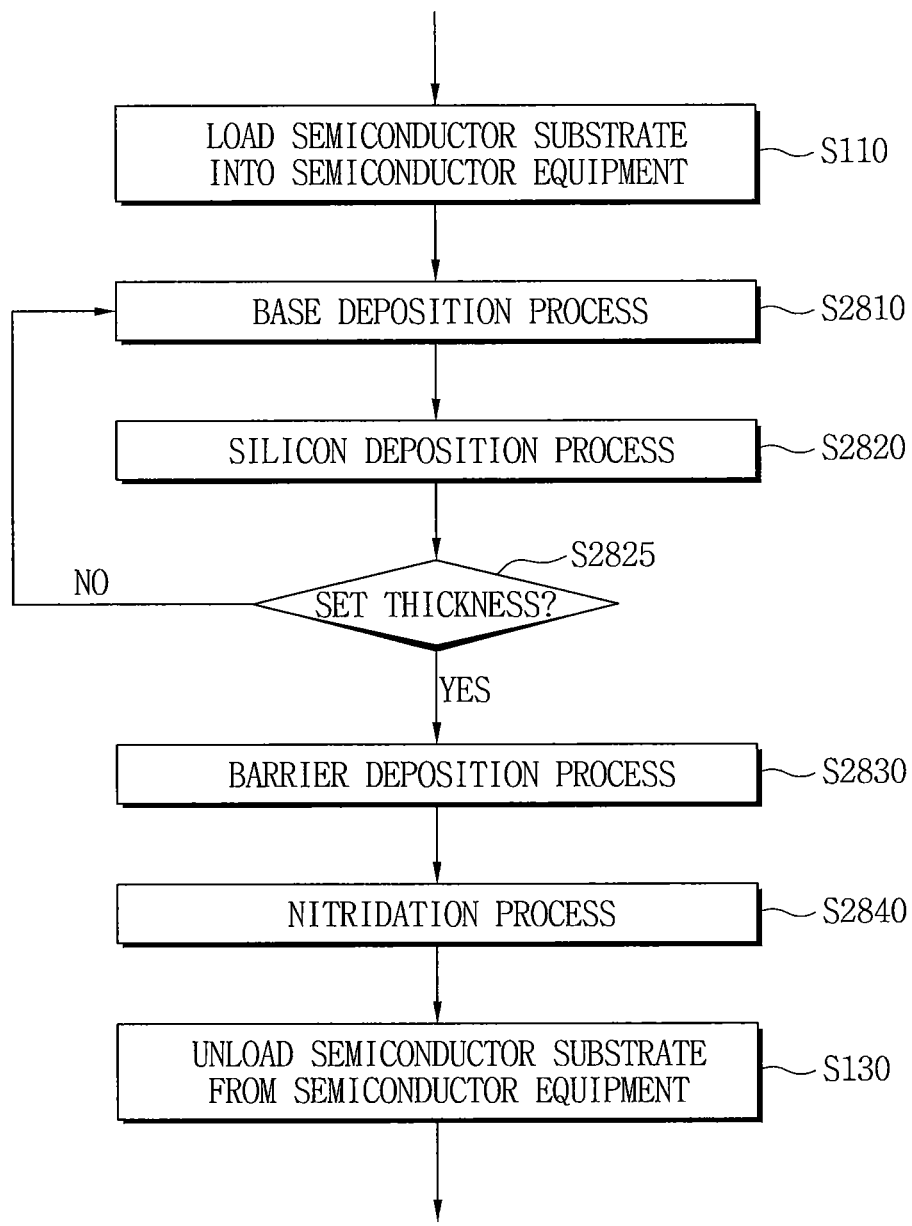
FIG. 30 is a flowchart of a method of forming a semiconductor device according to an embodiment of the inventive concept.

Referring to FIG. 30, a semiconductor substrate may be loaded into semiconductor equipment (S110). A base deposition process (S2810) and a silicon deposition process (S2820) may be sequentially performed on the loaded semiconductor substrate without vacuum interruption. When layers formed using the base deposition process (S2810) and the silicon deposition process (S2820) do not reach a set thickness (S2835), the base deposition process (S2810) and the silicon deposition process (S2820) may be repetitively performed. Thereafter, a barrier deposition process (S2830) and a nitridation process (S2840) may be sequentially performed. Afterwards, the semiconductor substrate may be unloaded from the semiconductor equipment (S130).

Figure 31A:
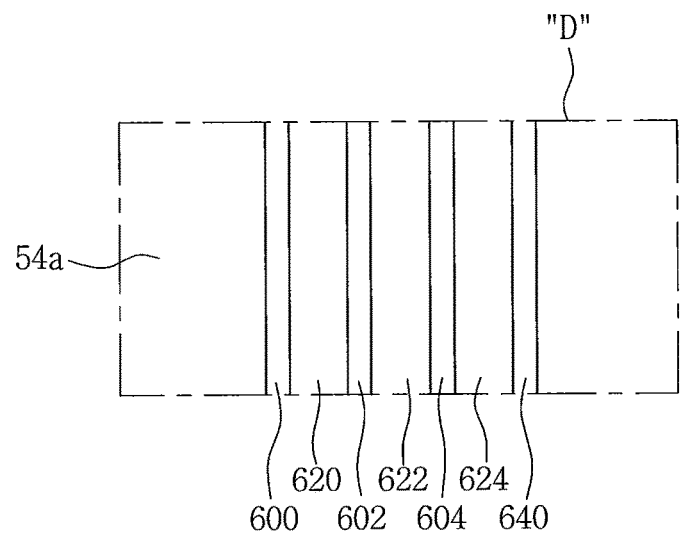
FIGS. 31A and 31B are cross-sectional views illustrating a method of forming a semiconductor device according to an embodiment of the inventive concept.
Figure 31B:
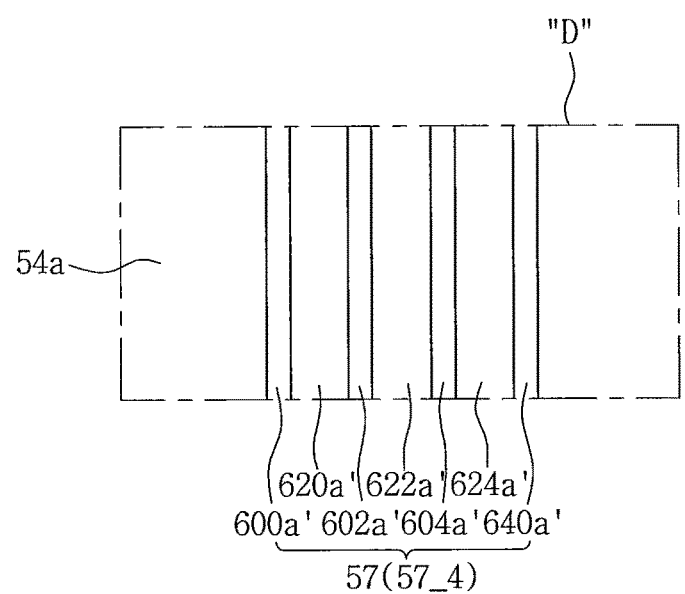

An example of a method of forming the outer spacers (refer to 57 in FIG. 8F) will be described with reference to FIGS. 31A and 31B along with FIG. 30. FIGS. 31A and 31B are enlarged views of portion D of FIG. 8F.

Referring to FIGS. 30 and 31A, a semiconductor substrate having the sacrificial spacers 54a may be loaded into semiconductor equipment (S110). The base deposition process (S2810) and the silicon deposition process (S2820) may be sequentially performed on the loaded semiconductor substrate, thereby sequentially forming a base layer 600, a silicon layer 620, a base layer 602, a silicon layer 622, a base layer 604, and a silicon layer 624 on the semiconductor substrate having the sacrificial spacers 54a. Thereafter, the barrier deposition process (S2830) may be performed to form a barrier layer 640.

Referring to FIGS. 30 and 31B, the base layers 600, 602, and 604, the silicon layers 620, 622, and 624, and the barrier layer 640 may be nitrided using the nitridation process (S2840), thereby forming nitrided base layers 600a', 602a', and 604a', nitrided silicon layers 620a', 622a', and 624a', and a nitrided barrier layer 640a'.

Accordingly, spacers 57_4 including a plurality of the nitrided base layers 600a', 602a', and 604a', a plurality of the nitrided silicon layers 620a', 622a', and 624a', and the nitrided barrier layer 640a' may be formed. The semiconductor substrate having the spacers 574 may be unloaded from the semiconductor equipment (S130).

An example of a method of forming the first preliminary spacer layer 51 to form the inner spacer 51*a*, an example of a method of forming the outer spacers 57, or an example of a method of forming the upper preliminary spacer layer 69 to form the upper spacer 69*a* will be described with reference to FIG. 32.

Figure 32:
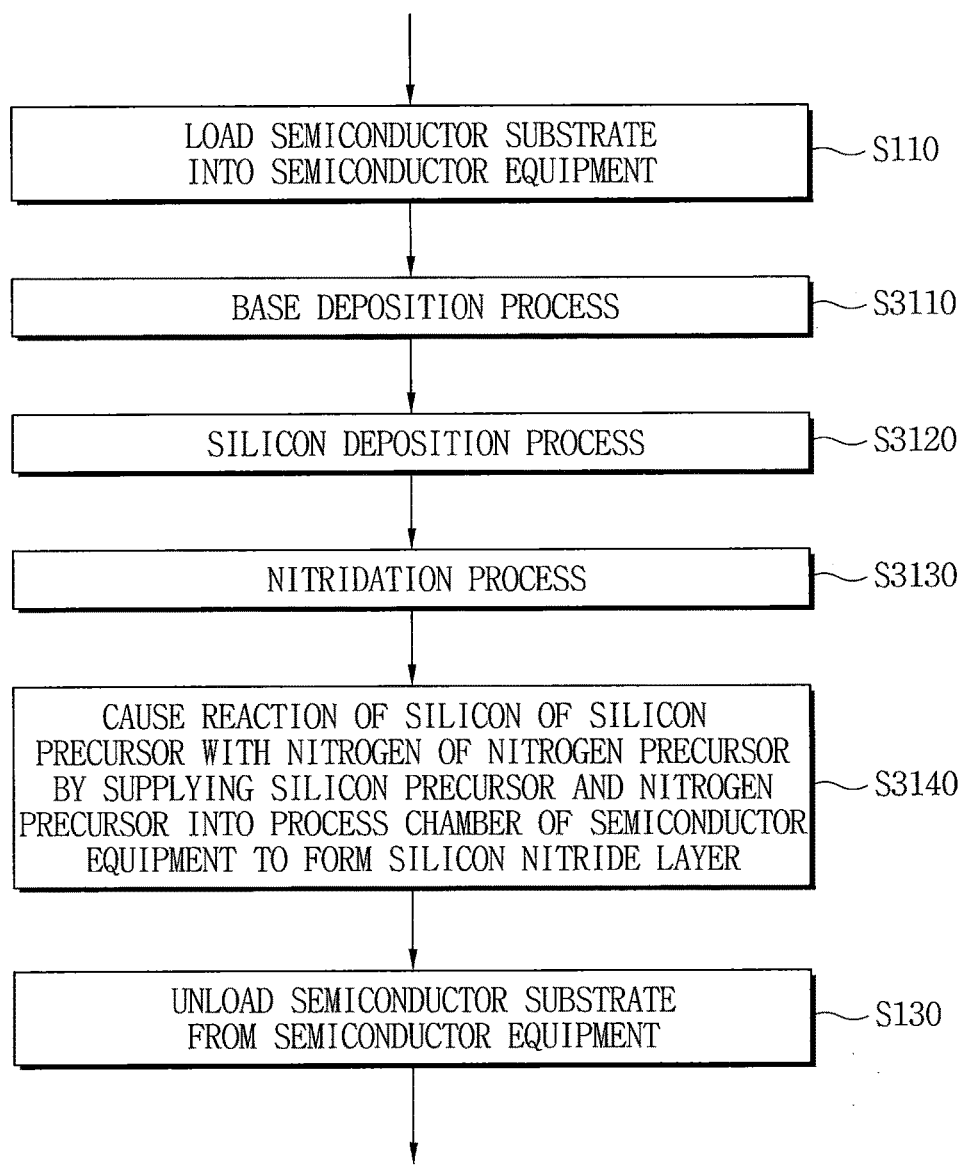
FIG. 32 is a flowchart of a method of forming a semiconductor device according to an embodiment of the inventive concept.

Referring to FIG. 32, a semiconductor substrate may be loaded into semiconductor equipment (S110). A base deposition process (S3110), a silicon deposition process (S3120), and a nitridation process (S3130) may be sequentially performed on the loaded semiconductor substrate, thereby forming a nitrided base layer and a nitrided silicon layer.

A silicon nitride deposition process (S3140) may be performed. Specifically, a silicon precursor and a nitrogen precursor may be supplied into a process chamber of the semiconductor equipment so that silicon of the silicon precursor can react with nitrogen of the nitrogen precursor to form a silicon nitride layer. Afterwards, the semiconductor substrate may be unloaded from the semiconductor equipment (S130).

Figure 33A:
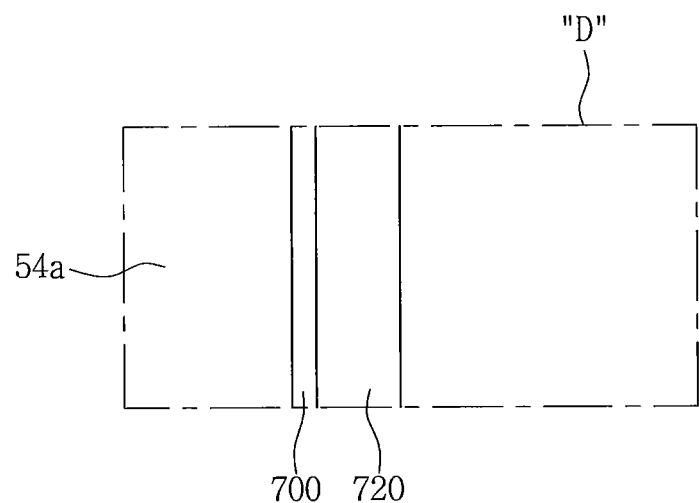
FIGS. 33A to 33C are cross-sectional views illustrating a method of forming a semiconductor device according to an embodiment of the inventive concept.
Figure 33B:
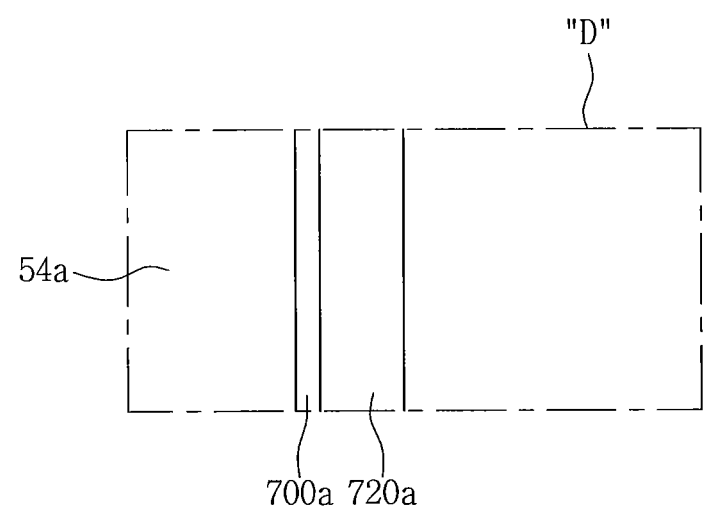
Figure 33C:
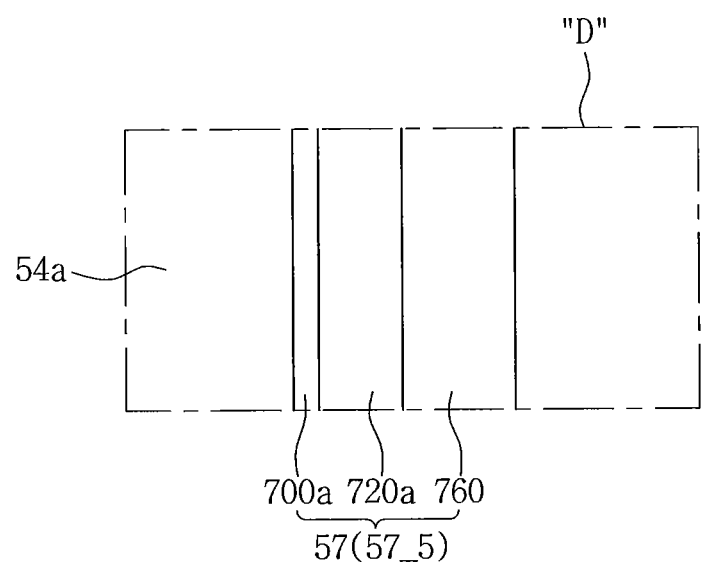

An example of a method of forming the outer spacers (refer to 57 in FIG. 8F) will be described with reference to FIGS. 33A through 33C along with FIG. 32. FIGS. 33A through 33C are enlarged views of portion D of FIG. 8F.

Referring to FIGS. 32 and 33A, a semiconductor substrate having the sacrificial spacers 54*a* may be loaded into semiconductor equipment (S110). The base deposition process (S3110) and the silicon deposition process (S3120) may be performed on the loaded semiconductor substrate, thereby sequentially forming a base layer 700 and a silicon layer 720. The base layer 700 and the silicon layer 720 may have an amorphous structure.

Referring to FIGS. 32 and 33B, the nitridation process (S3130) may be performed so that the base layer 700 and the silicon layer 720 may be nitrided to form a nitrided base layer 700*a* and a nitrided silicon layer 720*a*. The nitrided base layer 700*a* may be formed of a SiHCN material. The nitrided silicon layer 720*a* may be formed of a Si-rich silicon nitride.

Referring to FIGS. 32 and 33C, a silicon nitride deposition process (S3140) may be performed. Specifically, a silicon precursor and a nitrogen precursor may be supplied into a process chamber of the semiconductor equipment so that silicon of a silicon precursor may react with nitrogen of a nitrogen precursor to form a silicon nitride layer 760 on the nitrided silicon layer 720*a*. The silicon nitride layer 760 may be formed of an N-rich silicon nitride. The silicon nitride layer 760 may be formed using a CVD process or an ALD process. Accordingly, spacers 57_5 including the nitrided base layer 700*a*, the nitrided silicon layer 720*a*, and the silicon nitride layer 760 may be formed. The semiconductor substrate having the spacers 57_5 may be unloaded from the semiconductor equipment (S130).

An example of a method of forming the first preliminary spacer layer 51 to form the inner spacer 51*a*, an example of a method of forming the outer spacers 57, or an example of a method of forming the upper preliminary spacer layer 69 to form the upper spacer 69*a* will be described with reference to FIG. 34.

Figure 34:
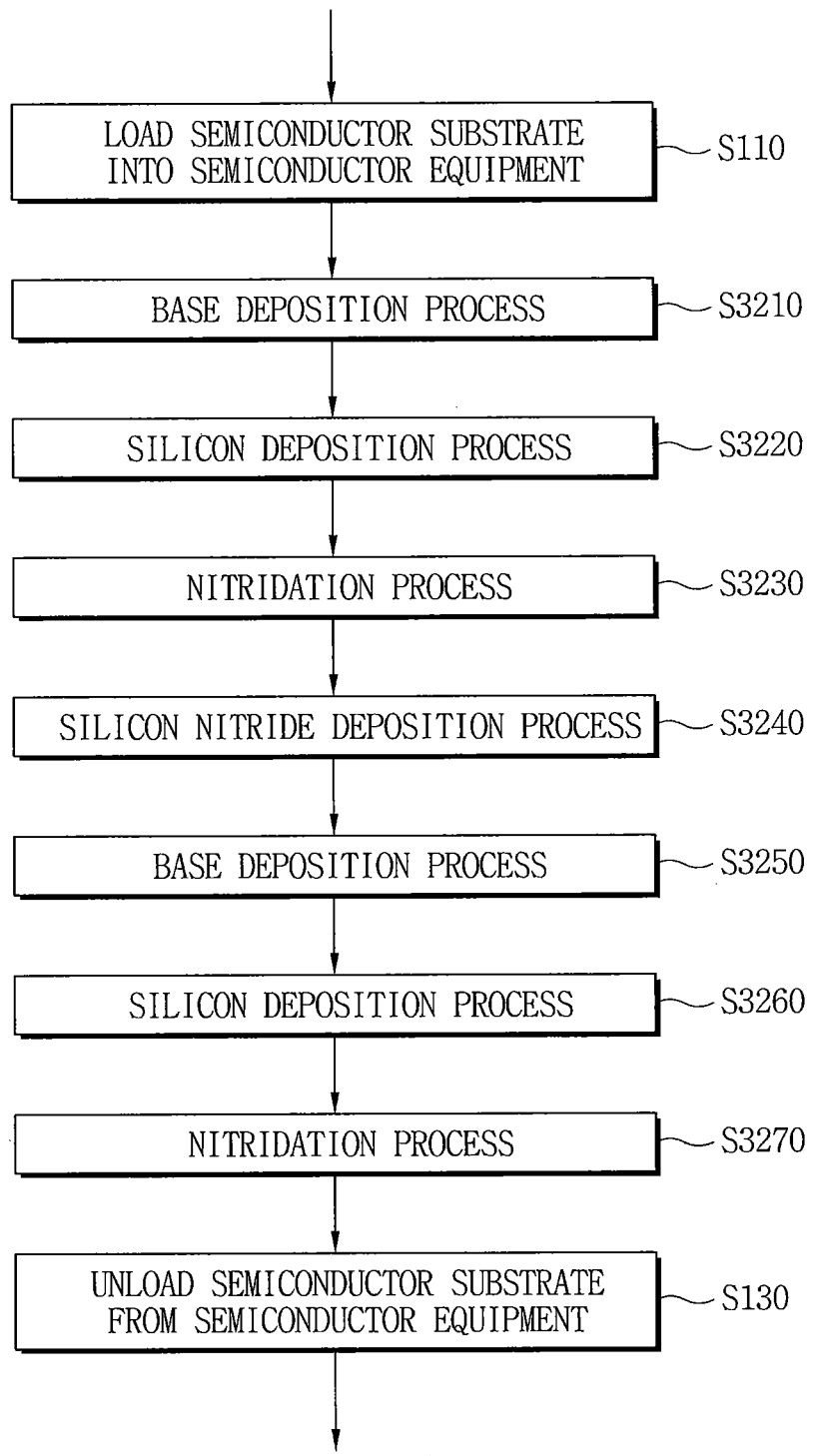
FIG. 34 is a flowchart of a method of forming a semiconductor device according to an embodiment of the inventive concept.

Referring to FIG. 34, a semiconductor substrate may be loaded into semiconductor equipment (S110). A base deposition process (S3210), a silicon deposition process (S3220), and a nitridation process (S3230) may be sequentially performed on the loaded semiconductor substrate. Thereafter, a silicon nitride deposition process (S3240) may be performed without vacuum interruption. The silicon nitride deposition process (S3240) may be a deposition process using a silicon source material, such as a dichlorosilane (DC) gas, and a nitrogen source material, such as $NH_3$.

Subsequently, a base deposition process (S3250), a silicon deposition process (S3260), and a nitridation process (S3270) may be sequentially performed without vacuum interruption. Afterwards, the semiconductor substrate may be unloaded from the semiconductor equipment (S130).

Figure 35A:
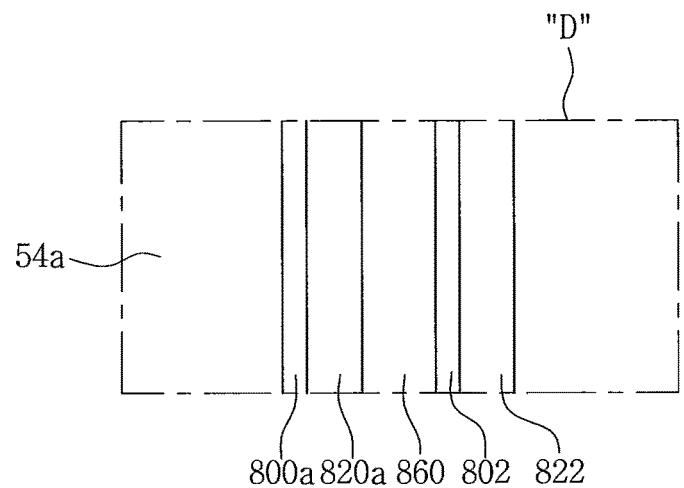
FIGS. 35A and 35B are cross-sectional views illustrating a method of forming a semiconductor device according to an embodiment of the inventive concept.
Figure 35B:
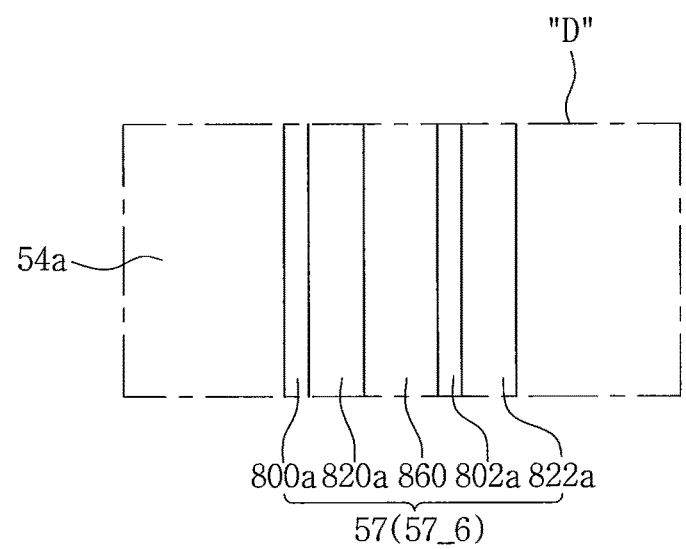

An example of a method of forming the outer spacers (refer to 57 in FIG. 8F) will be described with reference to FIGS. 35A and 35B. FIGS. 35A and 35B are enlarged views of portion D of FIG. 8F.

Referring to FIGS. 34 and 35A, a semiconductor substrate having the sacrificial spacers 54*a* may be loaded into semiconductor equipment (S110). The base deposition process (S3210), the silicon deposition process (S3220), and the nitridation process (S3230) may be sequentially performed on the loaded semiconductor substrate, thereby forming a nitrided base layer 800*a* and a nitrided silicon layer 820*a*. Thereafter, a silicon nitride deposition process (S3240) may be performed. Specifically, a silicon precursor and a nitrogen precursor may be supplied into a process chamber of the semiconductor equipment process chamber so that silicon of a silicon precursor may react with nitrogen of a nitrogen precursor to form silicon nitride layer 860. The base deposition process (S3250) and the silicon deposition process (S3260) may be sequentially performed, thereby forming a base layer 802 and a silicon layer 822 on the silicon nitride layer 860.

Referring to FIGS. 34 and 35B, the base layer 802 and the silicon layer 822 may be nitrided using the nitridation process (S3270), thereby forming a nitrided base layer 802*a* and a nitrided silicon layer 822*a*. Accordingly, spacers 57_6 including the nitrided base layers 800*a* and 802*a*, the nitrided silicon layers 820*a* and 822*a*, and the silicon nitride layer 860 may be formed. The semiconductor substrate having the spacers 57_6 may be unloaded from the semiconductor equipment (S130).

An example of a method of forming the first preliminary spacer layer 51 to form the inner spacer 51*a*, an example of a method of forming the outer spacers 57, or an example of a method of forming the upper preliminary spacer layer 69 to form the upper spacer 69*a* will be described with reference to FIG. 36.

Figure 36:
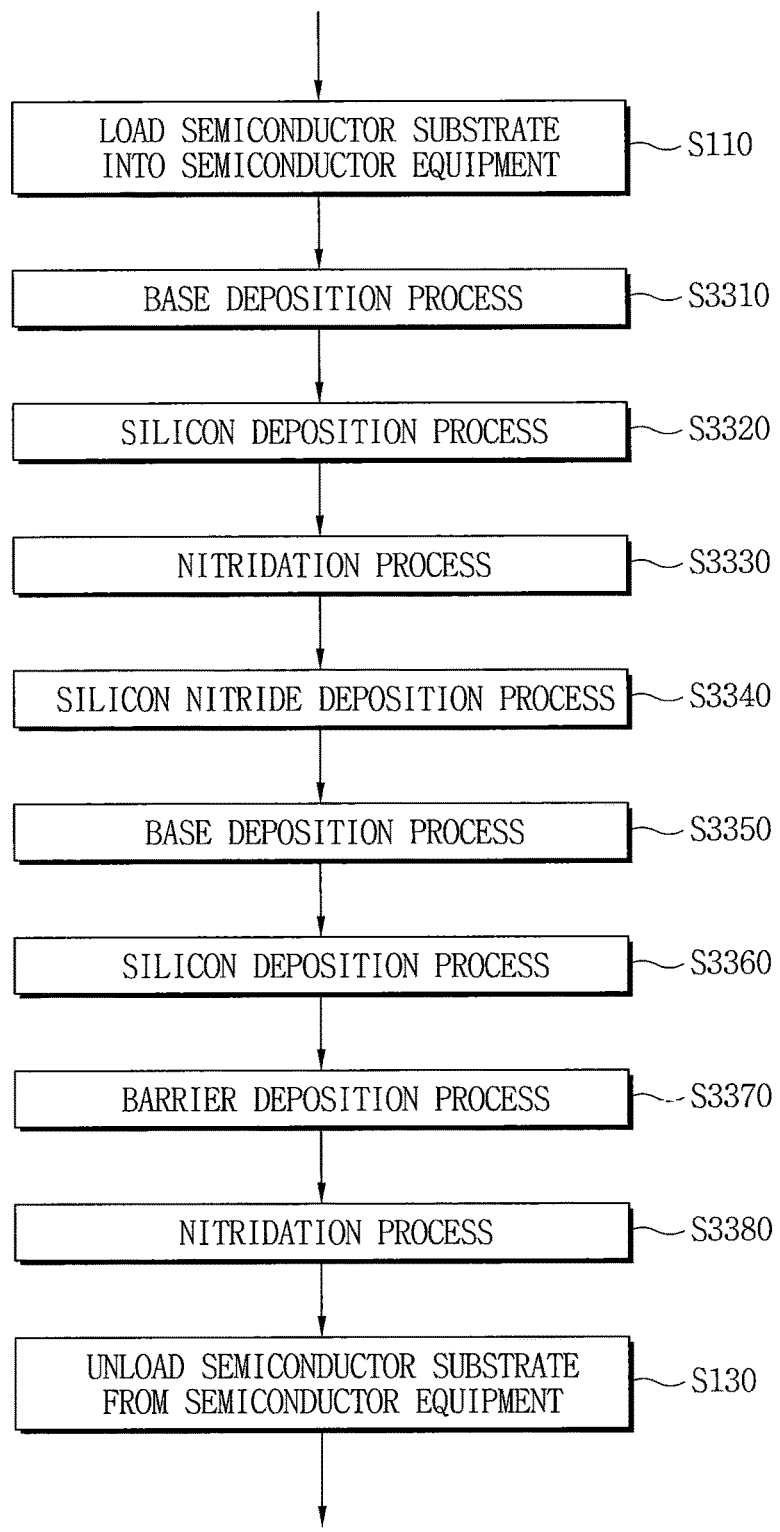
FIG. 36 is a flowchart of a method of forming a semiconductor device according to an embodiment of the inventive concept.

Referring to FIG. 36, a semiconductor substrate may be loaded into semiconductor equipment (S110). A base deposition process (S3310), a silicon deposition process (S3320), and a nitridation process (S3330) may be sequentially performed on the loaded semiconductor substrate. Thereafter, a silicon nitride deposition process (S3340) may be performed without vacuum interruption. Next, a base deposition process (S3350), a silicon deposition process (S3360), a barrier deposition process (S3370), and a nitridation process (S3380) may be sequentially performed without vacuum interruption. Afterwards, the semiconductor substrate may be unloaded from the semiconductor equipment (S130).

Figure 37A:
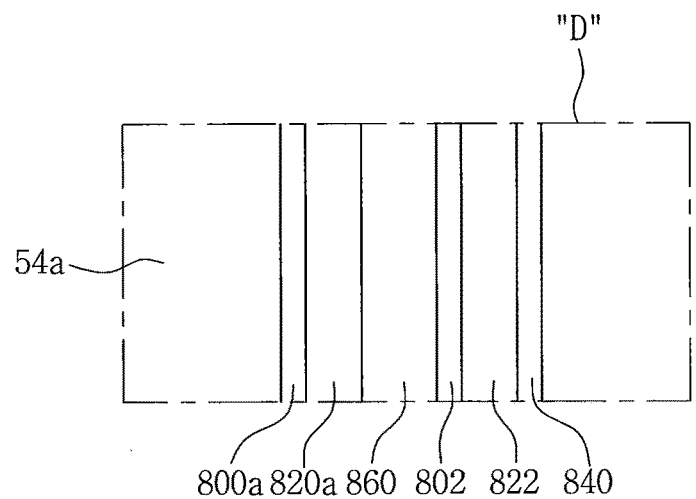
FIGS. 37A and 37B are cross-sectional views illustrating a method of forming a semiconductor device according to an embodiment of the inventive concept.
Figure 37B:
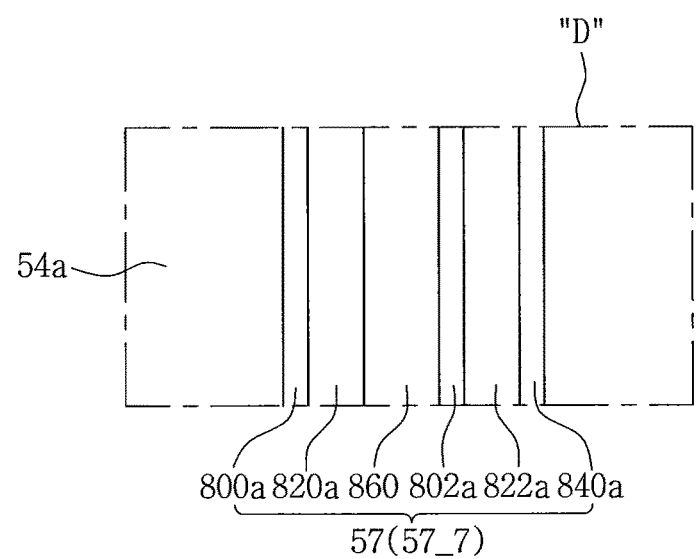

An example of a method of forming the outer spacers (refer to 57 in FIG. 8F) will be described with reference to FIGS. 37A and 37B along with FIG. 36. FIGS. 37A and 37B are enlarged views of portion D of FIG. 8F.

Referring to FIGS. 36 and 37A, a semiconductor substrate including the sacrificial spacers 54*a* may be loaded into semiconductor equipment (S110). The base deposition process (S3310), the silicon deposition process (S3320), and the nitridation process (S3330) may be sequentially performed on the loaded semiconductor substrate, thereby forming a nitrided base layer 800*a* and a nitrided silicon layer 820*a*.

Thereafter, the silicon nitride deposition process (S3340) may be performed to form a silicon nitride layer 860 on the nitrided silicon layer 820*a*.

Subsequently, the base deposition process (S3350), the silicon deposition process (S3360), and the barrier deposition process (S3370) may be sequentially performed, thereby sequentially forming a base layer 802, a silicon layer 822, and a barrier layer 840 on the silicon nitride layer 860.

Referring to FIGS. 36 and 37B, the base layer 802, the silicon layer 822, and the barrier layer 840 may be nitrided using the nitridation process (S3380), thereby forming a nitrided base layer 802*a*, a nitrided silicon layer 822*a*, and a nitrided barrier layer 840*a*. Accordingly, spacers 57_7 including the nitrided base layers 800*a* and 802*a*, the nitrided silicon layers 820*a* and 822*a*, the silicon nitride layer 860, and the nitrided barrier layer 840*a* may be formed. The semiconductor substrate having the spacers 576 may be unloaded from the semiconductor equipment (S130).

The semiconductor equipment described above with reference to FIGS. 13 through 37B will be described with reference to each of FIGS. 38A, 38B, and 38C. For example, the semiconductor equipment may be semiconductor equipment capable of performing deposition and nitridation processes without vacuum interruption as described with reference to FIGS. 13 through 37B.

Initially, semiconductor equipment according to an embodiment 1100 of the inventive concept will be described with reference to FIG. 38A.

Figure 38A:
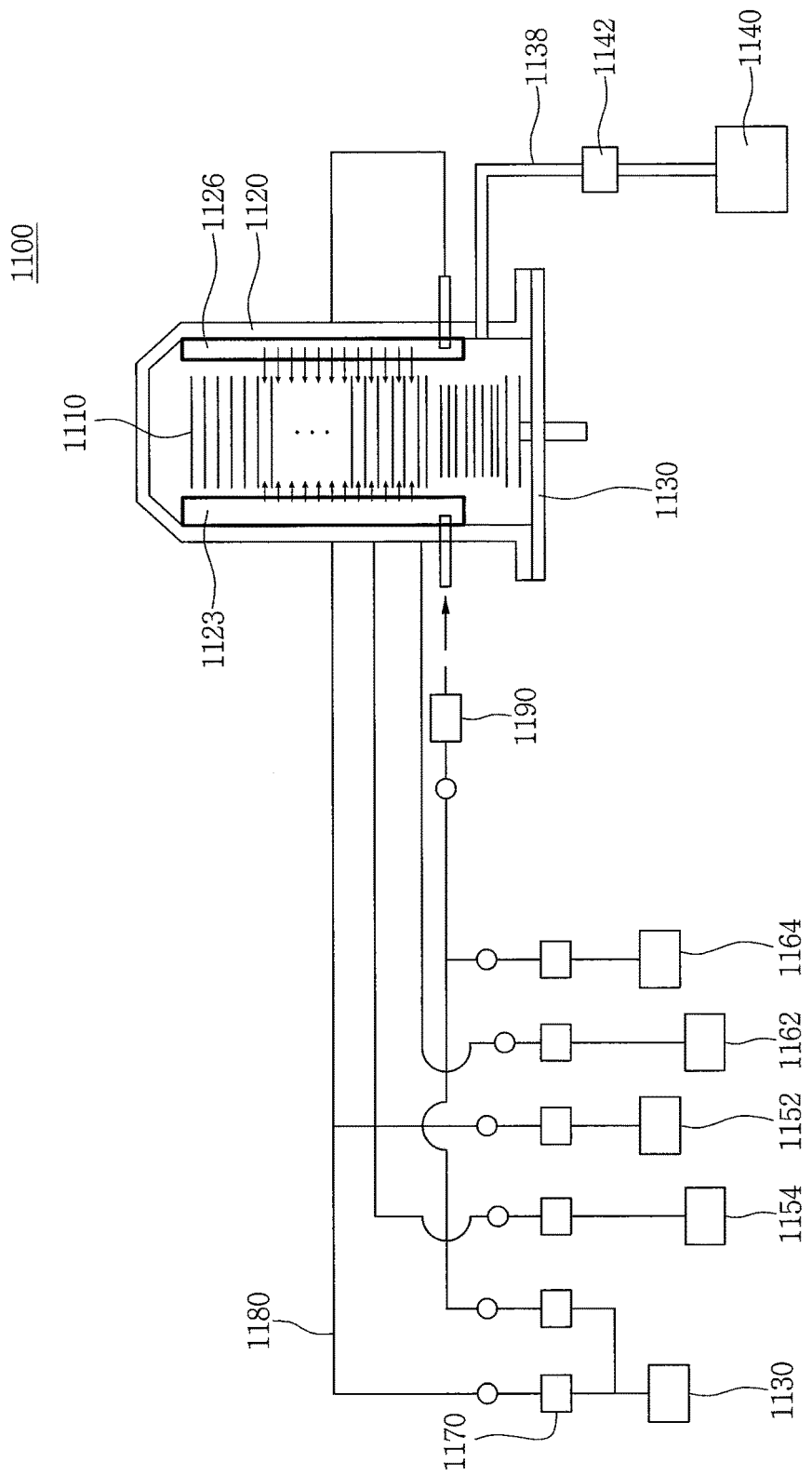
FIG. 38A is a schematic diagram of process equipment for forming a semiconductor device according to an embodiment of the inventive concept.

Referring to FIG. 38A, the semiconductor equipment 1100 may include a tube 1120 and a substrate mounting unit 1110 and a boat support table 1130 disposed in the tube 1120.

The tube 1120 may be a reactor tube. The tube 1120 may be named a "process chamber" for performing processes. The substrate mounting unit 1110 may include a boat and a substrate susceptor. The substrate susceptor may be a portion in which a substrate loaded into the tube 1120 of the semiconductor equipment 1100 is located.

The tube 1120 may include a first nozzle portion 1123 and a second nozzle portion 1126, which are disposed at side surfaces of the substrate mounting unit 1110 in the tube 1120. The first nozzle portion 1123 may include a nozzle for supplying a nitrogen source material into the tube 1120, and the second nozzle portion 1126 may include a nozzle for supplying a silicon source material or a base source material.

The semiconductor equipment 1100 may include a vacuum pump 1140, a pipeline 1138 configured to connect the vacuum pump 1140 and the tube 1120, and a valve 1142 installed in-line with the pipeline 1138.

The semiconductor equipment 1100 may be connected to an inert gas supply device 1130, a first source supply device 1152, a second source supply device 1154, a third source supply device 1162, and a fourth source supply device 1164.

In the semiconductor equipment 1100, materials contained in the inert gas supply device 1130, the first source supply device 1152, the second source supply device 1154, the third source supply device 1162, and the fourth source supply device 1164 may be supplied as gas types through a pipeline 1180 into the tube 1120.

Amounts of materials that are supplied from the inert gas supply device 1130, the first source supply device 1152, the second source supply device 1154, the third source supply device 1162, and the fourth source supply device 1164 into the tube 1120 may be controlled by flow rate control devices 1170 installed in-line with the pipeline 1180.

The inert gas supply device 1130 may be a device configured to supply an inert gas (e.g., nitrogen gas) which is used to purge the tube 1120 or a process chamber. The first source supply device 1152 may be a device configured to supply a base source material used to form the base layer or the barrier layer. For example, the first source supply device 1152 may be a device configured to supply the base source material used during the base deposition process (S2010) described with reference to FIG. 14.

The second source supply device 1154 may be a device configured to supply a silicon source material used to form the silicon layer. For instance, the second source supply device 1154 may be a device configured to supply the silicon source material used during the silicon deposition process (S2020) described with reference to FIG. 14.

The third source supply device 1162 may be a device configured to supply a silicon source material used during a CVD or ALD process for forming the silicon nitride layer. For example, the third source supply device 1162 may be a device configured to supply a silicon material used during the silicon nitride deposition process (S3240) described with reference to FIG. 34.

The fourth source supply device 1164 may be a device configured to supply a nitrogen source material used during a nitridation process or during a CVD or ALD process for forming an N-rich silicon nitride layer. Here, when a nitrogen source used to perform the nitridation process is different from a nitrogen source used to perform the CVD or ALD process for forming the N-rich silicon nitride layer, the fourth source supply device 1164 may be designed and installed so as to supply two kinds of nitrogen sources.

The semiconductor equipment 1100 may include a plasma generator 1190. The plasma generator 1190 may be an apparatus capable of generating plasma. FIG. 38A shows only an example in which the plasma generator 1190 is disposed in the semiconductor equipment 1100, but the plasma generator 1190 is not limited to the shown arrangement. For example, the plasma generator 1190 may be mounted in the tube 1120 or at the tube 1120.

By use of the semiconductor equipment 1100, a process of depositing a base layer and a preliminary barrier layer may be performed, a process of depositing a silicon layer may be performed, a nitridation process may be performed, and a process of forming a silicon nitride layer may be performed using a CVD or ALD process.

Next, semiconductor equipment according to an embodiment of the inventive concept will be described with reference to FIG. 38B.

Figure 38B:
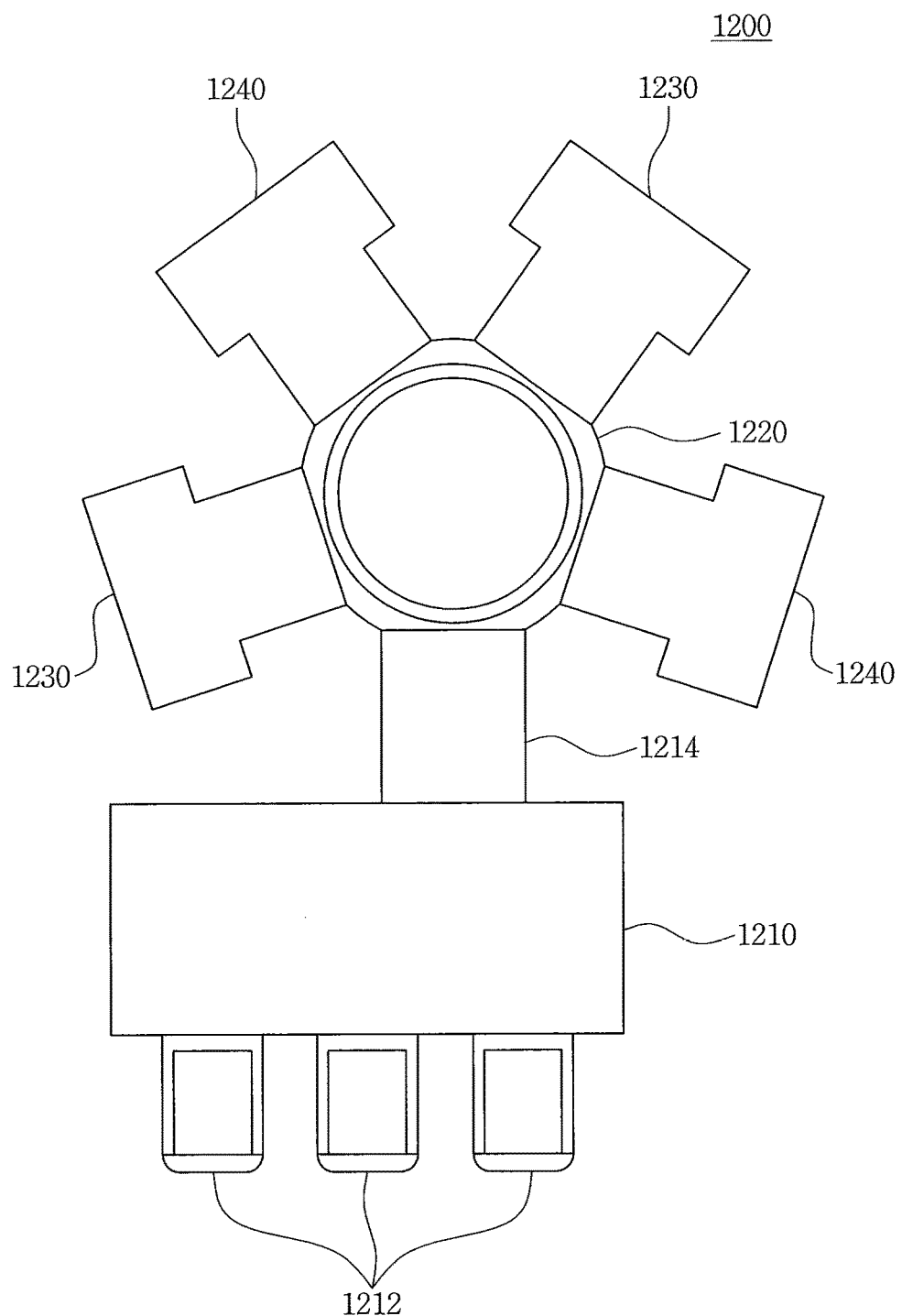
FIG. 38B is a schematic diagram of process equipment for forming a semiconductor device according to an embodiment of the inventive concept.

Referring to FIG. 38B, semiconductor equipment 1200 may include a load station 1210, a load port 1212, a loadlock chamber 1214, a transfer chamber 1220, a deposition chamber 1230, and a nitridation chamber 1240.

The load station 1210 may include the load port 1212 through which a semiconductor substrate may be loaded and unloaded.

The semiconductor substrate may be loaded into the deposition chamber 1230 of the semiconductor equipment 1200 through the load port 1212 of the semiconductor equipment 1200. For example, after the substrate, which is loaded into the load station 1210 through the load port 1212 in an atmospheric pressure state, is transferred into the loadlock chamber 1214 connected to the load station 1210, the loadlock chamber 1214 may be shifted from an atmospheric pressure state to a vacuum state, and the substrate disposed in the loadlock chamber 1214 that is in the vacuum state may be transferred into the deposition chamber 1230 through the transfer chamber 1220. The transfer chamber 1220 and the deposition chamber 1230 may be in a vacuum state.

The deposition chamber 1230 may be a chamber for performing a deposition process. For example, a base deposition process and/or a silicon deposition process may be performed on the semiconductor substrate transferred into the deposition chamber 1230, thereby forming a base layer and/or a silicon layer. A plurality of the deposition chambers 1230 may be included in the equipment 1200.

For instance, when the base deposition process is performed in the deposition chamber 1230, the base layer may be formed by supplying a base source material into the deposition chamber 1230. When the silicon deposition process is performed in the deposition chamber 1230, the silicon layer may be formed by supplying a silicon source material into the deposition chamber 1230.

The semiconductor substrate on which the base layer and the silicon layer are formed may be transferred into the nitridation chamber 1240 through the transfer chamber 1220. The nitridation chamber 1240 may be a chamber for performing a nitridation process.

For example, the nitridation chamber 1240 may be a chamber configured to perform a nitridation process for nitriding the base layer and the silicon layer. The nitridation process may be a plasma nitridation process. During the deposition and nitridation processes, the transfer chamber 1220, the deposition chamber 1230, and the nitridation chamber 1240 may be maintained in a vacuum state without vacuum interruption.

The semiconductor substrate on which the nitridation process is completely performed in the nitridation chamber 1240 may be unloaded from the nitridation chamber 1240 sequentially through the transfer chamber 1220, the loadlock chamber 1214, the load station 1210, and the load port 1212.

Next, semiconductor equipment 1300 according to an embodiment of the inventive concept will be described with reference to FIG. 38C.

Figure 38C:
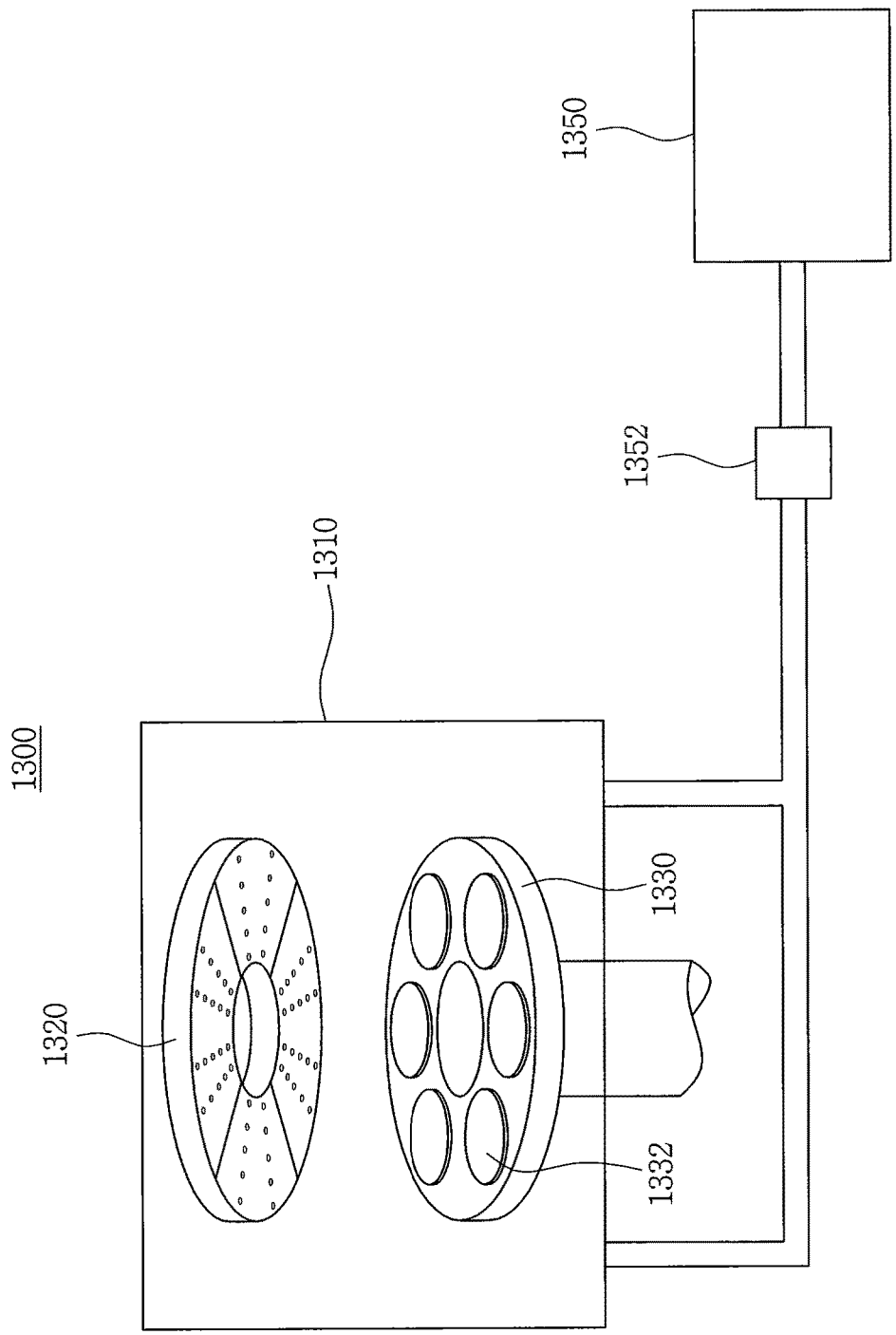
FIG. 38C is a schematic diagram of process equipment for forming a semiconductor device according to an embodiment of the inventive concept.

Referring to FIG. 38C, the semiconductor equipment 1300 may include a process chamber 1310, a shower head 1320 disposed in the process chamber 1310, and a susceptor 1330 on which a substrate 1332, which is loaded into the process chamber 1310 of the semiconductor equipment 1300, may be mounted.

Process materials may be supplied into the process chamber 1310 through the shower head 1320. The shower head 1320 may have holes through which the process materials may pass.

The semiconductor equipment 1300 may include a vacuum pump 1350 connected to the process chamber 1310 through a pipeline, and a valve 1352 mounted between the vacuum pump 1350 and the process chamber 1310.

Experimental Examples

Figure 39A:
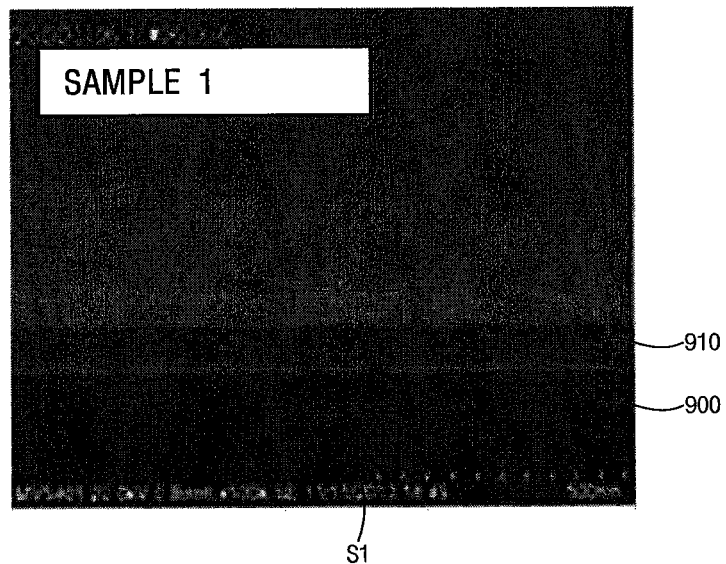
FIG. 39A is a scanning electron microscope (SEM) image of Sample 1.
Figure 39B:
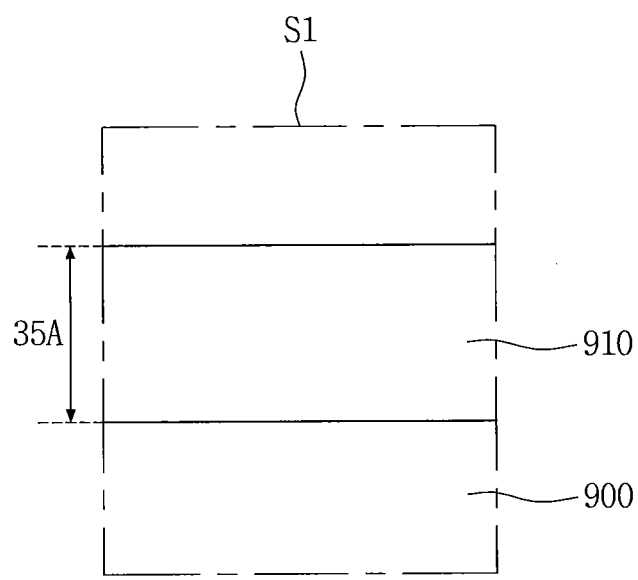
FIG. 39B is an enlarged cross-sectional view of a portion of Sample 1.
Figure 40A:
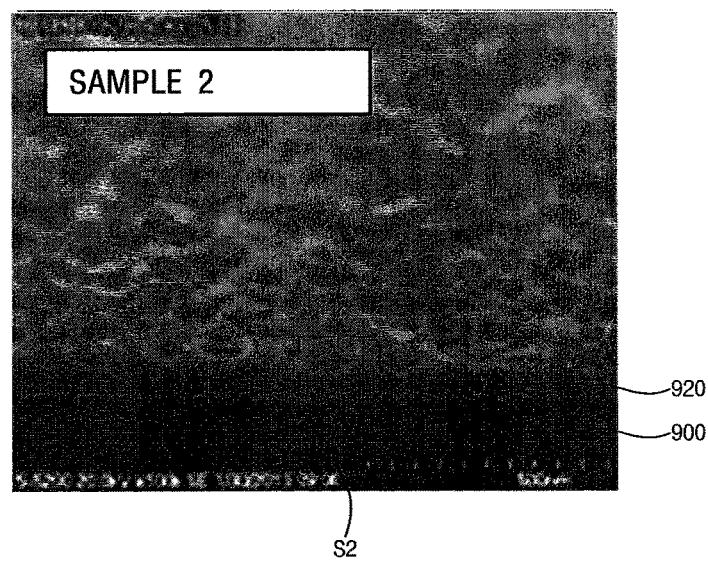
FIG. 40A is a SEM image of Sample 2.
Figure 40B:
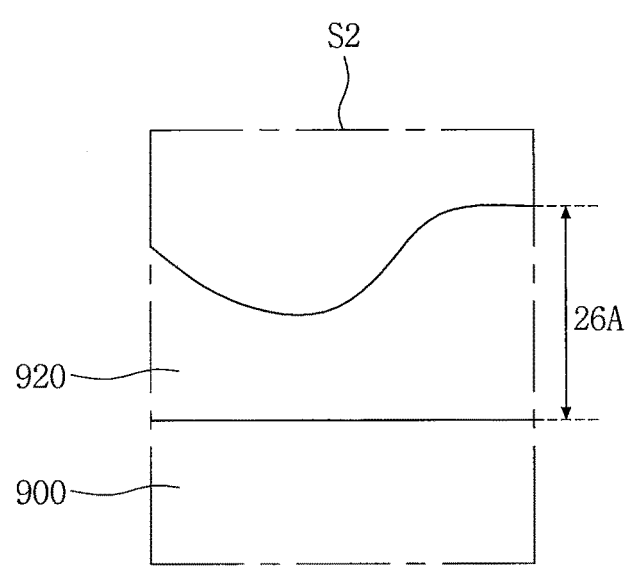
FIG. 40B is an enlarged cross-sectional view of a portion of Sample 2.
Figure 41A:
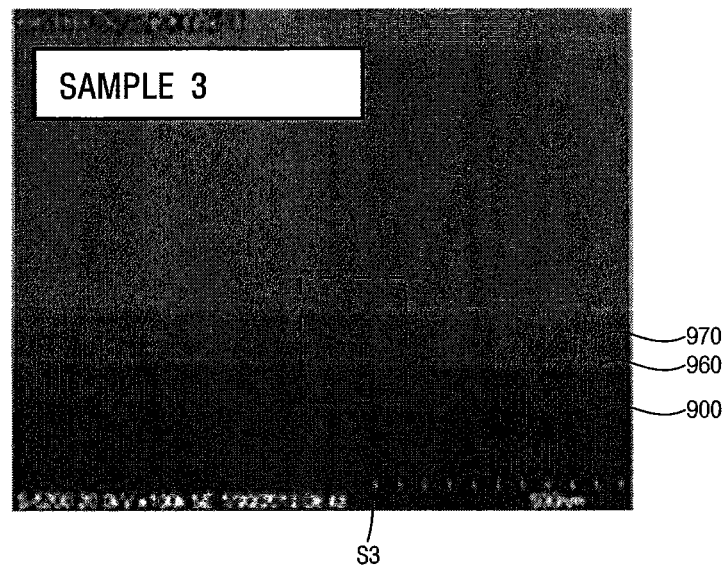
FIG. 41A is a SEM image of Sample 3.
Figure 41B:
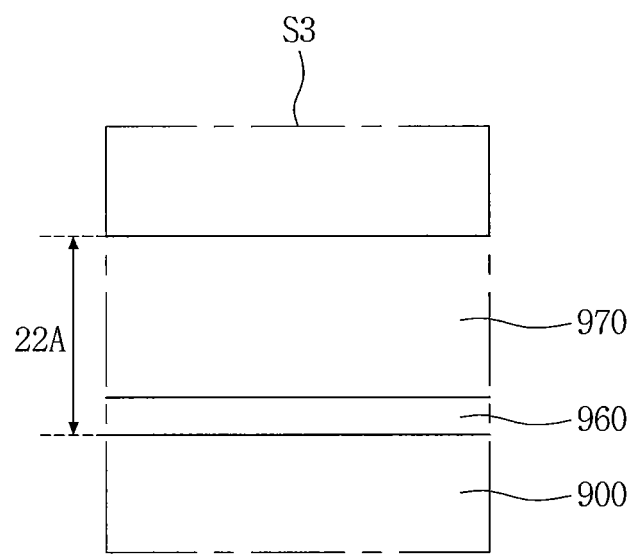
FIG. 41B is an enlarged cross-sectional view of a portion of Sample 3.

FIG. 39A is a scanning electron microscope (SEM) image of Sample 1, and FIG. 39B is an enlarged cross-sectional view of a portion "S1" of Sample 1. FIG. 40A is a SEM image of Sample 2, and FIG. 40B is an enlarged cross-sectional view of a portion "S2" of Sample 2. FIG. 41A is a SEM image of Sample 3, and FIG. 41B is an enlarged cross-sectional view of a portion "S3" of Sample 3.

FIG. 39A is a SEM image of Sample 1 in which a SiN layer 910 was formed to a thickness of about 35 Å on a silicon oxide layer 900 of a semiconductor substrate and exposed to a HF-containing oxide wet etchant.

FIG. 40A is a SEM image of Sample 2 in which a SiN layer 920 was formed to a thickness of about 26 Å on a silicon oxide layer 900 of a semiconductor substrate and exposed to a HF-containing oxide wet etchant similar to Sample 1.

In Samples 1 and 2, the SiN layers 910 and 920 may include a typical SiN material formed by a reaction of silicon of a silicon precursor with nitrogen of a nitrogen precursor by performing a deposition process using the silicon precursor and the nitrogen precursor.

FIG. 41A is a SEM image of Sample 3 formed according to an embodiment of the inventive concept. The formation of Sample 3 of FIG. 41A included sequentially forming a base layer and a silicon layer by performing a deposition process on the silicon oxide layer formed on a semiconductor substrate, forming a nitrided base layer 960 and a nitrided silicon layer 970 to a thickness of about 22 Å by performing a plasma nitridation process for nitriding the base layer and the silicon layer, and exposing the nitrided silicon layer 970 to a HF-containing oxide wet etchant similar to Sample 1.

The nitrided base layer 960 was formed of a SiHCN material.

The present inventors have confirmed that a typical SiN layer having a greater thickness than about 35 Å was not damaged by the oxide wet etchant. In Sample 1, the SiN layer 910 having the thickness of about 35 Å was not damaged by the oxide wet etchant. However, the present inventors could observe that an N-rich silicon nitride layer having a thickness of about 33 Å was damaged by the oxide wet etchant. In Sample 2, it could be observed that the silicon nitride layer 910 having a thickness of about 26 Å was severely damaged by the oxide wet etchant.

In Sample 3 formed according to the embodiment of the inventive concept, it could be seen that the nitrided silicon layer 970 having a thickness of about 22 Å was not damaged by the oxide wet etchant. From Samples 2 and 3, the present inventors have observed that the nitrided silicon layer 970 and nitrided base layer 960 formed to a smaller thickness than about 33 Å according to the embodiment of the inventive concept was not damaged by the oxide wet etchant.

In the embodiments of the inventive concept, as described with reference to FIG. 12G, the inner spacers 51 of FIG. 8C and the outer spacers 57 of FIG. 8F may be exposed to the oxide wet etchant for removing the sacrificial spacers (refer to 54a in FIG. 12F) to form the air spacers 81.

Since the inner spacers 51 of FIG. 8C and the outer spacers 57 of FIG. 8F may be formed to include a nitrided base layer and a nitrided silicon layer, even if the inner spacers 51 and the outer spacers 57 are exposed to the oxide wet etchant for removing the sacrificial spacers (refer to 54a in FIG. 12F), the inner spacers 51 and the outer spacers 57 may not be damaged. Accordingly, the likelihood of generating pinholes in the inner spacers 51 and the outer spacers 57 due to the oxide wet etchant may be prevented. The inner spacers 51 and the outer spacers 57 may protect the middle interconnection pattern 39 and the middle contact pattern 72 formed of a metal silicide, which is vulnerable to the oxide wet etchant, from the oxide wet etchant.

Since the inner spacers 51 and the outer spacers 57 are not damaged by a wet etchant for removing the sacrificial spacers 54a, the inner spacers 51 and the outer spacers 57 may be formed to smaller thicknesses than a typical SiN layer, and the sacrificial spacers 54a may be formed to relatively greater thicknesses by as much as the thicknesses of the inner spacers 51 and the outer spacers 57 are reduced. As a result, the air spacers 81 may be formed to have a greater thickness (or width) and a larger volume in the same design rules. Accordingly, since the air spacers 81 having a low dielectric constant may be formed to a relatively greater size, a parasitic capacitance between the first and second conductive structures 43 and 78 and a parasitic capacitance between the first conductive structures 43 may be further reduced. Accordingly, when the first conductive structures 43 are bit lines of DRAMs, a bit line loading capacitance may be further reduced, and a relatively larger bit line sensing margin may be ensured. As a result, performance of a semiconductor device may be enhanced.

Figure 42:
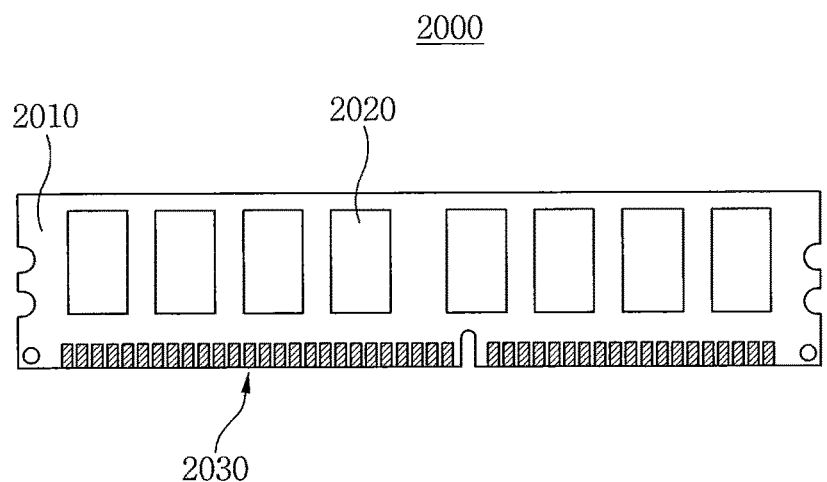
FIGS. 42 and 43 are schematic diagrams of semiconductor modules including semiconductor devices according to embodiments of the inventive concept.

FIG. 42 is a schematic diagram of a semiconductor module 2000 including a semiconductor device according to embodiments of the inventive concept.

Referring to FIG. 42, the semiconductor module 2000 may be a memory module including a memory device. The semiconductor module 2000 may include a module substrate 2010, and a plurality of semiconductor devices 2020 and a plurality of terminals 2030 disposed on the module substrate 2010. The terminals 2030 may include a conductive metal. The terminals 2030 may be electrically connected to the semiconductor devices 2020. The module substrate 2010 may be a memory module substrate. The module substrate 2010 may be a printed circuit board (PCB) or a wafer.

The semiconductor devices 2020 may be memory devices. The semiconductor devices 2020 may be DRAM devices. The semiconductor devices 2020 may be semiconductor devices according to any one of embodiments of the inventive concept or semiconductor packages including the semiconductor devices. The semiconductor devices 2020 may include the spacer structures 84 according to embodiments of the inventive concept.

Figure 43:
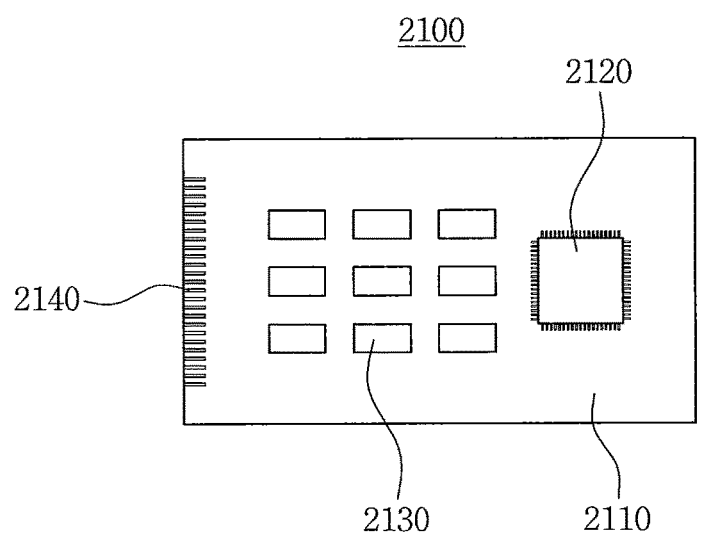

FIG. 43 is a schematic diagram of a semiconductor module 2100 including a semiconductor device according to embodiments of the inventive concept.

Referring to FIG. 43, the semiconductor module 2100 may include a memory device 2130 formed on a module substrate 2110. The memory device 2130 may be a memory device, such as a NAND flash device. The semiconductor module 2100 may include a semiconductor device 2120 mounted on the module substrate 2110. The semiconductor device 2120 may include the spacer structure 84 according to embodiments of the inventive concept. Input/output (I/O) terminals 2140 may be disposed on at least one side of the module substrate 2110.

Figure 44:
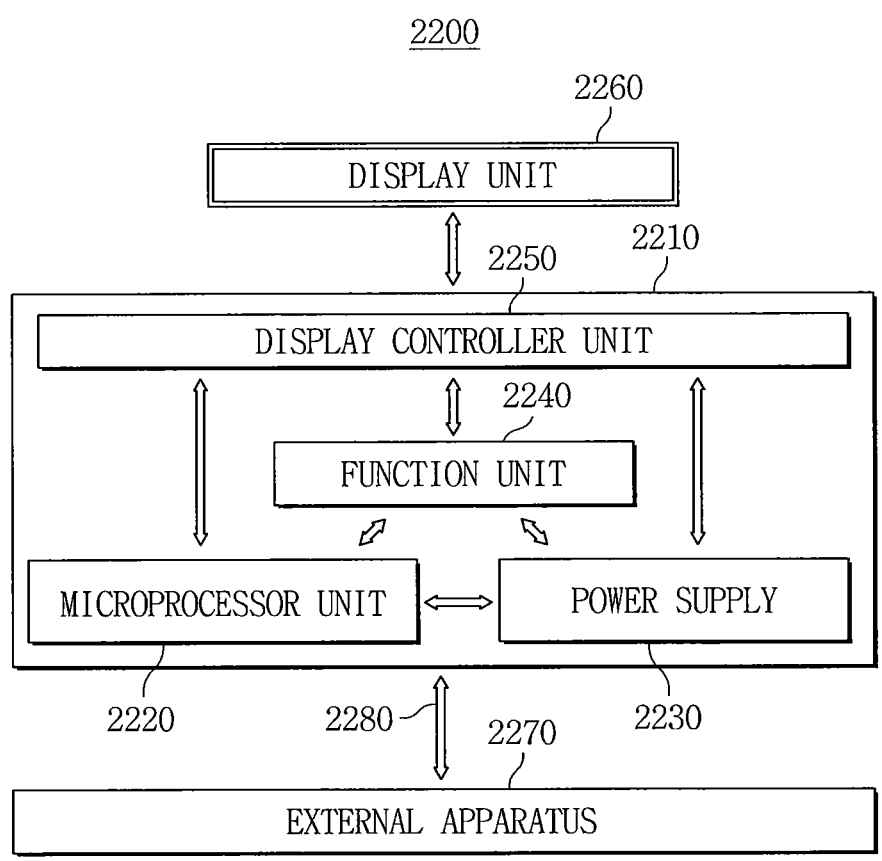
FIG. 44 is a block diagram of an electronic system including the semiconductor device according to the embodiment of the inventive concept.

FIG. 44 is a block diagram of an electronic system 2200 including a semiconductor device according to an embodiment of the inventive concept.

Referring to FIG. 44, the electronic system 2200 may include a body 2210. The body 2210 may include a microprocessor (MP) unit 2220, a power supply 2230, a function unit 2240, and/or a display controller unit 2250. The body 2210 may be a system board or mother board having a printed circuit board (PCB).

The MP unit 2220 may include the spacer structures 84 according to embodiments of the inventive concept.

The MP unit 2220, the power supply 2230, the function unit 2240, and the display controller unit 2250 may be mounted on the body 2210. A display unit 2260 may be disposed on a top surface of the body 2210 or outside the body 2210. For example, the display unit 2260 may be disposed on a surface of the body 2210 and display images processed by the display controller unit 2250. The power supply 2230 may receive a predetermined voltage from an external power source, divide the voltage into voltages having various voltage levels, and supply the divided voltages to the MP unit 2220, the function unit 2240, and the display controller unit 2250. The MP unit 2220 may receive the voltage from the power supply 2230 and control the function unit 2240 and the display unit 2260.

The function unit 2240 may serve various functions of the electronic system 2200. For example, when the electronic system 2200 is a mobile electronic device such as a portable phone, the function unit 2240 may include several elements capable of wireless communication functions, such as output of an image to the display unit 2260 or output of a voice to a speaker, by dialing or communication with an external apparatus 2270. When the function unit 2240 includes a camera, the function unit 2240 may serve as an image processor.

In some embodiments, when the electronic system 2200 is connected to a memory card to increase capacity, the function unit 2240 may be a memory card controller. The function unit 2240 may exchange signals with the external apparatus 2270 through a wired or wireless communication unit 2280.

In addition, when the electronic system 2200 needs a Universal Serial Bus (USB) to expand functions thereof, the function unit 2240 may serve as an interface controller.

Figure 45:
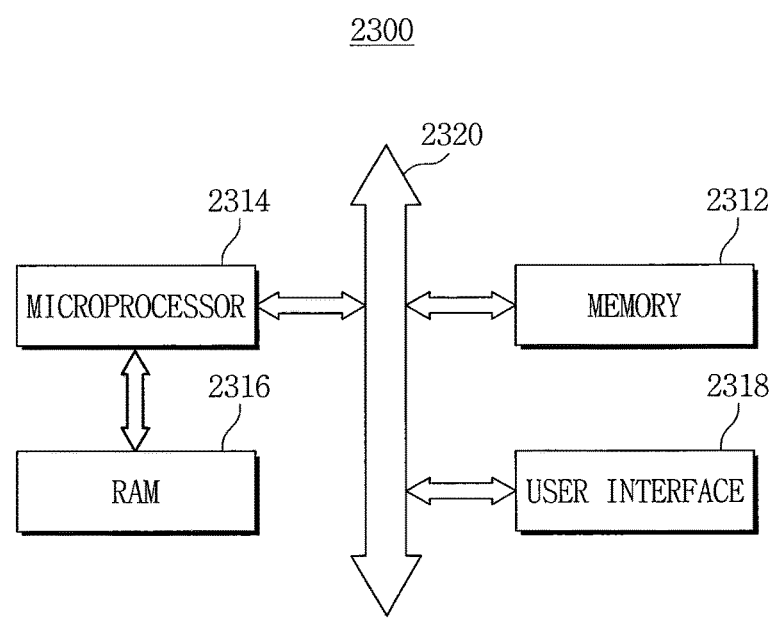
FIG. 45 is a block diagram of another electronic system including the semiconductor device according to the embodiment of the inventive concept.

FIG. 45 is a block diagram of an electronic system 2300 including a semiconductor device according to embodiments of the inventive concept.

Referring to FIG. 45, the electronic system 2300 may include the semiconductor device according to the embodiment of the inventive concept. The electronic system 2300 may be used as part of a mobile device or a computer. For example, the electronic system 2300 may include a memory system 2312, a microprocessor (MP) 2314, a random access memory (RAM) 2316, and a user interface 2318, which may communicate using a bus 2320. The MP 2314 may program and control the electronic system 2300. The RAM 2316 may be used as an operational memory of the MP 2314. The MP 2314, the RAM 2316, and/or other elements may be housed within a single package. The memory system 2312 may be a semiconductor device according to some embodiments of the inventive concept or a semiconductor package including the semiconductor device.

The user interface 2318 may be used to input data to the electronic system 2300 or output data from the electronic system 2300. The memory system 2312 may store code for operating the MP 2314, data processed by the MP 2314, or external input data. The memory system 2312 may include a controller and a memory.

Figure 46:
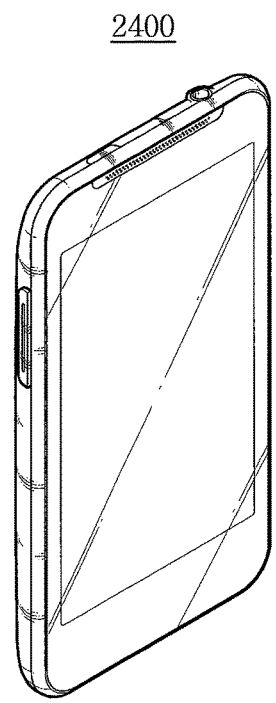
FIG. 46 is a schematic diagram of a wireless mobile phone including the semiconductor device according to the embodiment of the inventive concept.

FIG. 46 is a schematic diagram of a wireless mobile phone 2400 including a semiconductor device according to embodiments of the inventive concept. The wireless mobile phone 2400 may include a semiconductor device according to an embodiment of the inventive concept. The wireless mobile phone 2400 may be interpreted as a tablet personal computer (PC). Furthermore, the semiconductor device according to the embodiment of the inventive concept may be used not only for a tablet PC but also for a portable computer such as a laptop computer, an MPEG-1 audio layer 3 (MP3) player, an MP4 player, a navigation device, a solid-state disk (SSD), a desktop computer, or electronic devices for automotive and household uses.

The foregoing is illustrative of embodiments and is not to be construed as limiting thereof. Although embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function

What is claimed is:

1. A method of forming a semiconductor device, the method comprising:
   loading a semiconductor substrate into semiconductor equipment;
   forming a base layer on the loaded semiconductor substrate by performing a base deposition process using a base source material;
   forming a first silicon layer on the base layer to a greater thickness than the base layer by performing a first silicon deposition process using a silicon source material different from the base source material;
   forming a first nitrided silicon layer by nitriding the first silicon layer using a first nitridation process; and
   unloading the semiconductor substrate having the first nitrided silicon layer from the semiconductor equipment, wherein the base layer is nitrided using the first nitridation process to form a nitrided base layer,
   wherein the nitrided base layer is formed of a material containing silicon (Si), carbon (C), hydrogen (H), and nitrogen (N).

2. The method of claim 1, wherein the base deposition process, the first silicon deposition process, and the first nitridation process are performed in a process chamber of the semiconductor equipment without vacuum interruption.

3. The method of claim 1, after performing the first nitridation process, further comprising:
   forming a second silicon layer on the first nitrided silicon layer by performing a second silicon deposition process; and
   nitriding the second silicon layer by performing a second nitridation process.

4. A method of forming a semiconductor device, comprising:
   forming a base layer spacer on a side wall of a first conductive structure;
   forming a nitride silicon layer on a side wall of the base layer spacer to provide a combined wet-etched resistant side wall layer that separates a sacrificial oxide spacer layer from the first conductive structure; and
   wet-etching the sacrificial oxide spacer layer to form an air-gap spacer in place of the sacrificial oxide spacer layer, wherein forming a base layer spacer comprises forming the base layer spacer of silicon (Si) carbon (C), hydrogen (H), and nitrogen (N), wherein the base layer is formed to a smaller thickness than the nitride silicon layer.

5. The method of claim 4, wherein
   the nitride silicon layer is formed to a thickness in a range of about 1 Angstrom to about 33 Angstroms.

6. The method of claim 4, further comprising forming a barrier layer on the nitride silicon layer by performing a barrier deposition process using a barrier source material,
   wherein the barrier source material is the same as a base source material used to form the base layer spacer.

7. The method of claim 6, wherein the barrier layer is nitrided using a nitridation process to form a nitrided barrier layer.

8. A method of forming a semiconductor device, comprising:
   forming a base layer spacer on a side wall of a first conductive structure;
   forming a nitrided silicon layer spacer on a side wall of the base layer spacer to provide a combined wet-etch resistant sidewall layer that separates a sacrificial oxide spacer layer from the first conductive structure; and
   wet-etching the sacrificial oxide spacer layer to form an air-gap spacer in place of the sacrificial oxide spacer layer, wherein forming a base layer spacer comprises forming the base layer spacer using a base source material comprising diisoprophyl aminosilane (DIPAS) or tris(dimethylamino)silane (TDMAS).

9. The method of claim 8 wherein forming a base layer spacer and forming a nitrided silicon layer spacer comprises forming the base layer spacer and the nitrided silicon layer spacer to a combined thickness of between about 1 Angstrom and about 33 Angstroms.

10. The method of claim 8 wherein forming a base layer spacer on a side wall of a first conductive structure further comprise:
    forming the base layer spacer on an opposite side of the sacrificial oxide space layer and
    forming the nitrided silicon layer spacer on the opposite side of the sacrificial oxide spacer layer between the base layer spacer on the opposite side of the sacrificial oxide spacer layer and a second conductive structure to provide the combined wet-etch resistant sidewall layer on the opposite side of the sacrificial oxide spacer layer.

11. The method of claim 8 wherein forming a base layer spacer and forming a nitrided silicon layer spacer comprises forming the base layer spacer to be thinner than the nitrided silicon layer spacer.

12. The method of claim 8 wherein forming a base layer spacer comprises forming the base layer spacer of silicon (Si) carbon (C), hydrogen (H), and nitrogen (N).

13. The method of claim 8 wherein forming a nitrided silicon layer spacer comprises forming the nitrided silicon layer spacer to provide a Si-rich silicon nitride material.

14. The method of claim 8, wherein forming a nitrided silicon layer spacer comprises forming the nitrided silicon layer spacer using a silicon source material comprising a carbon-free material.

15. The method of claim 8, wherein forming a nitrided silicon layer spacer comprises forming the nitrided silicon layer spacer using a silicon source material comprising dichlorosilane (DCS), disilane (DS), or monosilane (MS).

16. The method of claim 8 further comprising:
    forming a nitrided barrier layer spacer on a side wall of the nitrided silicon layer spacer facing the sacrificial oxide spacer layer.

17. The method of claim 16 wherein forming a nitrided barrier layer spacer comprises forming a silicon nitride barrier layer spacer.

* * * * *